(12) United States Patent
Champion et al.

(10) Patent No.: US 7,205,993 B2
(45) Date of Patent: *Apr. 17, 2007

(54) CHECKERBOARD BUFFER USING TWO-DIMENSIONAL BUFFER PAGES AND USING MEMORY BANK ALTERNATION

(75) Inventors: Mark Champion, Kenmore, WA (US); Brian Dockter, Edmonds, WA (US)

(73) Assignees: Sony Corporation, Shinagawa-ku, Tokyo (JP); Sony Electronics Inc., Park Ridge, NJ (US)

(*) Notice: Subject to any disclaimer, the term of this patent is extended or adjusted under 35 U.S.C. 154(b) by 908 days.

This patent is subject to a terminal disclaimer.

(21) Appl. No.: 10/076,943

(22) Filed: Feb. 14, 2002

(65) Prior Publication Data

US 2002/0109696 A1    Aug. 15, 2002

Related U.S. Application Data

(60) Provisional application No. 60/324,498, filed on Sep. 24, 2001, provisional application No. 60/269,784, filed on Feb. 15, 2001, provisional application No. 60/269,783, filed on Feb. 15, 2001.

(51) Int. Cl.
G09G 5/399 (2006.01)
(52) U.S. Cl. ........................ 345/540; 345/539
(58) Field of Classification Search ............. 257/213; 345/570, 540, 587, 83, 545, 533, 539, 564, 345/571; 365/200; 711/217, 5; 710/53; 348/581
See application file for complete search history.

(56) References Cited

U.S. PATENT DOCUMENTS

| | | |
|---|---|---|
| 4,189,767 A | 2/1980 | Ahuja |
| 4,449,199 A | 5/1984 | Daigle |
| 4,744,046 A | 5/1988 | Foster |
| 5,138,705 A | 8/1992 | Lo et al. |
| 5,142,276 A | 8/1992 | Moffat |
| 5,195,182 A | 3/1993 | Sasson |
| 5,210,614 A | 5/1993 | Kannegundla et al. |
| 5,268,682 A | 12/1993 | Yang et al. |
| 5,303,341 A | 4/1994 | Rivershin |
| 5,479,605 A | 12/1995 | Saitoh |
| 5,559,953 A | 9/1996 | Seiler et al. |
| 5,561,777 A | 10/1996 | Kao et al. |
| 5,579,473 A | 11/1996 | Schlapp et al. |
| 5,606,650 A | 2/1997 | Kelley et al. |

(Continued)

OTHER PUBLICATIONS

U.S. Appl. No. 09/907,852, filed Jul. 17, 2001, Champion et al.

(Continued)

Primary Examiner—Ulka J. Chauhan
Assistant Examiner—Dalip K. Singh
(74) Attorney, Agent, or Firm—Thomas F. Lebens; Fitch, Even, Tabin & Flannery

(57) ABSTRACT

Methods and apparatus for storing and retrieving data. In one implementation, a system includes: a data source, providing data in a first order; a data destination, receiving data in a second order; at least four memories, each having memory pages, data stored to at least two memories and retrieved from at least two memories in parallel, each buffer page having entries along a first dimension corresponding to the first order and entries along a second dimension corresponding to the second order, data stored in the first order and retrieved in the second order, at least one memory page stores data in multiple locations according to the first and second orders, two data elements consecutive in the first order stored in parallel to the memories, at least two data elements consecutive in the second order retrieved in parallel from the memories.

24 Claims, 29 Drawing Sheets

U.S. PATENT DOCUMENTS

| | | | |
|---|---|---|---|
| 5,619,471 A | 4/1997 | Nunziata | |
| 5,633,726 A | 5/1997 | Timmermans | |
| 5,668,568 A * | 9/1997 | Holloman | 345/83 |
| 5,781,201 A | 7/1998 | McCormack et al. | |
| 5,794,016 A | 8/1998 | Kelleher | |
| 5,798,843 A | 8/1998 | Yamamoto et al. | |
| 5,815,167 A | 9/1998 | Muthal et al. | |
| 5,815,169 A | 9/1998 | Oda | |
| 5,831,926 A | 11/1998 | Norris et al. | |
| 5,835,952 A | 11/1998 | Yamauchi | |
| 5,924,111 A | 7/1999 | Huang et al. | |
| 5,933,154 A | 8/1999 | Howard et al. | |
| 6,005,592 A | 12/1999 | Koizumi et al. | |
| 6,018,354 A * | 1/2000 | Jones et al. | 345/570 |
| 6,023,745 A | 2/2000 | Lu | |
| 6,031,638 A | 2/2000 | Rao et al. | |
| 6,105,114 A | 8/2000 | Okuno | |
| 6,111,992 A | 8/2000 | Likhterov et al. | |
| 6,150,679 A * | 11/2000 | Reynolds | 257/213 |
| 6,177,922 B1 | 1/2001 | Schiefer et al. | |
| 6,226,709 B1 | 5/2001 | Goodwin et al. | |
| 6,259,459 B1 | 7/2001 | Middleton | |
| 6,278,645 B1 | 8/2001 | Buckelew et al. | |
| 6,282,603 B1 | 8/2001 | Rao | |
| 6,301,649 B1 * | 10/2001 | Takasugi | 711/217 |
| 6,331,854 B1 | 12/2001 | Rogers et al. | |
| 6,347,344 B1 | 2/2002 | Baker et al. | |
| 6,367,933 B1 | 4/2002 | Chen et al. | |
| 6,417,848 B1 | 7/2002 | Battle | |
| 6,417,867 B1 | 7/2002 | Hallberg | |
| 6,473,193 B1 | 10/2002 | Itoh | |
| 6,480,428 B2 * | 11/2002 | Zheng et al. | 365/200 |
| 6,496,192 B1 * | 12/2002 | Shreesha et al. | 345/540 |
| 6,519,673 B1 | 2/2003 | Chudnovsky | |
| 6,549,207 B1 | 4/2003 | Matsumoto | |
| 6,567,531 B1 | 5/2003 | Kondo et al. | |
| 6,587,112 B1 | 7/2003 | Goelzenleuchter et al. | |
| 6,650,332 B2 | 11/2003 | Doyle et al. | |
| 6,665,749 B1 | 12/2003 | Ansari | |
| 6,724,396 B1 * | 4/2004 | Emmot et al. | 345/587 |
| 2002/0109692 A1 | 8/2002 | Champion | |
| 2002/0109699 A1 | 8/2002 | Champion | |
| 2002/0110030 A1 | 8/2002 | Champion | |
| 2002/0130876 A1 | 9/2002 | Champion | |
| 2002/0149596 A1 | 10/2002 | Champion | |
| 2003/0058368 A1 | 3/2003 | Champion | |
| 2003/0151609 A1 | 8/2003 | Champion | |
| 2004/0233206 A1 | 11/2004 | Champion | |
| 2004/0246258 A1 | 12/2004 | Champion | |
| 2005/0024368 A1 | 2/2005 | Champion | |

OTHER PUBLICATIONS

U.S. Appl. No. 09/907,854, filed Jul. 17, 2001, Champion et al.
U.S. Appl. No. 09/908,295, filed Jul. 17, 2001, Champion et al.
U.S. Appl. No. 09/908,301, filed Jul. 17, 2001, Champion et al.
U.S. Appl. No. 10/051,538, filed Jan. 16, 2002, Champion.
U.S. Appl. No. 10/051,541, filed Jan. 16, 2002, Champion.
U.S. Appl. No. 10/051,680, filed Jan. 16, 2002, Champion.
U.S. Appl. No. 10/052,074, filed Jan. 16, 2002, Champion.
U.S. Appl. No. 10/076,685, filed Feb. 14, 2002, Champion et al.
U.S. Appl. No. 10/076,832, filed Feb. 14, 2002, Champion et al.
U.S. Appl. No. 10/076,942, filed Feb. 14, 2002, Champion et al.
*SMPTE Standard for Television 1920 x 1080 Scanning and Analog and Parallel Digital Interfaces for Multiple Picture Rates*; SMPTE 274-1998; Copyright 1998; pp. 1-24; Revision of ANSI/SMPTE 274M-1995; The Society of Motion Picture and Television Engineers; White Plains, New York.
Bloom, D.M.; *The Grating Light Valve: revolutionizing display technology*; pp. 1-10; Silicon Light Machines (formerly Echelle, Inc.).
Corrigan, R.W., et al.; *An Alternative Architecture for High Performance Display*; Presented at the 141st SMPTE Technical Conference and Exhibition; Nov. 20, 1999, New York, New York; pp. 1-5; Silicon Machines, Sunnyvale, CA.
Hearn, D., et al.; *Computer Graphics C Version* [2d Ed.]; pp. 53-56; Prentice Hall, Upper Saddle River, New Jersey.
McCarron, D., et al.; Accelerating PC Graphics, Emerging Technologies Edition, Market Strategy and Forecast Report; 1995; pp. 2-49 through 2-93, 2-159 (labeled as pp. 1-46); Mercury Research.
Lieberman, David; *Sony champions MEMS display technology*; EE Times, Jul. 14, 2000; http://www.eetimes.com/story/OEG20000714S0004.

\* cited by examiner

FIG. 3A
(Prior Art)

|   |   |   |   |   |   |   |   |
|---|---|---|---|---|---|---|---|
| 0 | 1 | 2 | 3 | 4 | 5 | 6 | 7 |
| 8 | 9 | 10 | 11 | 12 | 13 | 14 | 15 |
| 16 | 17 | 18 | 19 | 20 | 21 | 22 | 23 |
| 24 | 25 | 26 | 27 | 28 | 29 | 30 | 31 |

FIG. 3B
(Prior Art)

| 0 | 2 | 4 | 6 |
|---|---|---|---|
| 8 | 10 | 12 | 14 |
| 16 | 18 | 20 | 22 |
| 24 | 26 | 28 | 30 |

FIG. 3C
(Prior Art)

| 1 | 3 | 5 | 7 |
|---|---|---|---|
| 9 | 11 | 13 | 15 |
| 17 | 19 | 21 | 23 |
| 25 | 27 | 29 | 31 |

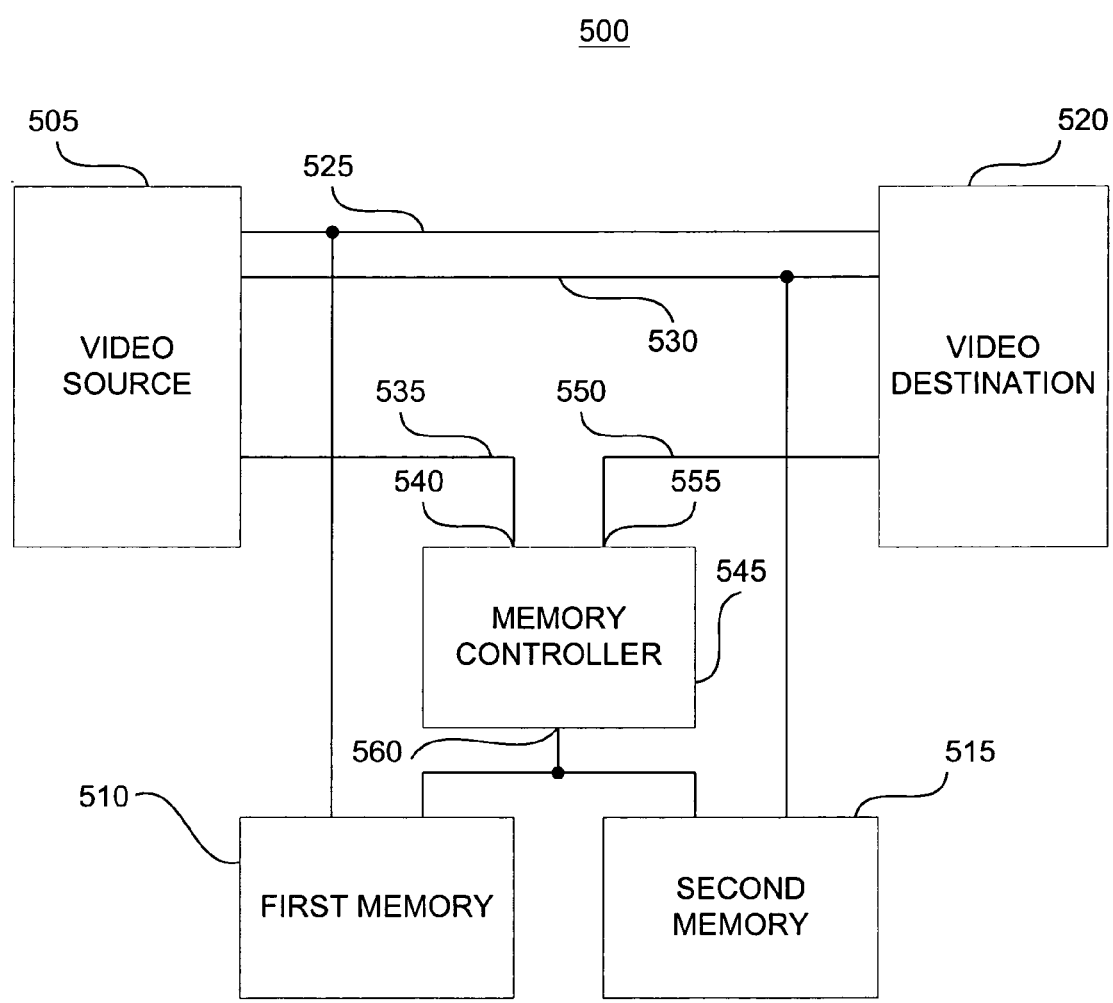

FIG. 7

| 725→ | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| | 16 | 17 | 18 | 19 | 20 | 21 | 22 | 23 | 24 | 25 | 26 | 27 | 28 | 29 | 30 | 31 |
| | 32 | 33 | 34 | 35 | 36 | 37 | 38 | 39 | 40 | 41 | 42 | 43 | 44 | 45 | 46 | 47 |
| | 48 | 49 | 50 | 51 | 52 | 53 | 54 | 55 | 56 | 57 | 58 | 59 | 60 | 61 | 62 | 63 |
| | 64 | 65 | 66 | 67 | 68 | 69 | 70 | 71 | 72 | 73 | 74 | 75 | 76 | 77 | 78 | 79 |
| | 80 | 81 | 82 | 83 | 84 | 85 | 86 | 87 | 88 | 89 | 90 | 91 | 92 | 93 | 94 | 95 |
| | 96 | 97 | 98 | 99 | 100 | 101 | 102 | 103 | 104 | 105 | 106 | 107 | 108 | 109 | 110 | 111 |
| | 112 | 113 | 114 | 115 | 116 | 117 | 118 | 119 | 120 | 121 | 122 | 123 | 124 | 125 | 126 | 127 |
| | 128 | 129 | 130 | 131 | 132 | 133 | 134 | 135 | 136 | 137 | 138 | 139 | 140 | 141 | 142 | 143 |
| | 144 | 145 | 146 | 147 | 148 | 149 | 150 | 151 | 152 | 153 | 154 | 155 | 156 | 157 | 158 | 159 |
| | 160 | 161 | 162 | 163 | 164 | 165 | 166 | 167 | 168 | 169 | 170 | 171 | 172 | 173 | 174 | 175 |
| | 176 | 177 | 178 | 179 | 180 | 181 | 182 | 183 | 184 | 185 | 186 | 187 | 188 | 189 | 190 | 191 |
| | 192 | 193 | 194 | 195 | 196 | 197 | 198 | 199 | 200 | 201 | 202 | 203 | 204 | 205 | 206 | 207 |
| | 208 | 209 | 210 | 211 | 212 | 213 | 214 | 215 | 216 | 217 | 218 | 219 | 220 | 221 | 222 | 223 |
| | 224 | 225 | 226 | 227 | 228 | 229 | 230 | 231 | 232 | 233 | 234 | 235 | 236 | 237 | 238 | 239 |
| | 240 | 241 | 242 | 243 | 244 | 245 | 246 | 247 | 248 | 249 | 250 | 251 | 252 | 253 | 254 | 255 |

FIG. 8

| | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 0 | 0 | 1 | 2 | 3 | 4 | 5 | 6 | 7 | 8 | 9 | 10 | 11 | 12 | 13 | 14 | 15 |
| 1 | 16 | 17 | 18 | 19 | 20 | 21 | 22 | 23 | 24 | 25 | 26 | 27 | 28 | 29 | 30 | 31 |
| 2 | 32 | 33 | 34 | 35 | 36 | 37 | 38 | 39 | 40 | 41 | 42 | 43 | 44 | 45 | 46 | 47 |
| 3 | 48 | 49 | 50 | 51 | 52 | 53 | 54 | 55 | 56 | 57 | 58 | 59 | 60 | 61 | 62 | 63 |
| 4 | 64 | 65 | 66 | 67 | 68 | 69 | 70 | 71 | 72 | 73 | 74 | 75 | 76 | 77 | 78 | 79 |
| 5 | 80 | 81 | 82 | 83 | 84 | 85 | 86 | 87 | 88 | 89 | 90 | 91 | 92 | 93 | 94 | 95 |
| 6 | 96 | 97 | 98 | 99 | 100 | 101 | 102 | 103 | 104 | 105 | 106 | 107 | 108 | 109 | 110 | 111 |
| 7 | 112 | 113 | 114 | 115 | 116 | 117 | 118 | 119 | 120 | 121 | 122 | 123 | 124 | 125 | 126 | 127 |
| 8 | 128 | 129 | 130 | 131 | 132 | 133 | 134 | 135 | 136 | 137 | 138 | 139 | 140 | 141 | 142 | 143 |
| 9 | 144 | 145 | 146 | 147 | 148 | 149 | 150 | 151 | 152 | 153 | 154 | 155 | 156 | 157 | 158 | 159 |
| 10 | 160 | 161 | 162 | 163 | 164 | 165 | 166 | 167 | 168 | 169 | 170 | 171 | 172 | 173 | 174 | 175 |
| 11 | 176 | 177 | 178 | 179 | 180 | 181 | 182 | 183 | 184 | 185 | 186 | 187 | 188 | 189 | 190 | 191 |
| 12 | 192 | 193 | 194 | 195 | 196 | 197 | 198 | 199 | 200 | 201 | 202 | 203 | 204 | 205 | 206 | 207 |
| 13 | 208 | 209 | 210 | 211 | 212 | 213 | 214 | 215 | 216 | 217 | 218 | 219 | 220 | 221 | 222 | 223 |
| 14 | 224 | 225 | 226 | 227 | 228 | 229 | 230 | 231 | 232 | 233 | 234 | 235 | 236 | 237 | 238 | 239 |
| 15 | 240 | 241 | 242 | 243 | 244 | 245 | 246 | 247 | 248 | 249 | 250 | 251 | 252 | 253 | 254 | 255 |

FIG. 10A
PIXELS
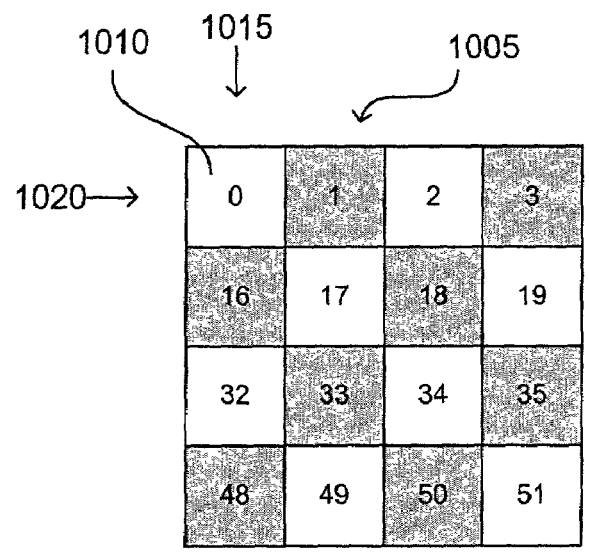
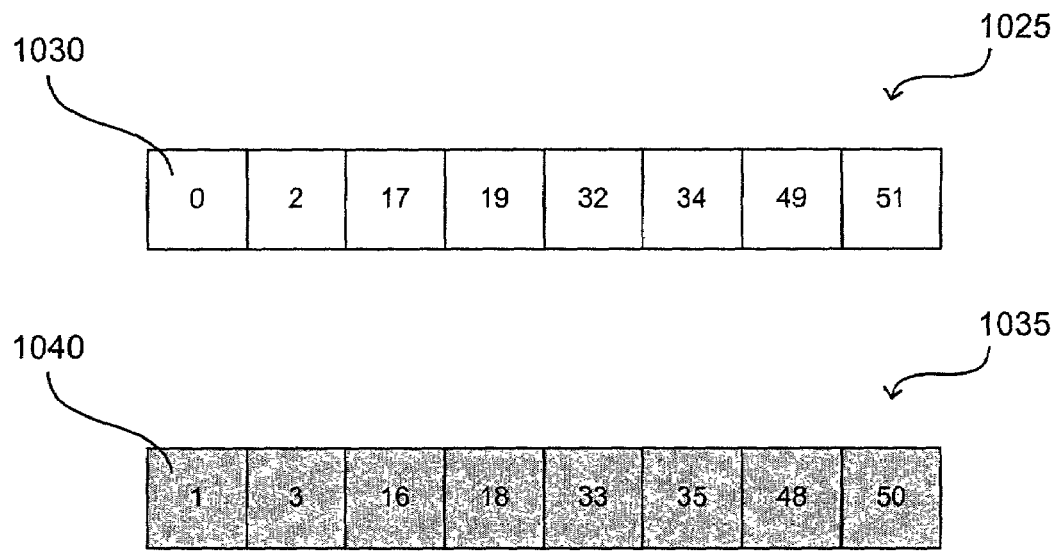

ADDRESSES

FIG. 11

| | 0 | 1 | | | 31 |
|---|---|---|---|---|---|
| 0 | 0 | 1 | 2 | ... | 31 |
| 1 | 1920 | 1921 | 1922 | ... | 1951 |
| 2 | 3840 | 3841 | 3842 | ... | 3871 |
| ... | ... | ... | ... | ... | ... |
| 15 | 28800 | 28801 | 28802 | ... | 28831 |

| PIXEL | FRAME ROW | FRAME COLUMN | PIXEL PAGE | PIXEL PAGE ROW | PIXEL PAGE COLUMN | MEMORY PAGE | MEMORY ADDRESS | MEMORY DEVICE |
|---|---|---|---|---|---|---|---|---|
| 0 | 0 | 0 | 0 | 0 | 0 | 0 | 0 | 0 |
| 1 | 0 | 1 | 0 | 0 | 1 | 0 | 0 | 1 |
| 15 | 0 | 15 | 0 | 0 | 15 | 0 | 7 | 1 |
| 16 | 0 | 16 | 0 | 0 | 16 | 0 | 8 | 0 |
| 31 | 0 | 31 | 0 | 0 | 31 | 0 | 15 | 1 |
| 1919 | 0 | 1919 | 59 | 0 | 31 | 59 | 15119 | 1 |
| 1920 | 1 | 0 | 0 | 1 | 0 | 0 | 16 | 1 |
| 1921 | 1 | 1 | 0 | 1 | 1 | 0 | 16 | 0 |
| 1951 | 1 | 31 | 0 | 1 | 31 | 0 | 31 | 0 |
| 1952 | 1 | 32 | 1 | 1 | 0 | 1 | 272 | 1 |

| PIXEL | FRAME ROW | FRAME COLUMN | PIXEL PAGE | PIXEL PAGE ROW | PIXEL PAGE COLUMN | MEMORY PAGE | MEMORY ADDRESS | MEMORY DEVICE |
|---|---|---|---|---|---|---|---|---|
| 0 | 0 | 0 | 0 | 0 | 0 | 0 | 0 | 0 |
| 1 | 0 | 1 | 0 | 0 | 1 | 0 | 0 | 1 |
| 15 | 0 | 15 | 0 | 0 | 15 | 0 | 7 | 1 |
| 16 | 0 | 16 | 0 | 0 | 16 | 0 | 8 | 0 |
| 31 | 0 | 31 | 0 | 0 | 31 | 0 | 15 | 1 |
| 1919 | 0 | 1919 | 59 | 0 | 31 | 59 | 15119 | 1 |
| 1920 | 1 | 0 | 0 | 1 | 0 | 0 | 16 | 1 |
| 28800 | 15 | 0 | 0 | 15 | 0 | 0 | 240 | 1 |
| 28815 | 15 | 15 | 0 | 15 | 15 | 0 | 247 | 0 |
| 28831 | 15 | 31 | 0 | 15 | 31 | 0 | 255 | 0 |
| 30719 | 15 | 1919 | 59 | 15 | 31 | 59 | 15359 | 0 |
| XXX | XXX | XXX | 60 | 0 | 0 | 60 | 15360 | 0 |
| 30720 | 16 | 0 | 64 | 0 | 0 | 64 | 16384 | 0 |
| 2073599 | 1079 | 1919 | 4347 | 7 | 31 | 4347 | 1112959 | 0 |
| XXX | XXX | XXX | 4352 | 0 | 0 | 4352 | 1114112 | 0 |

| PIXEL | FRAME ROW | FRAME COLUMN | PIXEL PAGE | PIXEL PAGE ROW | PIXEL PAGE COLUMN | MEMORY PAGE | MEMORY ADDRESS | MEMORY DEVICE |
|---|---|---|---|---|---|---|---|---|
| 0 | 0 | 0 | 0 | 0 | 0 | 0 | 0 | 0 |
| 1 | 0 | 1 | 0 | 0 | 1 | 0 | 0 | 1 |
| 15 | 0 | 15 | 0 | 0 | 15 | 0 | 7 | 1 |
| 16 | 0 | 16 | 0 | 0 | 16 | 0 | 8 | 0 |
| 31 | 0 | 31 | 0 | 0 | 31 | 0 | 15 | 1 |
| 1919 | 0 | 1919 | 59 | 0 | 31 | 59 | 15119 | 1 |
| 1920 | 1 | 0 | 0 | 1 | 0 | 0 | 16 | 1 |
| 28800 | 15 | 0 | 0 | 15 | 0 | 0 | 240 | 1 |
| 28815 | 15 | 15 | 0 | 15 | 15 | 0 | 247 | 0 |
| 28831 | 15 | 31 | 0 | 15 | 31 | 0 | 255 | 0 |
| 30719 | 15 | 1919 | 59 | 15 | 31 | 59 | 15359 | 0 |
| 30720 | 16 | 0 | 60 | 0 | 0 | 60 | 15360 | 0 |
| 30848 | 16 | 128 | 64 | 0 | 0 | 64 | 16384 | 0 |
| 2073599 | 1079 | 1919 | 4079 | 7 | 31 | 4079 | 1044351 | 0 |
| XXX | XXX | XXX | 4079 | 15 | 31 | 4079 | 1044479 | 0 |

2205  2210  2215  2220  2225  2230  2235  2240  2245

CHECKERBOARD BUFFER USING TWO-DIMENSIONAL BUFFER PAGES AND USING MEMORY BANK ALTERNATION

RELATED APPLICATIONS

This application claims the benefit of U.S. Provisional Application No. 60/269,784 filed Feb. 15, 2001, of U.S. Provisional Application No. 60/269,783 filed Feb. 15, 2001, and of U.S. Provisional Application No. 60/324,498 filed Sep. 24, 2001, the disclosures of which are incorporated herein by reference.

This application is related to the following co-pending and commonly assigned patent applications: U.S. application Ser. No. 09/908,295, filed Jul. 17, 2001 ; U.S. application Ser. No. 09/907,852, filed Jul. 17, 2001 ; U.S. application Ser. No. 09/907,854, filed Jul. 17, 2001 ; U.S. application Ser. No. 09/908,301, filed Jul. 17, 2001 ; U.S. application Ser. No. 10/051,538, filed Jan. 16, 2002 ; U.S. application Ser. No. 10/051,680, filed Jan. 16, 2002 ; U.S. application Ser. No. 10/052,074, filed Jan. 16, 2002 ; U.S. application Ser. No. 10/051,541, filed Jan. 16, 2002 ; U.S. application Ser. No. 10/076,685, filed Feb. 14, 2002, entitled CHECKERBOARD BUFFER USING TWO DIMENSIONAL BUFFER PAGES, filed herewith ; U.S. application Ser. No. 10/076,942, filed Feb. 14, 2002, entitled CHECKERBOARD BUFFER USING TWO-DIMENSIONAL BUFFER PAGES AND USING STATE ADDRESSING, filed herewith; and U.S. application Ser. No. 10/076,832, filed Feb. 14, 2002, entitled CHECKERBOARD BUFFER USING TWO DIMENSIONAL BUFFER PAGES AND USING BIT FIELD ADDRESSING, filed herewith, the disclosures of which are incorporated herein by reference.

BACKGROUND

The present invention is related to video data storage. More particularly, the present invention is related to video display systems and frame buffers. Several related technologies are discussed below (in labeled sections for clarity).

1. Raster-scan Displays

A common type of graphics monitor is a conventional raster-scan display using a cathode ray tube ("CRT"). As is well known, in a typical CRT, an electron beam strikes phosphor on the inner surface of the screen producing light visible on the outer surface of the screen. By controlling the electron beam different locations of the screen can be struck, creating a pattern and hence a video image. In a typical CRT raster-scan display, the screen area is divided into a grid of pixels (or picture elements). The electron beam sweeps from left to right across the screen, one row at a time from top to bottom, progressively drawing each pixel on the screen. Each row of pixels is commonly referred to as a scan line. In this type of conventional display, the scan lines are horizontal. The number of pixels in a single scan line is referred to as the width. One complete pass over the screen and the pixels in that pass are commonly referred to as a frame. As the electron beam moves across the pixels of each scan line, the beam intensity can be adjusted to vary the light produced by the screen phosphor corresponding to the pixels. The light emitted by the phosphor of the pixels creates a pattern of illuminated spots forming the video image. The intensity of the electron beam is controlled by image data stored in a section of memory called the frame buffer or refresh buffer.

2. Grating Light Valves

Another type of display system uses one or more grating light valves ("GLV") to produce an image. GLV's are known devices, and a description can be found in (among other sources) a paper by D. M. Bloom of Silicon Light Machines, Inc., titled "The Grating Light Valve: revolutionizing display technology" (1997; available from Silicon Light Machines; and a copy of which has been filed in an Information Disclosure Statement for this application), and in an article (and therein cited references) by R. W. Corrigan and others of Silicon Light Machines, Inc., titled "An Alternative Architecture for High Performance Display" (presented at the 141$^{st}$ SMPTE Technical Conference and Exhibition, Nov. 20, 1999, in New York, N.Y.), the disclosures of which are incorporated herein by reference. In overview, a GLV uses a combination of reflection and diffraction of light to create an image. A GLV includes a one-dimensional array of GLV pixels, each GLV pixel including a number of microscopic "ribbons." The ribbons for each GLV pixel can be deflected through electrostatic force to create an adjustable diffraction grating. In a non-deflected state, the ribbons reflect light. As the ribbons are deflected, the ribbons increasingly diffract light. Accordingly, by controlling the ribbons, the proportion of light that is either reflected or diffracted can be controlled for each GLV pixel. The GLV deflects the ribbons for each GLV pixel according to image data, such as pixel data received from a frame buffer.

An array of GLV pixels can create a column of visible pixels, such as 1088 pixels, typically an entire column at a time. A GLV can be used to create a vertical column of pixels in a high definition resolution image, such as a screen resolution of 1920 pixels horizontally by 1080 pixels vertically (with some of the 1088 pixels left blank or dark). By providing a GLV with pixel data representing columns of pixels in a frame, the GLV can create the frame of pixels, one column at a time, sweeping from left to right. The location of each column of pixels can be controlled external to the GLV array, such as through lenses and an adjustable mirror, rather than moving the GLV itself. A combination of three GLV's for red, green, and blue can be used to produce a color image.

3. Frame Buffers

FIG. 1A is a representation of a screen 105 as a grid of pixels 110. In FIG. 1A, for simplicity, screen 105 is only 4×4 and so only 16 pixels are shown, but a typical screen has many more pixels. One common screen resolution is high definition ("HD") resolution, where screen resolution indicates the number of pixels in a frame and is typically given as the horizontal resolution (number of pixels in one row) versus the vertical resolution (number of pixels in one column). HD resolution is either 1920×1080 (2,073,600 total pixels per frame) or 1280×720 (921,600 pixels per frame). Herein, HD resolution refers to 1920×1080.

Returning to FIG. 1A, the pixels 110 are often numbered sequentially for reference. Pixel 0 is typically at the upper left. FIG. 1B is a representation of a memory device 150 implementing a frame buffer as a grid of memory locations 155. Typical memory devices include SDRAM (synchronous dynamic random access memory). The actual memory device used may vary in different devices, but the memory locations for the frame buffer are typically in a contiguous block of locations with sequential addresses. Memory device 150 has a memory location 155 for storing pixel data (e.g., an intensity value) for each pixel 110 of screen 105. In some implementations, pixel data for more than one pixel is stored at each memory location. In many conventional raster-scan systems, pixel data is stored in memory locations adjacent to one another in the same pattern as the pixels on the screen. In FIG. 1B, each memory location 155 is numbered with the number of the pixel (110 from FIG. 1A) corresponding to the pixel data stored in that memory location 155. For example, the pixel at the upper left of the screen is pixel 0 in FIG. 1A and pixel data for pixel 0 is stored in the first memory location in memory device 150, as indicated by the "0" in the upper left memory location 155. The second memory location stores pixel data for pixel 1, the fifth memory location stores pixel data for pixel 4, and so on.

4. Pixel Rates

FIG. 2 is a representation of screen resolutions and typical data throughput requirements. FIG. 2 shows four resolutions in respective areas: VGA resolution (640×480) 205, XGA resolution (1024×768) 210, SXGA resolution (1280×1024) 215, and HD resolution (1920×1080) 220. The pixel rate for a screen resolution is the number of pixels per second that need to be processed to maintain the screen resolution at a specified refresh rate (i.e., the number of times a complete frame is drawn to the screen per second). While pixel rates vary among implementations, the pixel rates shown in FIG. 2 are representative. These pixel rates are given in megapixels per second ("MP/S"). For example, according to SMPTE 274M-1998 (a specification defining, among other things, pixel rates for resolutions of 1920×1080), for HD resolution 220 the pixel rate is about 150 MP/S @ 60 Hz. FIG. 2 also shows a corresponding approximate data rate in megabytes per second ("MB/S") for each resolution. The data rate is the number of bytes per second to be processed based on the number of bytes per pixel and the pixel rate. For example, HD resolution 220 has a data rate of 450 MB/S, at 24 bits per pixel (3 bytes). If each pixel has 32 bits of data, the data rate for HD resolution is 600 MB/S. However, the data rate of a typical 32-bit wide SDRAM running at 125 MHz is approximately 500 MB/S. A frame buffer architecture using two 125 MHz SDRAM's can realize a data rate of approximately 1000 MB/S. Alternatively, a faster SDRAM, such as one running at 150 MHz, can meet 600 MB/S.

5. Frame Buffers Using Parallel Storage in Two Memory Devices

FIG. 3A is a representation of a frame 305 of pixels 310 divided between two memory devices. Frame 305 has only 32 pixels for simplicity, but, as noted above, a typical HD resolution frame has 2,073,600 pixels. FIG. 3B is a representation of a first memory device 350 and FIG. 3C is a representation of a second memory device 375. Each pixel 310 in frame 305 is numbered, starting with pixel 0 in the upper left of frame 305. Even-numbered pixels are stored in first memory device 350 and odd-numbered pixels are stored in second memory device 375. The pixels stored in second memory device 375 are also shaded for clarity in FIGS. 3A and 3C.

FIG. 4 is a block diagram of a typical frame buffer architecture 400 capable of accessing pixel data for two pixels in parallel, supporting the representations shown in FIGS. 3A, 3B, and 3C. For example, frame buffer architecture 400 can be used in a typical scan converter. A video source 405 provides pixel data to a first memory 410 (recall first memory device 350 in FIG. 3B) and to a second memory 415 (recall second memory device 375 in FIG. 3C) in parallel and a video destination 420 retrieves pixel data from first memory 410 and from second memory 415 in parallel. In this implementation, pixel data for each pixel is stored in a separate addressable memory location. Video source 405 receives video data from another source (not shown), such as a broadcast source or a software application running on a computer system connected to video source 405. Video destination 420 controls the display of each pixel on a video device (not shown), such as a CRT. First memory 410 and second memory 415 are separate memory devices such as two SDRAM's. A first data bus 425 is connected to video source 405, first memory 410, and video destination 420. A second data bus 430 is connected to video source 405, second memory 415, and video destination 420. A source address bus 435 is connected to video source 405 and a first input 440 of an address multiplexor 445. A destination address bus 450 is connected to video destination 420 and a second input 455 of address multiplexor 445. An output 460 of address multiplexor 445 is connected to first memory 410 and second memory 415. Accordingly, the same address is provided to both first memory 410 and second memory 415. Address multiplexor 445 receives a control signal (not shown) to cause first input 440 or second input 455 to connect to output 460. First memory 410 and second memory 415 also receive control signals (not shown) to control whether memories 410 and 415 will read in data (write mode) or read out data (read mode). In addition, while clock lines are not shown in FIG. 4, architecture 400 operates based on clock cycles so that pixel data can be processed for two pixels per clock cycle in support of the desired pixel rate.

In operation, memories 410 and 415 read in or store complementary halves of a frame of pixels as pixel data from video source 405 and output the pixel data to video destination 420. To store pixel data, memories 410 and 415 are put in write mode and address multiplexor 445 is set to connect first input 440 to output 460. Video source 405 provides pixel data for a first pixel to first data bus 425, such as pixel 0 in FIG. 3A, and pixel data for a second pixel to second data bus 430, such as pixel 1 in FIG. 3A. First data bus 425 provides its pixel data to first memory 410 and second data bus 430 provides its pixel data to second memory 415. Video source 405 also provides an address to source address bus 435. To calculate the address, video source 405 can use a counter. Because each memory 410 and 415 stores pixel data for half the pixels in one frame, the counter typically ranges from 0 to one less than one-half of the number of pixels in one frame. Video source 405 can increment the counter by 1 for each pixel pair. Source address bus 435 provides the address to first input 440 of address multiplexor 445. Address multiplexor 445 in turn provides the address to first memory 410 and second memory 415. First memory 410 stores the pixel data on first data bus 425 at the address supplied by address multiplexor 445 from video source 405. Second memory 415 stores the pixel data on second data bus 430 at the same address. Two pixels have been stored in parallel in two memories using the same address. Referring to FIGS. 3A, 3B, and 3C, pixel 0 and pixel 1 are stored at the same time at the same address in first memory device 350 and second memory device 375, respectively. Accordingly, for example, pixel 0 is at address 0 in first memory device 350, pixel 1 is at address 0 in second memory device 375, pixel 2 is at address 1 in first memory device 350, pixel 3 is at address 1 in second memory device 375, and so on.

To retrieve pixel data, memories 410 and 415 are put in read mode and address multiplexor 445 is set to connect second input 455 to output 460. Video destination 420 provides an address to destination address bus 450. Destination address bus 450 provides the address to second input 455 of address multiplexor 445. Address multiplexor 445 in turn provides the address to first memory 410 and second memory 415. First memory 410 provides the pixel data stored at the address supplied by address multiplexor 445 from video destination 415 to first data bus 425. Second memory 415 provides the pixel data stored at the same address to second data bus 430. First data bus 425 provides its pixel data to video destination 420 and second data bus 430 provides its pixel data to video destination 420. Two pixels have been retrieved in parallel from two memories using the same address. Referring to FIGS. 3A, 3B, and 3C, pixel 0 and pixel 1 can be retrieved at the same time using the same address from first memory device 350 and second memory device 375, respectively.

FIG. 5 is a block diagram of another implementation of a dual pixel frame buffer architecture 500. Architecture 500 is similar to architecture 400 of FIG. 4, but a memory controller 545 provides data and addresses to memories 510 and 515. Memory controller 545 receives pixel data from video source 505 to store in memories 510 and 515. Memory controller 545 retrieves pixel data from memories 510 and 515 and provides the pixel data to video destination 520. Memory controller 545 replaces address multiplexor 445. Memory controller 545 receives signals from video source 505 and video destination 520 indicating whether pixel data is to be stored to or retrieved from memories 510 and 515. Memory controller 545 generates addresses and supplies these addresses along with control signals to memories 510 and 515. Accordingly, memory controller 545 controls address generation rather than video source 505 and video destination 520, as compared with architecture 400 of FIG. 4. In addition, as noted above with respect to FIG. 4, architecture 500 operates based on clock cycles so that pixel data can be processed for two pixels per clock cycle in support of the desired pixel rate.

6. Double-buffering

Typical frame buffer architectures often also utilize "double-buffering." Double-buffering is a well known technique where the memory address space of a frame buffer is divided into two sections. In some architectures, each section is a separate memory device, and in other architectures one or more devices are each divided into sections. Data from a frame is stored in one section while data from a previously stored frame is read from the other section. Series of reading and writing operations alternate. For example, after storing pixel data for 16 pixels, pixel data for 16 pixels is retrieved. After storing a frame, the sections switch roles. Pixel data for blocks of pixels can be temporarily stored before being sent to memory or after being received from memory in a buffer, such as a FIFO buffer. In architectures 400 and 500 from FIGS. 4 and 5, respectively, FIFO buffers can be included in both the video source and the video destination, or in the memory controller.

7. SDRAM

Various types of memory devices can be used in implementing a frame buffer. One common type of memory used is SDRAM (synchronous dynamic random access memory). The structure and operation of SDRAM is well known. In overview, an SDRAM has a number of addressable memory locations that depends on the total size of the SDRAM and the size of each memory location. Each addressable memory location has a corresponding memory address. For example, an 8 MB (megabyte) SDRAM where each location is 32 bits has 2,097,152 addressable locations, while an 8 MB SDRAM were each location is 8 bits has four times as many addressable locations. FIG. 6A is a representation of 2,097,152 memory locations as a one-dimensional array 605. Memory cells in a typical SDRAM are physically arranged in a two-dimensional grid and so individual cells can be identified using a combination of a row number and a column number. The memory locations within the same row are often collectively referred to as a "page." FIG. 6B is a representation of 2,097,152 memory locations as a two-dimensional array or grid 650 having X columns and Y rows. In FIG. 6B, grid 650 has 256 columns 655, from 0 to X−1, and 8192 rows or pages 660, from 0 to Y−1. Accordingly, the location in row y at column x has address (y*X+x). For example, location 665 (the first location in the last page) has address (X*(Y−1)) and location 670 (the last location in the last page) has address (X*Y−1). The sizes of the boxes representing locations in FIG. 6B are representative and not to scale, so different size boxes are not different size memory locations (e.g., locations 665 and 670).

An address for a memory cell can be viewed as a combination of a row address and a column address. FIG. 6C is a representation of an address 675 for one memory location out of 2,097,152. Address 675 has 21 bits, with A0 as the lowest order bit. The lower 8 bits, A0 to A7, are a column address 680, ranging from 0 to 255. The upper 13 bits, A8 to A20, are a row or page address 685, ranging from 0 to 8191.

Due to the nature of the construction of SDRAM, an entire page of memory cells is active at a time. Accessing cells within the same page can be accomplished relatively quickly using a series of column addresses without changing the page address. To change pages, a new page address is used and an additional delay is incurred from both the extra address cycle and a delay in the memory changing which page is active. This delay is referred to as a "page miss" and can result in a loss in speed. SRAM (static random access memory) typically does not incur the same page miss delay as SDRAM, but SRAM is typically more expensive than SDRAM.

In a conventional frame buffer using SDRAM, pixel data for horizontally neighboring pixels is typically stored in the same page of memory. Referring to FIGS. 1A and 1B, pixel data for pixels 0, 1, 2, and 3 would be stored in one page, pixel data for pixels 4, 5, 6, and 7 would be stored in another page, and so on. In a parallel architecture, such as architecture 400 in FIG. 4, a page stores pixel data for every other horizontally aligned pixel, such as the first page of memory device 350 storing pixel data for pixels 0, 2, 4, and 6 in FIGS. 3A and 3B. Storing and retrieving pixel data can be accomplished quickly with few page misses because pixel data in a conventional raster scan system is processed in row order (left to right, top to bottom) for both storing and retrieving. The pixel data for pixels in different rows are typically not stored in the same page, and so page misses occur when pixel data is to be stored or retrieved for pixels from different rows. For example, retrieving pixel data for pixels 0, 1, 2, and 3 would cause one page miss (the initial page miss in the first access), but retrieving pixel data for pixels 0, 4, 8, and 12 would cause four page misses.

SUMMARY

The present disclosure provides methods and apparatus for storing and retrieving data in parallel in two different orders using two-dimensional arrays mapped to memory locations. In one implementation, a checkerboard buffer page system includes: a data source, providing data elements in a first order; a data destination, receiving data elements in a second order; and at least four memory devices, each memory device having a plurality of memory pages including a plurality of memory locations, each memory location having an address, where data elements are stored to at least two memory devices and retrieved from at least two memory devices in parallel, where each data element corresponds to an entry in one of a plurality of buffer pages, each buffer page having a plurality of entries along a first dimension corresponding to the first order and a plurality of entries along a second dimension corresponding to the second order, where data elements are stored to the memory devices in the first order and retrieved from the memory devices in the second order, and where at least one memory page stores data elements in multiple locations according to the first order and stores data elements in multiple locations according to the second order, where at least two data elements that are consecutive in the first order are stored in parallel to the memory devices, and where at least two data elements that are consecutive in the second order are retrieved in parallel from the memory devices.

In another implementation, a checkerboard pixel page system includes: a video source providing pixel data for pixels in a frame, the frame having rows of pixels and columns of pixels; a video destination; a first memory having a plurality of memory locations; a second memory having a plurality of memory locations; a third memory having a plurality of memory locations; a fourth memory having a plurality of memory locations; a memory controller connected to the first memory, the second memory, the third memory, and the fourth memory; a first data bus connected to the video source and the memory controller; a second data bus connected to the video source and the memory controller; a third data bus connected to the video destination and the memory controller; a fourth data bus connected to the video destination and the memory controller; a source address line connected to the video source and the memory controller; a destination address line connected to the video destination and the memory controller; and where pixel data is stored to two memories and retrieved from two memory devices in parallel, where each pixel corresponds to an entry in one of a plurality of pixel pages, and a pixel page includes multiple pixels from a row in the frame and multiple pixels from a column in the frame, where each entry in a pixel page corresponds to a memory location, where pixel data for at least two pixels that are horizontally adjacent is stored in parallel to the memories, and where pixel data for at least two pixels that are vertically adjacent is retrieved in parallel from the memories.

In another implementation, a checkerboard pixel page system includes: a video source providing pixel data for pixels in a frame, the frame having rows of pixels and columns of pixels; a video destination; a first memory having a plurality of memory locations; a second memory having a plurality of memory locations; a third memory having a plurality of memory locations; a fourth memory having a plurality of memory locations; a first address multiplexor connected to the first memory; a second address multiplexor connected to the second memory; a third address multiplexor connected to the third memory; a fourth address multiplexor connected to the fourth memory; a four-by-four switch connected to the first memory, the second memory, the third memory, and the fourth memory, having a first data input, a second data input, a first data output and a second data output, where the four-by-four switch switches with each frame between providing pixel data to the first memory and the second memory while receiving pixel data from the third memory and the fourth memory, and receiving pixel data from the first memory and the second memory while providing pixel data to the third memory and the fourth memory; a source address bus connected to the video source, the first address multiplexor, the second address multiplexor, the third address multiplexor, and the fourth address multiplexor; a first destination address bus connected to the video destination, the first address multiplexor, and the third address multiplexor; a second destination address bus connected to the video destination, the second address multiplexor, and the fourth address multiplexor; a first data bus connected to the video source and the four-by-four switch; a second data bus connected to the video source and the four-by-four switch; a third data bus connected to the video destination and the four-by-four switch; and a fourth data bus connected to the video destination and the four-by-four switch, where pixel data is stored to two memories and retrieved from two memories in parallel, where each pixel corresponds to an entry in one of a plurality of pixel pages, and a pixel page includes multiple pixels from a row in the frame and multiple pixels from a column in the frame, where each entry in a pixel page corresponds to a memory location, where pixel data for at least two pixels that are horizontally adjacent is stored in parallel to the memories, and where pixel data for at least two pixels that are vertically adjacent is retrieved in parallel from the memories.

In another implementation, a method of storing and retrieving pixel data includes: storing pixel data for a first frame of pixels in a first memory device and a second memory device, where each memory device includes a plurality of memory pages, and at least one memory page stores pixel data for at least two pixels from each of at least two horizontal rows of pixels in the first frame of pixels; storing pixel data for a second frame of pixels in a third memory device and a fourth memory device, where each memory device includes a plurality of memory pages, and at least one memory page stores pixel data for at least two pixels from each of at least two horizontal rows of pixels in the second frame of pixels; and retrieving pixel data for the first frame of pixels from the first memory device and second memory device, where pixel data for at least two pixels that are horizontally adjacent is stored in parallel to the memory devices, and where pixel data for at least two pixels that are vertically adjacent is retrieved in parallel from the memory devices.

BRIEF DESCRIPTION OF THE DRAWINGS

FIG. 1B is a representation of a memory device implementing a frame buffer as a grid of memory locations.

FIG. 3A is a representation of a frame of pixels divided between two memory devices.

FIG. 3B is a representation of a first memory device.

FIG. 3C is a representation of a second memory device.

FIG. 5 is a block diagram of another implementation of a dual pixel frame buffer architecture.

FIG. 7 is a representation of a frame of pixels.

FIG. 8 is a representation of a frame of pixels divided between two memory devices.

FIG. 10A is a representation of a pixel page having 16 pixels in four pixel page columns and four pixel page rows, a first page of memory having eight memory locations in a first memory device, and a second page of memory having eight memory locations in a second memory device according to the present invention.

FIG. 11 is a representation of one implementation of a pixel page of pixels in an HD resolution implementation using two memory devices according to the present invention.

FIG. 12 is a table showing the relationships among a pixel, a frame row, a frame column, a pixel page, a pixel page row, a pixel page column, a memory page, a memory address, and a memory device for an HD resolution implementation (1920×1080) according to the present invention.

FIG. 16 is a table showing the relationships among a pixel, a frame row, a frame column, a pixel page, a pixel page row, a pixel page column, a memory page, a memory address, and a memory device for an HD resolution implementation (1920×1080) according to the present invention.

FIG. 22 is a table showing the relationships among a pixel, a frame row, a frame column, a pixel page, a pixel page row, a pixel page column, a memory page, a memory address, and a memory device for an HD resolution implementation (1920×1080) according to the present invention.

DETAILED DESCRIPTION

Figure 1A:
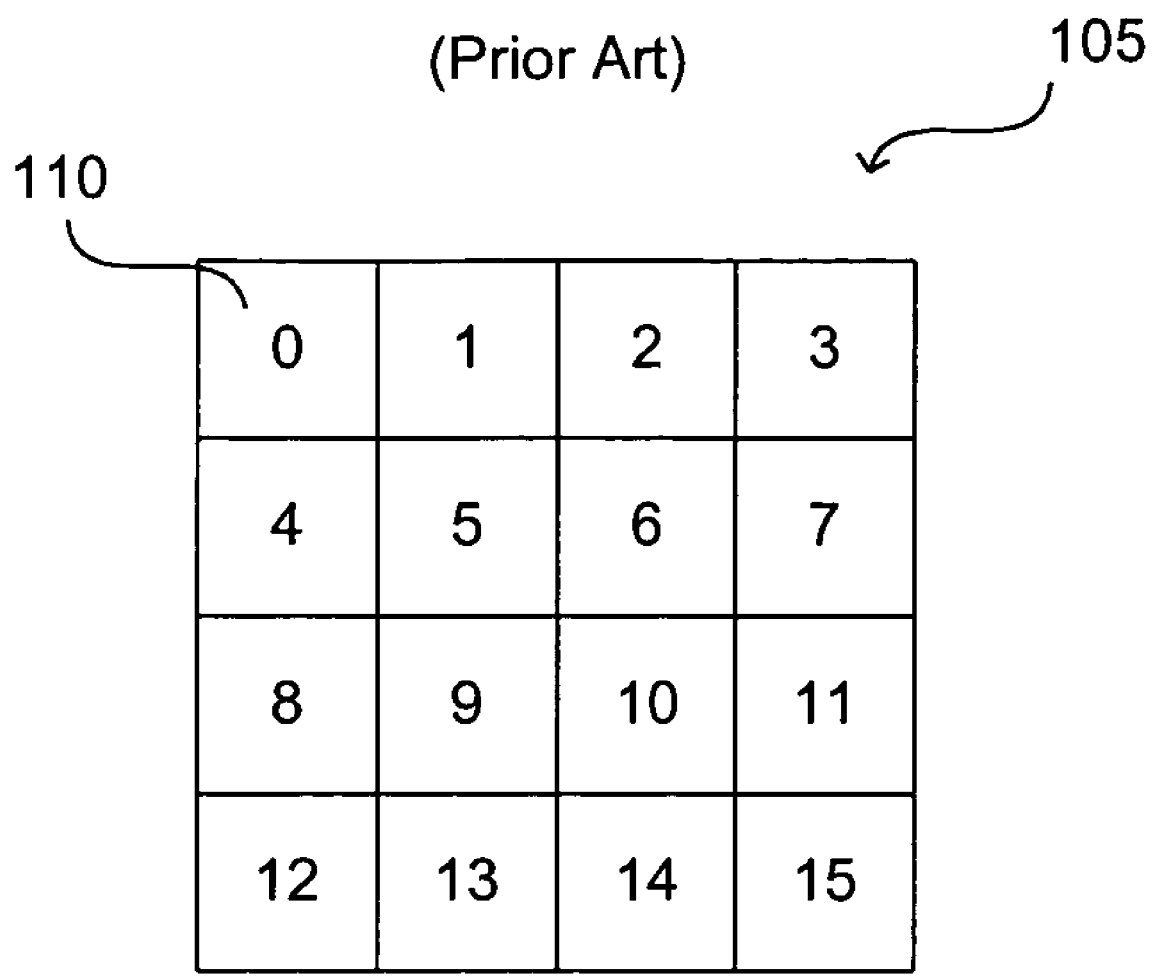
FIG. 1A is a representation of a screen as a grid of pixels.
Figure 2:
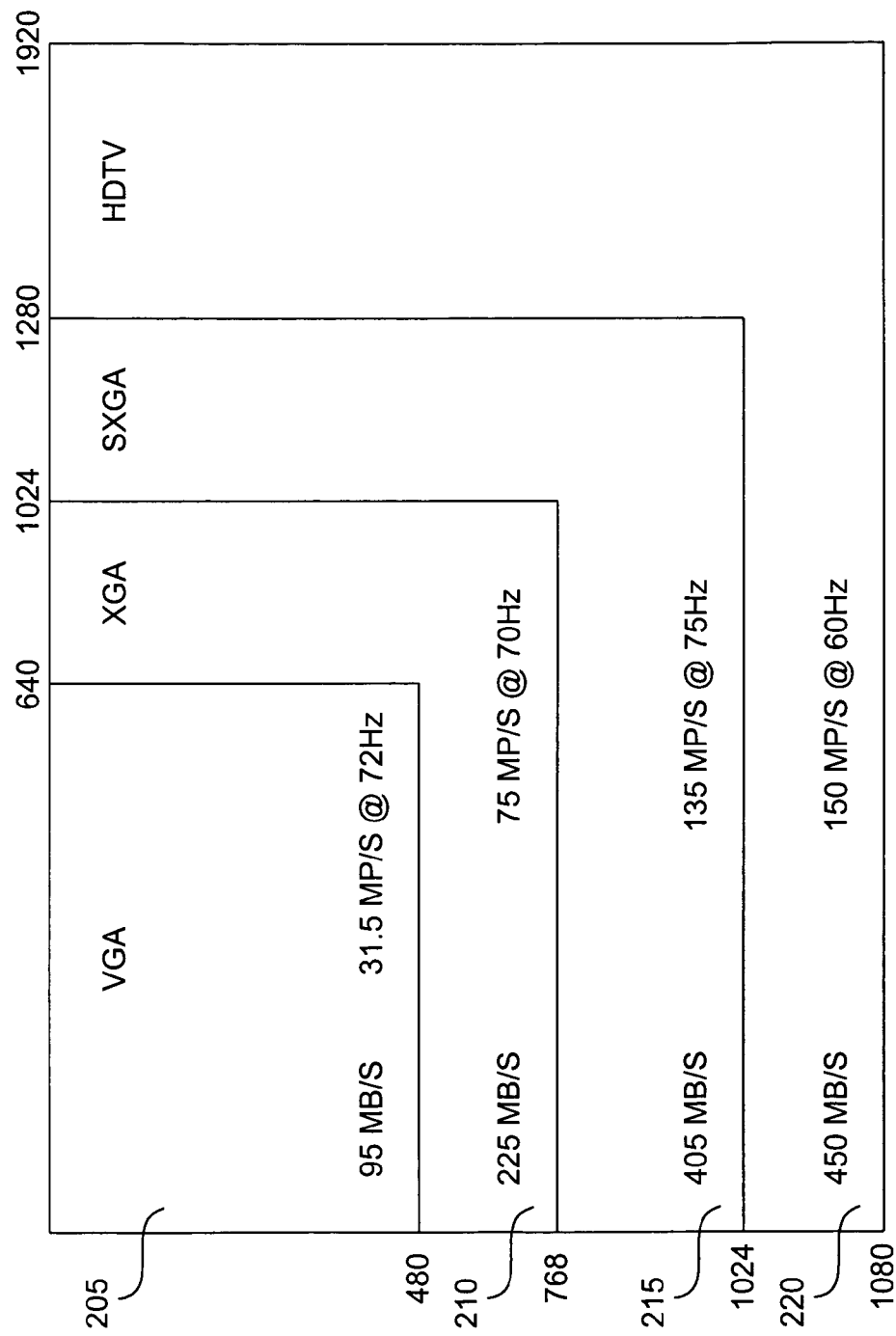
FIG. 2 is a representation of screen resolutions and typical data throughput requirements.
Figure 4:
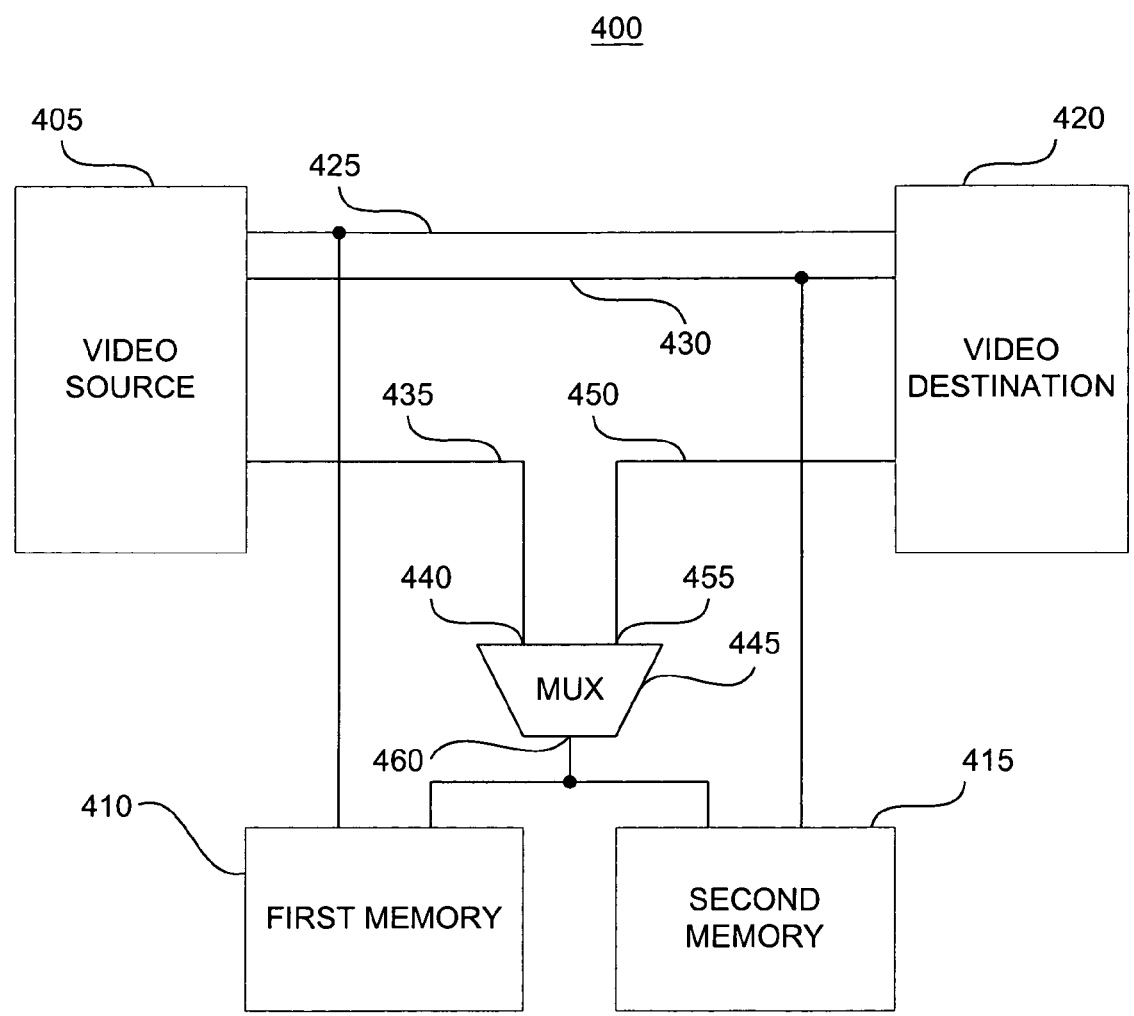
FIG. 4 is a block diagram of a typical frame buffer architecture capable of accessing pixel data for two pixels in parallel.
Figure 6A:
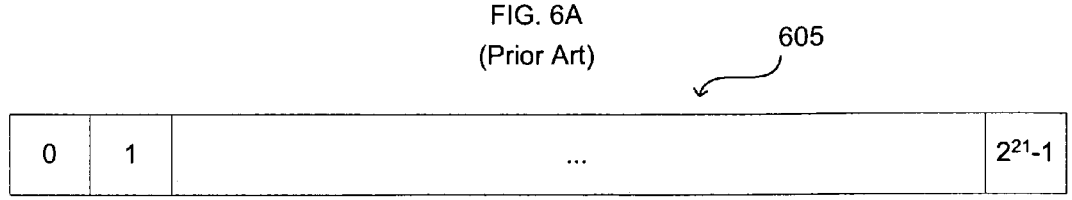
FIG. 6A is a representation of 2,097,152 memory locations as a one-dimensional array.
Figure 6B:
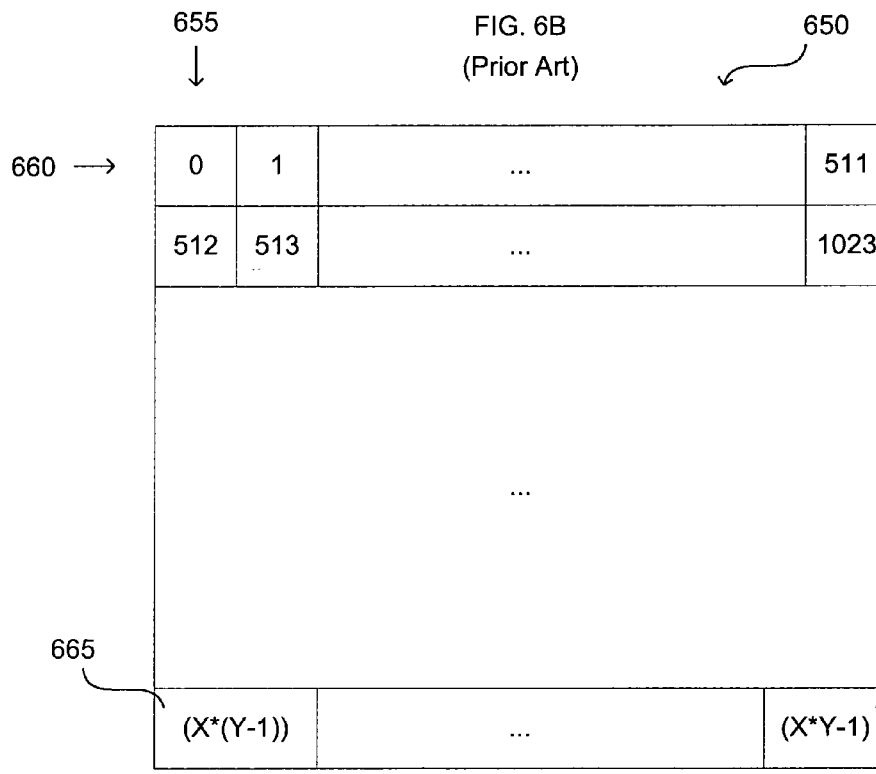
FIG. 6B is a representation of 2,097,152 memory locations as a two-dimensional array or grid.
Figure 6C:
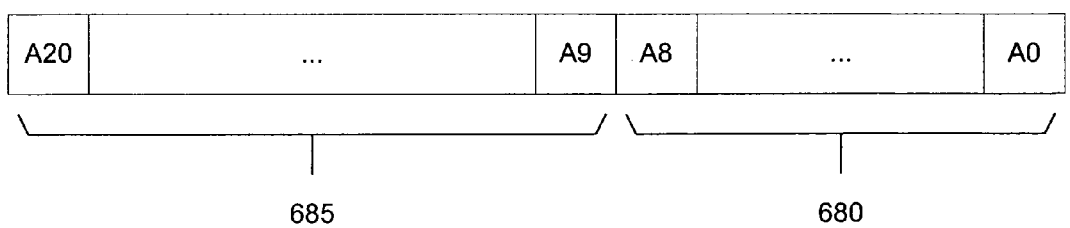
FIG. 6C is a representation of an address for one memory location out of 2,097,152.

The present invention provides methods and apparatus for storing and retrieving data in parallel using two different orders and two-dimensional arrays mapped to memory locations, such as in DRAM. This description focuses on implementations where the data is pixel data, however, the present invention is applicable to various types of data that can be accessed in two different orders. As described below, in one implementation, pixels are stored according to a checkerboard pattern, alternately between two memory devices (also referred to as memories herein). This pattern advantageously allows pixels to be stored in parallel following a horizontal row of pixels and retrieved in parallel following a vertical column of pixels.

The two-dimensional arrays form a buffer and are referred to herein as buffer pages. Data corresponding to a buffer page is stored in a first order following the first dimension of the buffer page and retrieved in a second order following the second dimension. The memory locations within a memory device corresponding to one buffer page are in the same physical memory page. The buffer page represents a memory mapping of data to memory locations. In one implementation, the buffer pages are for storing pixel data and these buffer pages are referred to as "pixel pages." As described below, a pixel page maps pixel data to memory locations for a region of pixels from multiple rows and columns of pixels. Pixel data is stored according to horizontal rows of pixels and retrieved according to vertical columns of pixels. In alternative implementations, buffer pages can be formed from arrays having more than two dimensions to accommodate accessing data in more than two orders. Buffer pages advantageously allow data to be stored and retrieved in two orders accessing the same memory page. By accessing the same memory page for both orders, page misses can be reduced.

The description below is generally divided into two sections for clarity: A. Checkerboard Buffers Using Two-dimensional Buffer Pages; and B. Illustrative Implementations of Checkerboard Buffers Using Pixel Pages.

A. Checkerboard Buffers Using Two-dimensional Buffer Pages

Buffer pages, checkerboard buffers, and the combination of these aspects are described below. Buffer pages and checkerboard buffers are first described separately, then the combination is described. Buffer pages and checkerboard buffers are separately described more fully in U.S. application Ser. No. 10/051,538, filed Jan. 16, 2002 and U.S. application Ser. No. 09/908,295, filed Jul. 17, 2001, respectively.

1. Buffer Pages

Two-dimensional buffer pages are a useful memory mapping in a buffer for storing data in a first order and retrieving data in a second order. Data is stored along the first dimension according to the first order and data is retrieved along the second dimension according to the second order. Different address sequences are used in data storage and retrieval to follow the dimensions of the buffer pages.

In implementations using video data, the buffer pages are used in a frame buffer for storing pixel data. The buffer pages in video data implementations are referred to herein as pixel pages. Pixel data is supplied to the frame buffer according to the horizontal order of pixels in a frame, such as from left to right, top to bottom. Pixel data is provided by the frame buffer according to the vertical order of pixels in a frame, such as from top to bottom, left to right. Pixel pages are configured to support storing and retrieving pixel data in these two different orders. In an alternative implementation, pixel data is supplied to the frame buffer according to vertical columns of pixels and provided by the frame buffer according to horizontal rows of pixels.

Each pixel page is a two-dimensional mapping of pixels and pixel data to memory locations, aligning rows and columns within the pixel page with rows and columns in the frame of pixels. One dimension of the pixel page, referred to as pixel page rows, corresponds to horizontal rows of pixels in the frame, referred to as frame rows. A second dimension of the pixel page, referred to as pixel page columns, corresponds to vertical columns of pixels in the frame, referred to as frame columns. A pixel page has multiple pixel page rows and multiple pixel page columns. Each pixel page indicates memory locations from a single physical memory page so that consecutive accesses to locations from a single pixel page do not cause page misses. Accordingly, accessing consecutive locations corresponding to a pixel page along a pixel page row or along a pixel page column do not cause page misses. Page misses can occur at the end of a pixel page row or pixel page column in making a transition to another pixel page. By storing pixel data along pixel page rows and retrieving data along pixel page columns, page misses can be reduced in processing pixel data that is to be stored in one order and retrieved in another order.

As described above referring to FIGS. 3A, 3B, 3C, and 4, a frame buffer architecture using two memory devices can achieve a higher pixel rate and data rate than an architecture using a single memory device of the same speed. Pixel pages can be used with two memory devices in parallel as well. As described above, pixel data for half of the pixels in a frame is stored in one memory device and pixel data for the other half of the pixels is stored in the second device. Similarly, pixel data for half of the pixels in a pixel page is stored in the first memory device and pixel data for the other half of the pixels in the pixel page is stored in the second device.

FIG. 7 is a representation of a frame 705 of pixels 710. Frame 705 has 16 frame columns and 16 frame rows (16×16; 256 pixels) for simplicity, but other resolutions are possible. For example, as noted above, a frame in one typical HD resolution is 1920×1080 (2,073,600 pixels). Pixels 710 in frame 705 are sequentially numbered from 0 to 255. Pixel data for half of the pixels 710 is stored in a first memory device and pixel data for the other half of the pixels 710 is stored in a second memory device (the memory devices are not shown in FIG. 7). Similar to FIGS. 3A, 3B, and 3C, pixels having pixel data stored in the first memory device are indicated by unshaded boxes, such as even-numbered pixels (e.g., pixel 0), and pixels having pixel data stored in the second memory device are indicated by shaded boxes, such as odd-numbered pixels (e.g., pixel 1).

Frame 705 is divided into pixel pages 715, outlined in heavier lines. Each pixel page 715 includes 16 pixels, in four pixel page columns 720 and four pixel page rows 725. Accordingly, a pixel page column 720 includes four pixels 710, and a pixel page row 725 includes four pixels 710. Frame 705 has 16 pixel pages 715, four horizontally by four vertically.

Pixel data for half of each pixel page 715 is stored in each of the two memory devices. Pixel data for a pixel page 715 is stored in the same memory page in the respective memory devices. For example, half of the pixel data for the first pixel page 715 is stored in the first memory page of the first memory device and the other half of the pixel data is stored in the first memory page of the second memory device. For frame 705, the first pixel page 715 includes pixels 0, 1, 2, 3, 16, 17, 18, 19, 32, 33, 34, 35, 48, 49, 50, and 51. The first page of memory in the first memory device stores pixel data for pixels 0, 2, 16, 18, 32, 34, 48, and 50. The first page of memory in the second memory device stores pixel data for pixels 1, 3, 17, 19, 33, 35, 49, and 51.

Furthermore, pixels 710 in neighboring pixel page columns 720 can be considered to be in horizontal pixel pairs. For example, pixels 0 and 1 are a pixel pair, pixels 2 and 3 are a pixel pair, pixels 16 and 17 are a pixel pair, and so on. Pixel data for respective pixels of a pixel pair is stored in memory locations in the respective memory devices having the same memory address. For example, pixel data for pixel 0 is stored at address 0 (i.e., the memory location having address 0) in the first memory device and pixel data for pixel 1 is stored at address 0 in the second memory device. One address can be used to access two memory locations by supplying the address to two memory devices, accessing one memory location in each memory device. For example, by supplying address 0 to the memory devices, pixel data stored in the first memory location of each memory device can be retrieved (i.e., pixel data for pixels 0 and 1). Accordingly, pixel data for a pixel pair can be stored or retrieved in parallel.

2. Checkerboard Buffers

A checkerboard buffer provides storage of data in one order and retrieval of data in another order. A checkerboard buffer includes two or more memory devices for parallel storage and retrieval of data. For two memory devices, half of the data is stored in each of the memory devices. As data elements are received, which data is stored to which memory device changes according to the difference between the order data is received and the order data is to be retrieved. The data is stored in the memory devices so that data can be stored to the two devices in one order in parallel and retrieved from the two devices in another order in parallel.

In implementations using video data, the checkerboard buffer is a frame buffer for storing pixel data. Pixel data is supplied to the checkerboard buffer according to the horizontal order of pixels in a frame, such as from left to right, top to bottom. Pixel data is retrieved from the checkerboard buffer according to the vertical order of pixels in a frame, such as from top to bottom, left to right. Pixel data is stored and retrieved for a pair of pixels at a time. Pixel data for one pixel is stored in or retrieved from one memory device and pixel data for the other pixel in or from another memory device.

FIG. 8 illustrates a checkerboard pattern of storage in two memory devices providing parallel storage and parallel retrieval. FIG. 8 is a representation of a frame 805 of pixels 810 divided between two memory devices. Similar to frame 705 in FIG. 7, frame 805 has only 256 pixels for simplicity, but other resolutions are possible.

Each pixel 810 in frame 805 is numbered, starting with pixel 0 in the upper left of frame 805. Frame 805 has 16 vertical frame columns 815, numbered from 0 to 15, with the leftmost vertical frame column (i.e., pixels 0, 16, 32, . . . 240) numbered 0. Frame 805 has 16 horizontal frame rows 820, numbered from 0 to 15, with the uppermost frame row (i.e., pixels 0 . . . 15) numbered 0. Pixel data for half of the pixels 810 is stored in a first memory device and pixel data for the other half of the pixels 810 is stored in a second memory device (the memory devices are not shown in FIG. 8). Similar to FIG. 7, pixels having pixel data stored in the first memory device are indicated by unshaded boxes, such as pixels 0 and 17, and pixels having pixel data stored in the second memory device are indicated by shaded boxes, such as pixels 1 and 16.

Similar to frame 705 in FIG. 7, one address can be used to access two memory locations corresponding to a horizontal pixel pair by supplying the address to two memory devices, accessing one memory location in each memory device. For example, pixels 0 and 1 are a horizontal pixel pair and by supplying address 0 to both memory devices, pixel data stored in the first memory location of each memory device can be retrieved. However, which memory device stores pixel data for which pixel in the horizontal pixel pair changes with each frame row. Vertical pixel pairs are used for retrieving pixel data for two pixels at a time. Two vertically adjacent pixels form a vertical pixel pair, such as pixels 0 and 16 in frame 805.

Pixel data for frame 805 would be supplied to the checkerboard buffer in horizontal pixel pairs (i.e., two pixels at a time, one for each memory device) according to the horizontal frame rows of frame 805. For example, the checkerboard buffer would receive pixel data for pixels in frame 805 according to this sequence of pixel pairs: 0-1, 2-3, 4-5, . . . , 254-255. The checkerboard buffer stores the pixel data using this sequence, for two pixels at a time, but changes which memory device receives which pixel data with each frame row. The first memory device receives and stores pixel data for the first pixel in the pixel pair in even-numbered frame rows and pixel data for the second pixel in the pixel pair in odd-numbered frame rows. The second memory device receives and stores pixel data for the second pixel in the pixel pair in even-numbered frame rows and pixel data for the first pixel in the pixel pair in odd-numbered frame rows. For example, for the first frame row of is pixels, the first memory device receives and stores pixel data for pixels 0, 2, 4, 6, 8, 10, 12, and 14, and second memory device receives and stores pixel data for pixels 1, 3, 5, 7, 9, 11, 13, and 15. For the second frame row of pixels, the first memory device receives and stores pixel data for pixels 17, 19, 21, 23, 25, 27, 29, and 31, and second memory device receives and stores pixel data for pixels 16, 18, 20, 22, 24, 26, 28, 30, and 32. This pattern continues for the rest of frame 805.

Pixel data would be retrieved for frame 805 from the checkerboard buffer in vertical pixel pairs (i.e., two pixels at a time, one for each memory device) according to the vertical frame columns of frame 805. For example, the checkerboard buffer would supply pixel data for pixels in frame 805 according to this sequence of pixel pairs: 0-16, 32-64, . . . , 224-240, 1-17, 33-65, . . . , 225-241, . . . , 239-255. The checkerboard buffer retrieves pixel data using this sequence, for two pixels at a time, but changes which memory device to access for which pixel data with each frame column. The first memory device is accessed and provides pixel data for the first pixel in the vertical pixel pair in even-numbered frame columns and pixel data for the second pixel in the pixel pair in odd-numbered frame columns. The second memory device receives and stores pixel data for the second pixel in the pixel pair in even-numbered frame columns and pixel data for the first pixel in the pixel pair in odd-numbered frame columns. For example, for the first frame column of pixels, the first memory device provides pixel data for pixels 0, 32, 64, 96, 128, 160, 192, and 224, and second memory device provides pixel data for pixels 16, 48, 80, 112, 144, 176, 208, and 240. For the second frame column of pixels, the first memory device provides pixel data for pixels 17, 49, 81, 113, 145, 177, 209, and 241, and the second memory device provides pixel data for pixels 1, 33, 65, 97, 129, 161, 193, and 225. This pattern continues for the rest of frame 805.

3. Checkerboard Buffers Using Two-dimensional Buffer Pages

As described above, checkerboard buffers provide parallel storing and retrieving of data in different orders and buffer pages provide storing and retrieving data in different orders from the same memory pages. By combining the two, data can be stored or retrieved in parallel using different orders and within the same corresponding memory pages (recalling that when using two memory devices, one memory page in each memory device corresponds to each pixel page). In a video implementation, pixel data for two horizontally adjacent pixels is stored in parallel to corresponding memory pages in each memory, and pixel data for two vertically adjacent pixels is retrieved in parallel from corresponding memory pages in each memory.

Figure 9:
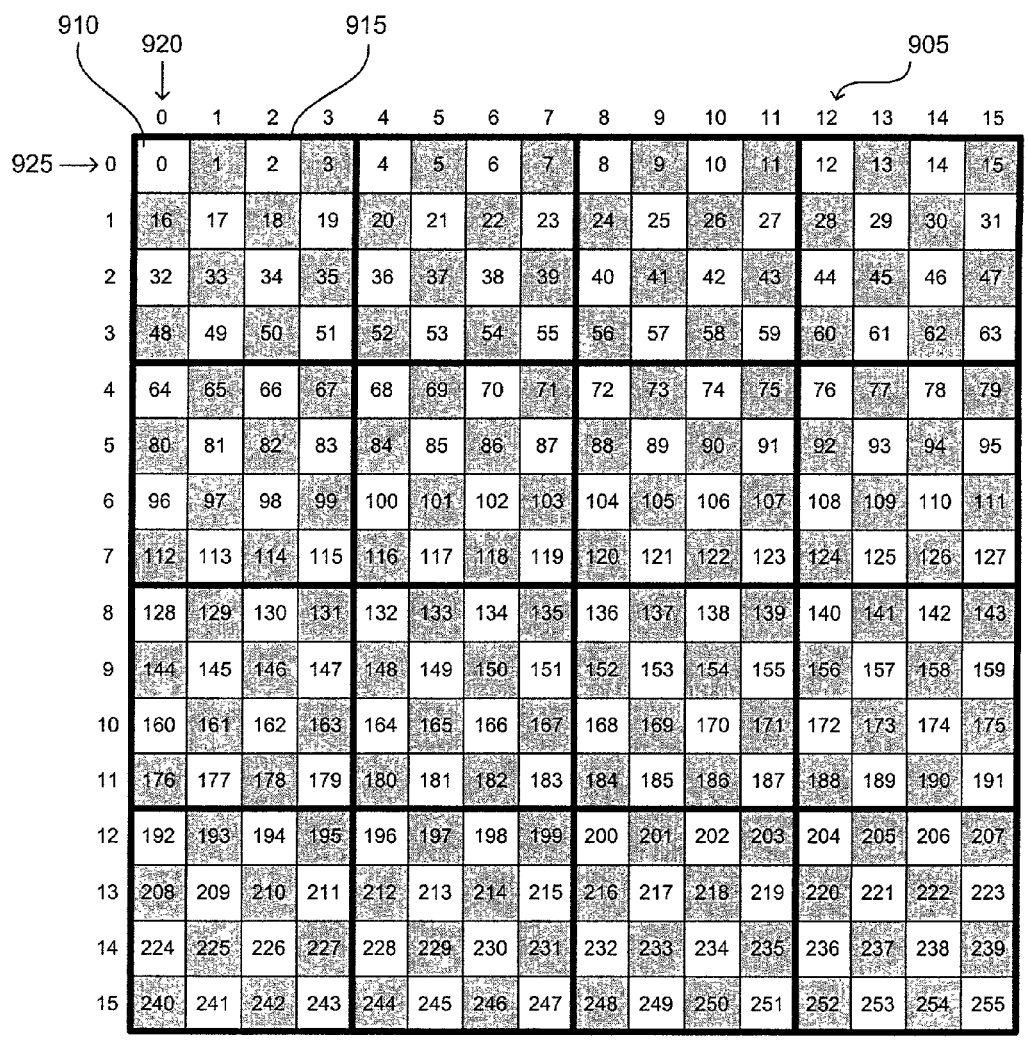
FIG. 9 is a representation of a frame of pixels divided between two memory devices according to the present invention.

FIG. 9 is a representation of a frame 905 of pixels 910 divided between two memory devices (not shown). Similar to FIGS. 7 and 8, frame 905 has only 256 pixels for simplicity, but other resolutions are possible, such as HD resolution 1920×1080.

Each pixel 910 in frame 905 is numbered, starting with pixel 0 in the upper left of frame 905. Frame 905 has 16 vertical frame columns 920, numbered from 0 to 15, with the leftmost vertical frame column (i.e., pixels 0, 16, 32, . . . 240) numbered 0. Frame 905 has 16 horizontal frame rows 925, numbered from 0 to 15, with the uppermost horizontal frame row (i.e., pixels 0 . . . 15) numbered 0. Pixel data for half of the pixels 910 is stored in a first memory device and pixel data for the other half of the pixels 910 is stored in a second memory device. Similar to FIGS. 7 and 8, pixels having pixel data stored in the first memory device are indicated by unshaded boxes, such as pixels 0 and 17, and pixels having pixel data stored in the second memory device are indicated by shaded boxes, such as pixels 1 and 16.

Similar to FIG. 7, frame 905 is divided into pixel pages 915, outlined in heavier lines. Each pixel page 915 includes 16 pixels, in four pixel page columns 920 and four pixel page rows 925. Accordingly, a pixel page column 920 includes four pixels 910, and a pixel page row 925 includes four pixels 910. Frame 905 has 16 pixel pages 915, four horizontally by four vertically.

Pixel data for half of each pixel page 915 is stored in each of the two memory devices. Pixel data for a pixel page 915 is stored in the same memory page in the respective memory devices. For example, half of the pixel data for the first pixel page 915 is stored in the first memory page of the first memory device and the other half of the pixel data is stored in the first memory page of the second memory device. For frame 905, the first pixel page 915 includes pixels 0, 1, 2, 3, 16, 17, 18, 19, 32, 33, 34, 35, 48, 49, 50, and 51. The first page of memory in the first memory device stores pixel data for pixels 0, 2, 17, 19, 32, 34, 49, and 51. The first page of memory in the second memory device stores pixel data for pixels 1, 3, 16, 18, 33, 35, 48, and 50.

Figure 10B:
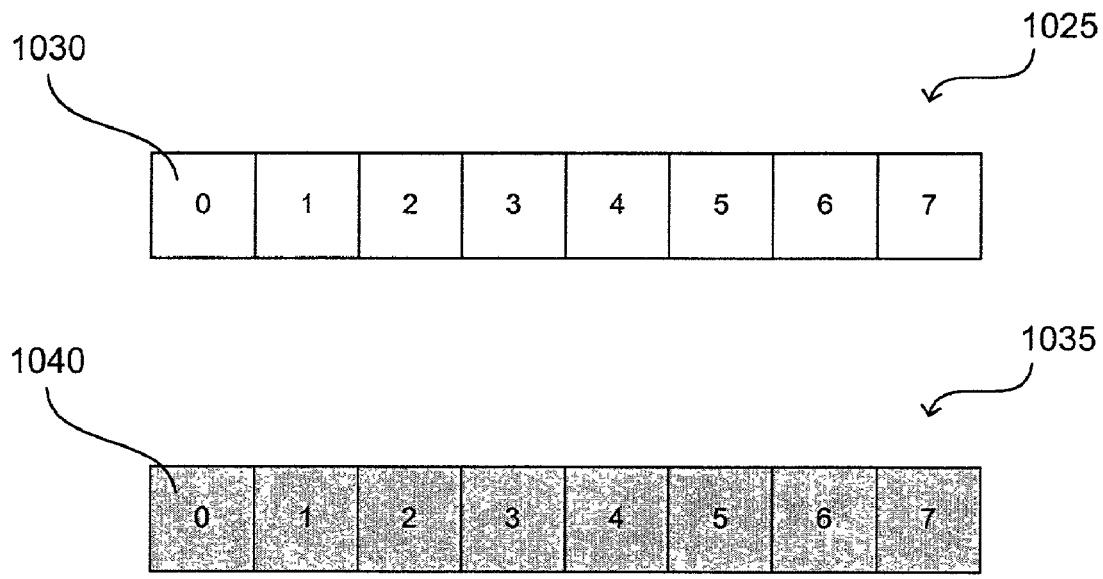
FIG. 10B is another representation of a pixel page and memory pages according to the present invention.

FIGS. 10A and 10B further illustrate the relationship between pixel pages and memory pages. FIG. 10A is a representation of a pixel page 1005 having 16 pixels 1010 in four pixel page columns 1015 and four pixel page rows 1020. FIG. 10A also shows a first page of memory 1025 having eight memory locations 1030 in a first memory device and a second page of memory 1035 having eight memory locations 1040 in a second memory device, based on the pixels 910 in FIG. 9. Memory pages 1025, 1035 store pixel data for pixel page 1005. Each pixel 1010 of pixel page 1005 is numbered with pixel numbers corresponding to the numbers of pixels 910 in FIG. 9. Each memory location 1030, 1040 of memory pages 1025, 1035, respectively, is numbered according to the pixel 1010 that corresponds to the pixel data stored in that location 1030, 1040. Similar to FIG. 9, pixels having pixel data stored in the first memory device in first memory page 1025 are indicated by unshaded boxes, such as pixels 0 and 17, and pixels having pixel data stored in the second memory device in second memory page 1035 are indicated by shaded boxes, such as pixels 1 and 16.

FIG. 10B is another representation of pixel page 1005 and memory pages 1025, 1035. Each memory location 1030, 1040 has a memory address. In FIG. 10B, each memory location 1030, 1040 of memory pages 1025, 1035, respectively, is numbered with the memory address of that location 1030. Each pixel 1010 of pixel page 1005 is numbered according to the memory address of the memory location 1030, 1040 storing pixel data for that pixel 1010. Accordingly, FIGS. 10A and 10B show the address of the memory location 1030, 1040 storing pixel data for a pixel 1010. For example, pixel data for pixel 0 is stored at memory address 0 in the first memory device, and pixel data for pixel 16 is stored at memory address 2 in the second memory device.

4. HD Resolution

Figure 11:
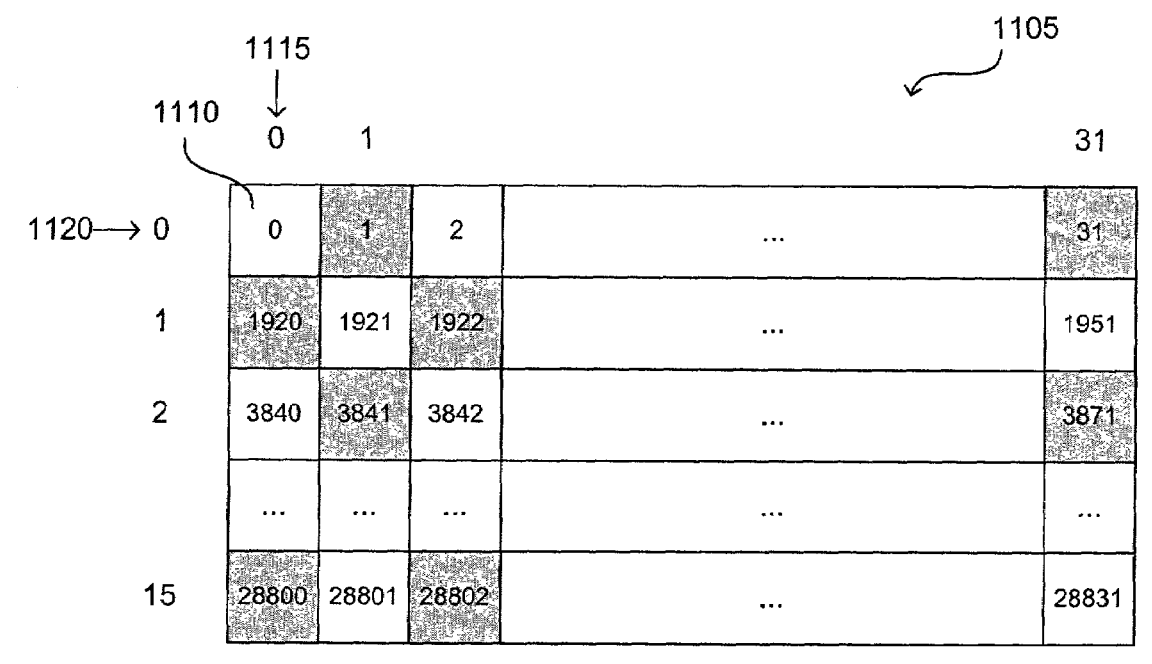

FIG. 11 is a representation of one implementation of a pixel page 1105 of pixels 1110 in an HD resolution implementation (1920×1080) using two memory devices. Pixel page 1105 includes 512 pixels 1110, in 32 pixel page columns 1115 (numbered 0 to 31) and 16 pixel page rows 1120 (numbered 0 to 15). A pixel page column 1115 includes 16 pixels 1110 and a pixel page row 1120 includes 32 pixels 1110. For clarity, not every pixel 1110 of pixel page 1105 is shown in FIG. 11. Ellipses indicate intervening pixels 1110. Similar to FIG. 9, unshaded boxes indicate pixels for which pixel data is stored in one memory device and shaded boxes indicate pixels for which pixel data is stored in the other memory device (except for boxes with ellipses). For example, pixel data for pixel 0 is stored in a first memory and pixel data for pixel 1 is stored in a second memory.

The first pixel page 1105 for a frame includes the leftmost 32 pixels for each of the uppermost 16 frame rows (i.e., pixels 0–31, 1920–1951, and so on). As described above, an HD resolution frame has 2,073,600 pixels, in 1920 frame columns and 1080 frame rows. Each pixel page 1105 is 32 pixels 1110 wide, so one frame has at least 60 pixel pages 1105 horizontally. Each pixel page 1105 is 16 pixels 1110 tall, so one frame has at least 68 pixel pages 1105 vertically (though the pixel pages 1105 in the 68$^{th}$ row of pixel pages 1105 are not completely filled with valid screen pixels, where a "valid" screen pixel is a pixel in the frame for which pixel data has been provided from the video source). In total, one frame has at least 4080 pixel pages 1105 allocated, where each allocated pixel page has a corresponding memory page in each memory device. In an HD resolution implementation, pixel data is stored and retrieved in similar sequences to those described above. Pixel data is stored along horizontal frame rows, for two pixels at a time, such as this sequence of pixel pairs: 0-1, 2-3, and so on. Pixel data is retrieved along vertical frame columns, for two pixels at a time, such as this sequence of pixel pairs: 0-1920, 3840-5760, and so on. Various geometries and page sizes can be used for pixel pages in other implementations, such as 8×32, 16×32, or 64×16.

Recalling the relationship illustrated in FIGS. 9, 10A, and 10B, FIG. 12 is a table 1200 showing the relationships among a pixel, a frame row, a frame column, a pixel page, a pixel page row, a pixel page column, a memory page, a memory address, and a memory device for an HD resolution implementation (1920×1080) using pixel pages 1105 in FIG. 11. In FIG. 12, the pixel data for a frame is stored in two memory devices, each device having 256 memory locations per memory page. In addition, FIG. 12 shows only a representative sample of pixels from a frame for clarity. As described above, an HD resolution frame has 2,073,600 pixels.

Column 1205 indicates the number of a pixel for which related information is shown in table 1200. Pixels in a frame are numbered from 0, left to right, top to bottom. For example, the first pixel in the frame is numbered 0, the last pixel of the first frame row is numbered 1919, and the first pixel of the second frame row is numbered 1920. Column 1210 indicates a frame row including the pixel in column 1205. Frame rows are numbered from 0, top to bottom. Column 1215 indicates a frame column including the pixel in column 1205. Frame columns are numbered from 0, left to right. Column 1220 indicates a pixel page including the pixel in column 1205. Pixel pages in a frame are numbered from 0, left to right, top to bottom. Column 1225 indicates a pixel page row including the pixel in column 1205. Pixel page rows are numbered from 0, from top to bottom within the pixel page including the pixel page row. Column 1230 indicates a pixel page column including the pixel in column 1205. Pixel page columns are numbered from 0, left to right within the pixel page including the pixel page column. Column 1235 indicates a memory page storing pixel data for the pixel in column 1205. Memory pages are numbered sequentially from 0. Column 1240 indicates a memory address of a memory location storing pixel data for the pixel in column 1205. Column 1245 indicates which memory device stores pixel data for the pixel in column 1205. The two memory devices are numbered 0 and 1.

As described above, two pixels have pixel data stored at the same address in different devices. For example, the first pixel of a frame is pixel 0, in frame row 0 and frame column 0, in pixel page row 0 and pixel page column 0 of pixel page 0, stored at memory address 0 in memory page 0 of memory device 0. The second pixel of a frame (horizontally) is pixel 1, in frame row 0 and frame column 1, in pixel page row 0 and pixel page column 1 of pixel page 0, stored at memory address 0 in memory page 0 of memory device 1.

5. Data System

Figure 13:
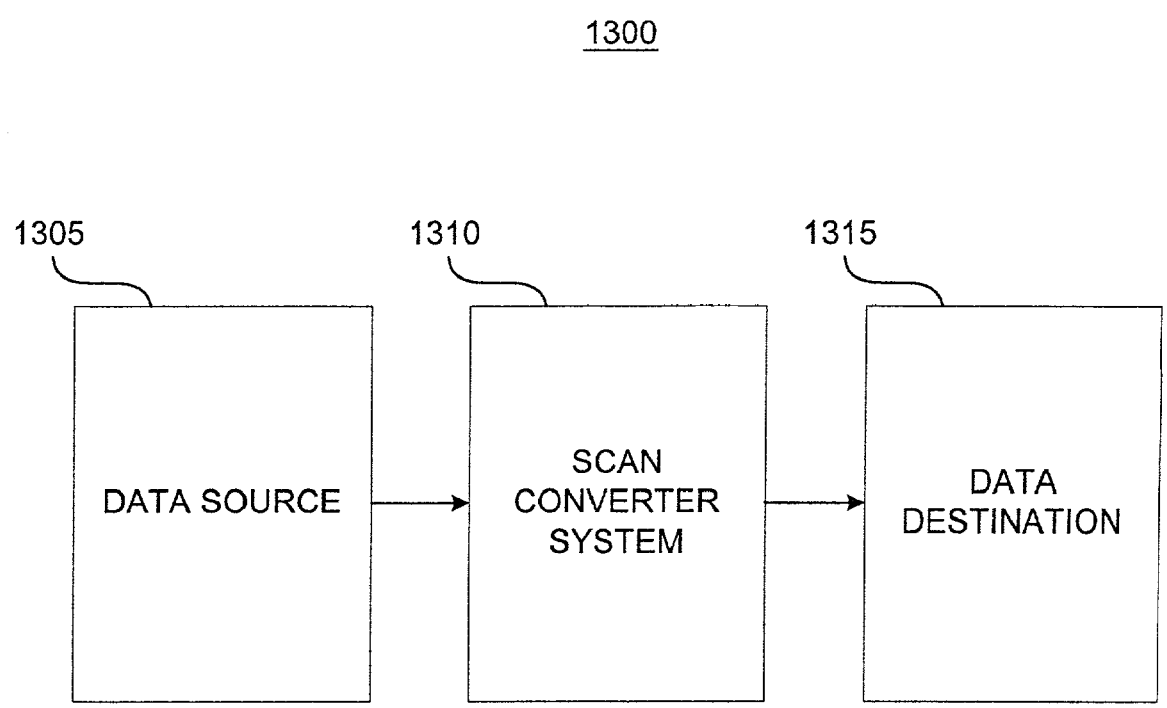
FIG. 13 is a block diagram of a data system according to the present invention.

FIG. 13 is a block diagram of a data system 1300. A data source 1305 provides data to a scan converter system 1310 in a first order. Scan converter system 1310 stores the data using a checkerboard buffer and buffer pages, as described above. Scan converter system 1310 retrieves the data in a second order and provides the retrieved data to a data destination 1315. For a video application, scan converter system 1310 can be used as a type of scan converter between data source 1305 and data destination 1315.

Data source 1305 can be a video source providing pixel data to scan converter system 1310 and data destination 1315 can be a display system. In this case, data source 1305 provides pixel data according to horizontal rows of pixels and data destination 1315 receives pixel data according to vertical columns of pixels, as described above. Scan converter system 1310 provides the conversion.

Data source 1305 can be implemented to provide pixel data according to various screen resolutions, such as an HD resolution of 1920×1080. While the discussion herein focuses on this HD resolution, alternative implementations can accommodate other resolutions. For an HD resolution signal, data source 1305 provides pixel data for a progressive signal (e.g., 1920×1080p). Data source 1305 can be implemented to receive an interlaced signal (e.g., 1920× 1080i) and provide a progressive signal, such as by merging interlaced fields using a de-interlacer. In an alternative implementation, data source 1305 provides an interlaced signal, providing pixel data for half the screen pixels (i.e., first field) and then pixel data for the other half (i.e., second field). In another implementation, data source 1305 provides pixel data using progressive segmented frames ("PSF," by Sony Corporation of Japan, Inc.).

Each pixel has 32 bits of pixel data. In one implementation, 11 bits are for red, 11 bits are for green, and 10 bits are for blue. Alternative implementations may have different allocations (e.g., 10 bits per color) or pixel depths (e.g., 8 or 24 bits per pixel). Where data source 1305 provides pixel data at 1920×1080p and 32 bits per pixel, the pixel rate is approximately 150 MP/S and the data rate from data source 1305 is approximately 600 MB/S. Accordingly, scan converter system 1310 stores pixel data from data source 1305 at a data rate of approximately 600 MB/S. To provide pixel data at a rate to support the same resolution, 1920×1080p, scan converter system 1310 outputs pixel data to data destination 1315 at a data rate of approximately 600 MB/S.

Data destination 1315 can be a GLV system. One color GLV system includes three GLV's: one for red, one for green, and one for blue. As described above, a GLV uses vertical columns of pixels to form an image (projecting one column at a time, typically left to right). In a color GLV system, each GLV projects a column of pixels (e.g., 1088 pixels, though only 1080 may have corresponding pixel data from the video data source) at a time. The three color columns are combined (such as using mirrors and lenses) to form a single apparent column on the viewing area (not shown in FIG. 13). Accordingly, it is advantageous for the GLV system to receive pixel data according to vertical columns of pixels, rather than horizontal rows. Scan converter system 1310 provides the pixel data to the GLV system corresponding to vertical columns of pixels. In alternative implementations, data destination 1315 can be some other video device that uses pixel data corresponding to vertical columns of pixels, such as a graphics card or a video image processor (e.g., for image transformations).

B. Illustrative Implementations of Checkerboard Buffers Using Buffer Pages

This section describes additional illustrative implementations of checkerboard buffers using buffer pages. However, the described implementations are illustrative and those skilled in the art will readily appreciate additional implementations are possible. The illustrative implementations are described in separate numbered and labeled sections. However, compatible aspects of the implementations can be combined in additional implementations.

1. Checkerboard Pixel Pages Using Two Memory Devices, 64 Pixel Pages By 128 Pixel Pages In one HD implementation, two memory devices are used for storing pixels. As described above, pixel data is stored and retrieved for two pixels at a time. Using two memory devices rather than one can provide increased memory bandwidth. In this implementation, one pixel page is 32×16 and has 512 pixels. Pixel data for half of the pixels in each pixel page is stored in each of the two memory devices. One frame has 8192 pixel pages, 64 horizontally by 128 vertically, though only 4080 pixel pages include valid screen pixels. As described below, allocating numbers of pixel pages horizontally and vertically that are powers of 2 is convenient for addressing using bit fields.

Figure 14:
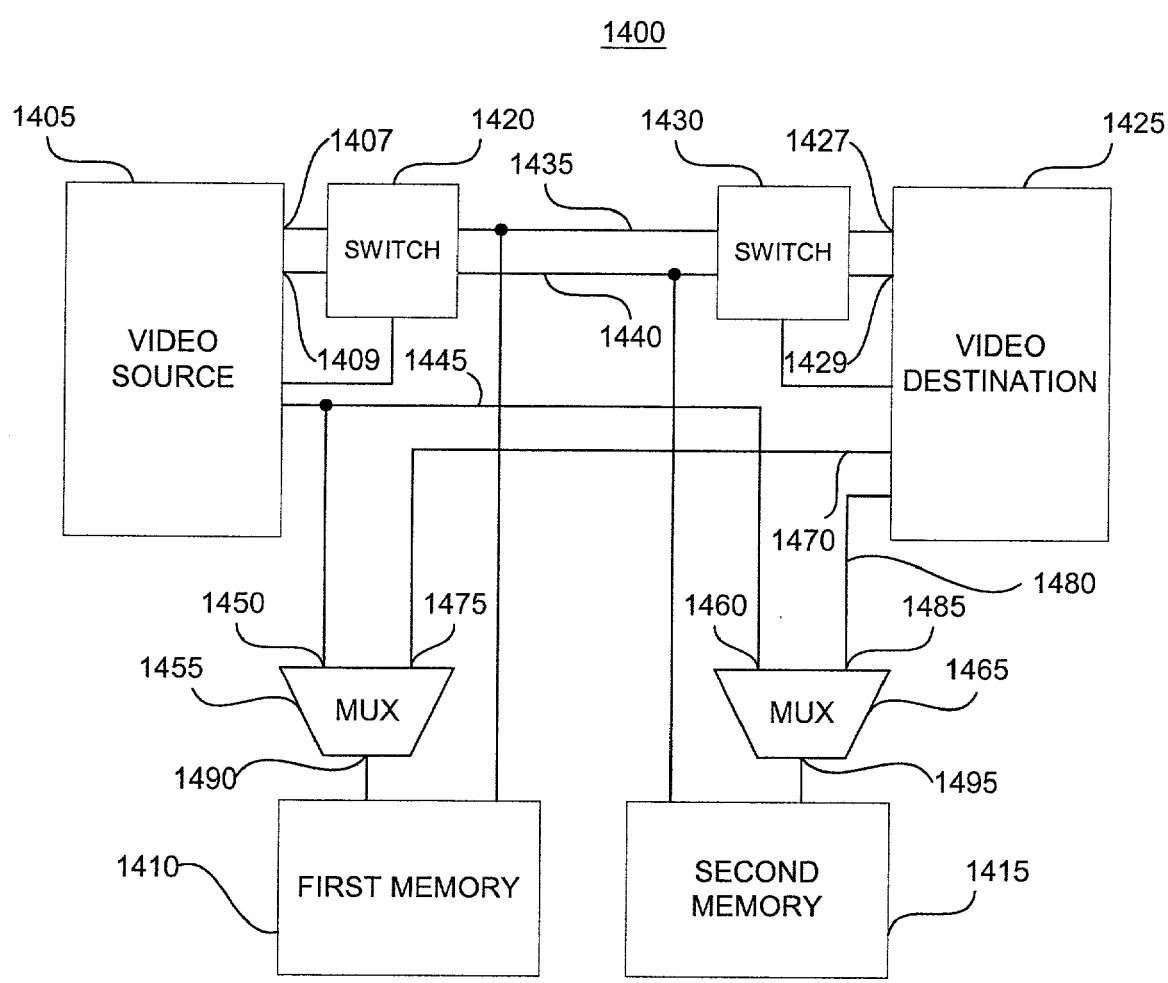
FIG. 14 is a block diagram of a switching dual pixel frame buffer architecture according to the present invention.

FIG. 14 is a block diagram of a switching dual pixel frame buffer architecture 1400 supporting the representation shown in FIG. 11. Architecture 1400 can implement scan converter system 1310 in FIG. 13. A video source 1405 provides pixel data to a first memory 1410 and to a second memory 1415 in parallel through a first data switch 1420. A video destination 1425 retrieves pixel data from first memory 1410 and from second memory 1415 in parallel through a second data switch 1430.

First memory 1410 and second memory 1415 are separate memory devices such as 32-bit wide 8MB SDRAM's (e.g., 2M×32 SDRAM MT48LC2M32B2 by Micron Technology, Inc.). The SDRAM is preferably fast enough to support the data rate needed for the screen resolution, such as 150 MHz or 166 MHz. Other types of memory can also be used, such as SGRAM (synchronous graphics RAM). Memories 1410 and 1415 each store half the pixel data of a particular frame, half for each row of pixels and half for each column of pixels. Furthermore, pixel data is stored according to pixel pages. In this implementation, pixel data for each pixel is stored in a separately addressable 32-bit memory location, 32 bits per pixel.

Data switches 1420 and 1430 switch connections to alternate properly between memories 1410 and 1415, as described below. A first memory data bus 1435 is connected to first data switch 1420, first memory 1410, and second data switch 1430. A second memory data bus 1440 is connected to first data switch 1420, second memory 1415, and second data switch 1430.

Video source 1405 receives video data from another source (not shown), such as data source 1305 in FIG. 13, a broadcast source, or a software application running on a computer system connected to video source 1405. Video source 1405 outputs pixel data for pixels two at a time, a first pixel at a first source data bus 1407 and a second pixel at a second source data bus 1409. First data switch 1420 has two states: providing the pixel data at first source data bus 1407 to first memory 1410 and the pixel data at second source data bus 1409 to second memory 1415; and providing the pixel data at first source data bus 1407 to second memory 1415 and the pixel data at second source data bus 1409 to first memory 1410. Video source 1405 provides a control signal to first data switch 1420 to control the state of first data switch 1420. This control signal can be based on the address provided by video source 1405 (such as bit 11 from a counter, as described below), or linked to the horizontal synchronization signal for the frame received by video source 1405. Video source 1405 includes a flip-flop (not shown) to toggle the state of first data switch 1420. For example, in one implementation, the horizontal synchronization signal toggles the flip-flop, which in turn toggles the state of first data switch 1420. In this way, the state of first data switch 1420 changes with each horizontal row of pixels. In another implementation, video source 1405 can provide all or part of the address to first data switch 1420 for state control.

Video destination 1425 provides pixel data to a display system, such as data destination 1315 in FIG. 13 implemented as a GLV system. Video destination 1425 receives pixel data for pixels two at a time, a first pixel at a first destination bus 1427 and a second pixel at a second destination bus 1429. Second data switch 1430 has two states: providing the pixel data from first memory 1410 to first destination bus 1427 and the pixel data from second memory 1415 to second destination bus 1429; and providing the pixel data from second memory 1415 to first destination bus 1427 and the pixel data from first memory 1410 to second destination bus 1429. Video destination 1425 provides a control signal to second data switch 1430 to control the state of second data switch 1430. This control signal can be based on the address provided by video destination 1425 (such as bit 0 from a counter, as described below). Video destination 1425 includes a flip-flop (not shown) to toggle the state of second data switch 1430. For example, in one implementation, a counter or an address bit toggles the flip-flop, which in turn toggles the state of second data switch 1430. In this way the state of second data switch 1430 changes with each vertical column of pixels. In another implementation, video destination 1425 can provide all or part of the address to second data switch 1430 for state control. In one implementation, video source 1405 and video destination 1425 include FIFO buffers, such as to avoid buffer overrun or underrun.

A source address bus 1445 is connected to video source 1405, a first input 1450 of a first address multiplexor 1455, and a first input 1460 of a second address multiplexor 1465. A first destination address bus 1470 is connected to video destination 1425 and a second input 1475 of first address multiplexor 1455. A second destination address bus 1480 is connected to video destination 1425 and a second input 1485 of second address multiplexor 1465. An output 1490 of first address multiplexor 1455 is connected to first memory 1410. An output 1495 of second address multiplexor 1465 is connected to second memory 1415. Accordingly, the same address is provided by video source 1405 to both first memory 1410 and second memory 1415 to store pixel data while different addresses are provided by video destination 1425 to first memory 1410 and second memory 1415 to retrieve data. Address multiplexors 1455 and 1465 receive control signals at control inputs (not shown) to control which input is connected to the output. Memories 1410 and 1415 also receive control signals at control inputs (not shown) to control whether memories 1410 and 1415 will read in data (write mode) or read out data (read mode). In addition, while clock lines are not shown in FIG. 14, architecture 1400 operates based on clock cycles so that pixel data can be processed for two pixels per clock cycle in support of the desired pixel rate. In alternative implementations, as described below, address generation and switching can be controlled by a memory controller.

Referring again to FIG. 9, for frame 905, video source 1405 would supply pixel data for horizontal pixel pairs at source data buses 1407 and 1409 in this sequence (first source data bus-second source data bus): 0-1, 2-3, . . . , 14-15, 16-17, 18-19, . . . , 254-255. Because of first data switch 1420, first memory 1410 would receive this sequence of pixel data: 0, 2, . . . , 14, 17, 19, . . . , 255. Second memory 1420 would receive this sequence: 1, 3, . . . , 15, 16, 18, . . . , 254. In contrast, for frame 905, first memory 1410 would provide pixel data for pixels in this sequence: 0, 32, 64, . . . , 224, 17, 49, . . . , 255. Second memory 1415 would provide pixel data for pixels in this sequence: 16, 32, 80, . . . , 240, 1, 33, . . . , 239. Because of second data switch 1430, video destination would receive pixel data for vertical pixel pairs at destination buses 1427 and 1429 in this sequence (first destination bus-second destination bus): 0-16, 32-48, 64-80, . . . , 224-240, 1-17, 33-49, . . . , 239-255.

Figure 15:
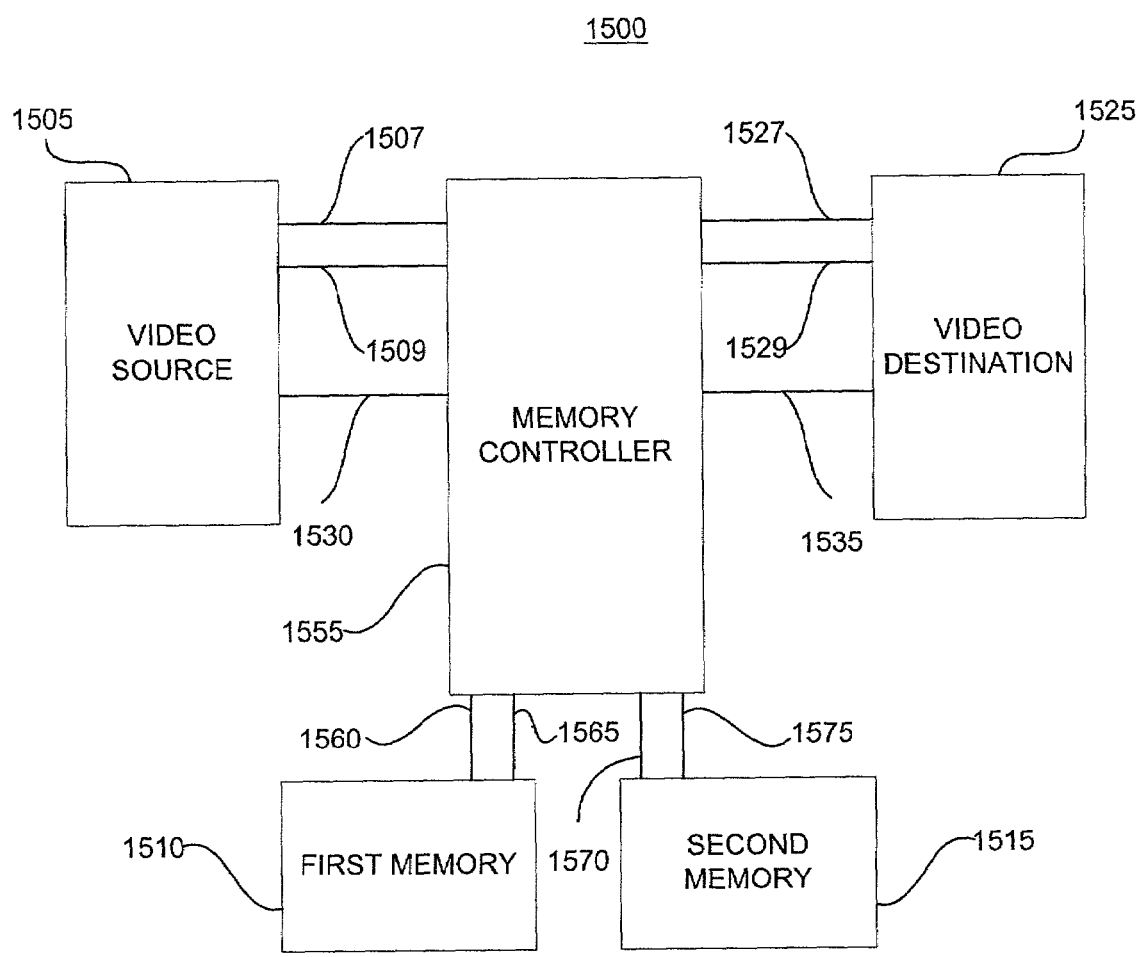
FIG. 15 is a block diagram of another implementation of a switching dual pixel frame buffer architecture according to the present invention.

FIG. 15 is a block diagram of another implementation of a switching dual pixel frame buffer architecture 1500. Architecture 1500 is similar to architecture 1400 of FIG. 14, but includes a memory controller 1555. Memory controller 1555 stores and retrieves pixel data using pixel pages and the checkerboard pattern described above. Memory controller 1555 provides data and addresses to memories 1510 and 1515 and so replaces address multiplexors 1455 and 1465 in FIG. 14. Memory controller 1555 also includes data switch functionality and so replaces data switches 1420 and 1430 in FIG. 14. Accordingly, memory controller 1555 has two states for storing data and two states for retrieving data. In a first state for storing data, memory controller 1555 provides pixel data from first source data bus 1507 to first memory 1510 and from second source data bus 1509 to second memory 1515. In a second state for storing data, memory controller 1555 provides pixel data from first source data bus 1507 to second memory 1515 and from second source data bus 1509 to first memory 1510. In a first state for retrieving data, memory controller 1555 provides pixel data from first memory 1510 to first destination data bus 1527 and from second memory 1515 to second destination data bus 1529. In a second state for retrieving data, memory controller 1555 provides pixel data from first memory 1510 to second destination data bus 1529 and from second memory 1515 to first destination data bus 1527. Memory controller 1555 changes states as described above for data switches 1420 and 1430 in FIG. 14 (i.e., changing state for storing data with each frame row and changing state for retrieving data with each frame column). Accordingly, memory controller 1555 receives pixel data from video source 1505 through data buses 1507 and 1509 to store in memories 1510 and 1515. Memory controller provides pixel data to video destination 1525 through data buses 1527 and 1529 retrieved from memories 1510 and 1515. Each data bus provides pixel data for one pixel at a time, as in architecture 1400 of FIG. 14. Memory controller 1555 receives signals from video source 1505 and video destination 1525 through control lines 1530 and 1535, respectively, such as indicating whether pixel data is to be stored to or retrieved from memories 1510 and 1515, or horizontal and vertical synchronization signals have been received (e.g., to indicate the end of a frame row of pixels or the end of a frame, respectively). In addition, memory controller 1555 generates addresses and supplies these addresses along with control signals to memories 1510 and 1515 through address buses 1565 and 1575, respectively. In an alternative implementation, separate address generators for storing and retrieving data provide addresses to memory controller 1555. When storing pixel data, memory controller 1555 provides pixel data to memories 15 10 and 1515 through data buses 1560 and 1570, respectively. When retrieving pixel data, memory controller 1555 receives pixel data from memories 1510 and 1515 through data buses 1560 and 1570, respectively. Accordingly, memory controller 1555 controls address generation and where pixel data for each pixel is sent. In one implementation, memory controller 1555 includes FIFO buffers, such as to avoid buffer overrun or underrun. As in architecture 1400 in FIG. 14, architecture 1500 operates based on clock cycles so that pixel data can be processed for two pixels per clock cycle in support of the desired pixel rate.

In operation, memories 1510 and 1515 read in or store complementary portions of a frame of pixels as pixel data from video source 1505 and output the pixel data to video destination 1525. Memory controller 1555 (or data switches 1420 and 1430 in FIG. 14) ensures the proper alternation of connections to memories 1510 and 1515 to provide the checkerboard pattern represented in FIG. 9. Memory controller 1555 (or video source 1405 and video destination 1425 in FIG. 14) controls address generation to map pixel data to memory locations according to a desired pixel page geometry. As described above, pixel data for a frame of pixels from video source 1505 is stored according to horizontal rows of pixels, and then the pixel data is retrieved according to vertical columns of pixels and provided to video destination 1525. After the pixel data for the entire frame has been retrieved, pixel data for the next frame is stored, and so on. Some pixel data for the next frame may be buffered, such as in video source 1505, while pixel data for the previous frame is being retrieved. As described below, in alternative implementations, the storage and retrieval can be interleaved or occur in parallel.

FIG. 16 is a table 1600, similar to table 1200 in FIG. 12, showing the relationships among a pixel, a frame row, a frame column, a pixel page, a pixel page row, a pixel page column, a memory page, a memory address, and a memory device for an HD resolution implementation (1920×1080) using pixel pages 1105 in FIG. 11. In FIG. 16, the pixel data for a frame is stored in two memory devices, each having 256 memory locations per memory page. In addition, FIG. 16 shows only a representative sample of pixels from a frame for clarity. As described above, an HD resolution frame has 2,073,600 pixels.

In table 1600, pixels, frame rows, frame columns, pixel pages, pixel page rows, pixel page columns, and memory pages are numbered in the same way as in table 1200. Column 1605 indicates the number of a pixel for which related information is shown in table 1600. Column 1610 indicates a frame row including the pixel in column 1605. Column 1615 indicates a frame column including the pixel in column 1605. Column 1620 indicates a pixel page including the pixel in column 1605. Column 1625 indicates a pixel page row including the pixel in column 1605. Column 1630 indicates a pixel page column including the pixel in column 1605. Column 1635 indicates a memory page storing pixel data for the pixel in column 1605. Column 1640 indicates a memory address of a memory location storing pixel data for the pixel in column 1605. Column 1645 indicates which memory device stores pixel data for the pixel in column 1605. The two memory devices are numbered 0 and 1. XXX indicates an invalid screen pixel, frame row, or frame column. Invalid screen pixels, frame rows, and frame columns are outside the dimensions of the screen resolution (e.g., frame rows beyond 1079 in HD resolution 1920× 1080). Memory locations are allocated for invalid screen pixels, frame rows, and frame columns in allocated pixel pages, but these memory locations are not used.

As described above, two pixels have pixel data stored at the same address in different devices. For example, the first pixel of a frame is pixel 0, in frame row 0 and frame column 0, in pixel page row 0 and pixel page column 0 of pixel page 0, stored at memory address 0 in memory page 0 of memory device 0. The second pixel of a frame (horizontally) is pixel 1, in frame row 0 and frame column 1, in pixel page row 0 and pixel page column 1 of pixel page 0, stored at memory address 0 in memory page 0 of memory device 1.

It is convenient to have the number of pixel pages in each row and in each column be a power of 2 so that addresses can be generated by merging bit fields from counters, however, some memory locations are not used. Some pixel pages at the end of each row of pixel pages do not include valid screen pixels. 64 pixel pages are allocated horizontally to the frame. Each pixel page is 32 pixels wide and so 64 pixel pages can include a row of 2048 pixels horizontally. However, an HD resolution frame is only 1920 pixels wide and so has valid screen pixels for 60 pixel pages, horizontally. As a result, four pixel pages at the end of each row of pixel pages do not include valid screen pixels. For example, pixel 30719 (i.e., the last pixel of the first row of pixel pages) is in pixel page 59 and pixel data for pixel 30719 is stored at address 15359. Pixel 30720 (i.e., the first pixel of the second row of pixel pages) is in pixel page 64 and pixel data for pixel 30720 is stored at address 16384. Pixel pages 60 through 63 do not include valid screen pixels and so memory pages 60 through 63 and corresponding addresses 15360 through 16383 are not used in each memory device.

Similarly, some pixel pages at the end of each column of pixel pages do not include valid screen pixels. 128 pixel pages are allocated vertically to the frame. Each pixel page is 16 pixels tall and so 128 pixel pages can include a column of 2048 pixels vertically. However, an HD resolution frame is only 1080 pixels tall and so has valid screen pixels for 67 pixel pages and 8 pixel page rows of a $68^{th}$ pixel page, vertically. As a result, eight pixel page rows in each of the pixel pages in the $68^{th}$ row of pixel pages (i.e., pixel pages 4288 through 4351) do not include valid screen pixels. For example, pixel 2073599 (i.e., the last pixel of the last frame row) is in pixel page row 7 of pixel page 4347 and pixel data for pixel 2073599 is stored at address 1112959. Pixel page rows 8 through 15 of pixel page 4347 do not include valid screen pixels. However, memory page 4347 includes 256 memory locations with addresses from 1112832 through 1113087. Addresses 1112960 through 1113087 are not used in each memory device. Furthermore, the remaining 60 rows of pixel pages do not include valid screen pixels. Accordingly, addresses 1114112 through 2097151 are not used.

Before describing the overall operation of storing pixel data to memories 1510 and 1515, it will be useful to describe examples of implementations of how source addresses are calculated for storing pixel data. Video source 1505 provides pixel data for a horizontal pixel pair to memory controller 1555. Memory controller 1555 stores pixel data for one of the pixels in first memory 1510 and pixel data for the other pixel in second memory 1515, alternating memories according to a checkerboard pattern. Pixel data for two pixels is stored in parallel in two memories using the same address. Referring to FIG. 12, pixel data for pixel 0 and pixel 1 would be stored at the same time at the same address in first memory 1510 and second memory 1515, respectively.

Memory controller 1555 generates one source address for storing pixel data for each horizontal pixel pair. In an HD resolution implementation, video source 1505 stores pixel data for pixels in this sequence, two pixels at a time: 0, 1, 2, 3, 4, 5, and so on. Referring to FIG. 16, memory controller 1555 generates addresses in the following sequence (one address for each pixel pair): 0, 1, . . . , 15, 256, 257, . . . , 271, 512, . . . , 15119, 16, 17, and so on. As described above, pixel data for pixels in different pixel pages is stored in different memory pages.

In one implementation, memory controller 1555 includes a pixel counter. Memory controller 1555 increments the counter by 1 for pixel data for each pixel received from video source 1505 on data buses 1507 and 1509. For example, for pixel 0, the counter is 0. For pixel 2, the counter is 2. Because pixel data for two pixels is stored in parallel, memory controller 1555 increments the pixel counter twice (or by 2) for each clock cycle. Alternatively, the pixel counter counts pixel pairs and so increments by one for each pixel pair. Memory controller 1555 also increments the counter at the end of each row to skip unused pixel pages. Memory controller 1555 generates an address for storing the pixel data by swapping the bit fields of the counter and outputs the address to memory address buses 1565 and 1575.

Figure 17:
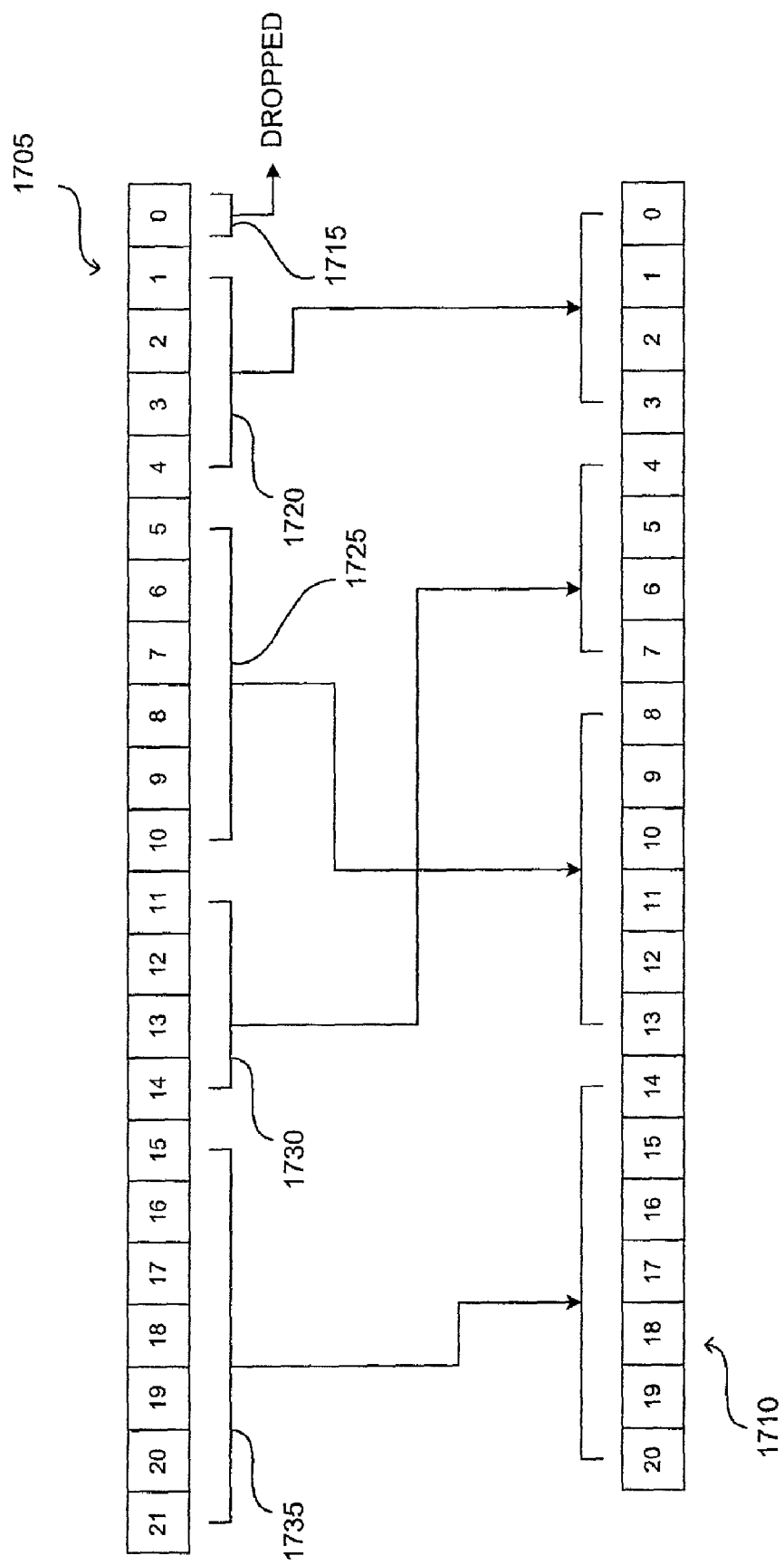
FIG. 17 is a representation of bits in a pixel counter in a memory controller according to the present invention.

FIG. 17 is a representation of bits in a pixel counter 1705 in memory controller 1555. The bits of counter 1705 are re-ordered to create an address 1710. Counter 1705 has 22 bits. Counter 1705 is incremented according to pixels in allocated pixel pages, rather than screen pixel numbers. As described above, 64 horizontal pixel pages (32 pixels wide) can include a row of 2048 pixels. Accordingly, pixel 1920 (i.e., the leftmost pixel in the second frame row from the top of the frame) is indicated by a value of 2048 in counter 1705. Similarly, pixel 3840 is indicated by a counter value of 4096.

The lower 11 bits of pixel counter 1705, numbered 0 through 10 in FIG. 17, indicate a frame column of pixels. The lower 11 bits are further subdivided into three fields: a device bit 1715 (bit 0), four horizontal pixel pair bits 1720 (bits 1 through 4), and six horizontal pixel page bits 1725 (bits 5 through 10). Device bit 1715 indicates one of the pixels of a pixel pair. Device bit 1715 is not used in address 1710 because the pixel data for the respective pixels of a pixel pair is stored at the same address in the respective memories. In an alternative implementation, the address includes device bit 1715 and memories 1510 and 1515 can ignore this bit of the address. However, device bit 1715 changes with each column and so can be used to control the state of memory controller 1555 for retrieving data, as described below. Horizontal pixel pair bits 1720 indicate one of 16 pixel pairs horizontally in a pixel page row of a pixel page. For example, pixels 0 and 1 are in pixel pair 0. Device bit 1715 and horizontal pixel pair bits 1720 in combination also indicate a pixel page column. Horizontal pixel page bits 1725 indicate one of 64 pixel pages horizontally. As described above, 64 pixel pages can include a row of 2048 pixels, horizontally (64*32), so some of the pixel pages will not include valid screen pixels and the corresponding memory pages are not used. When incrementing pixel counter 1705, memory controller 1555 increments pixel counter 1705 to pass over these unused spaces. For example, memory controller 1555 increments pixel counter 1705 from 1919 to 2048 at the end of the first frame row of pixels.

The upper 11 bits of pixel counter 1705, numbered 11 through 21, indicate a frame row of pixels. The upper 11 bits are further subdivided into two fields: four vertical pixel bits 1730 (bits 11 through 14), and seven vertical pixel page bits 1735 (bits 15 through 21). Vertical pixel bits 1730 indicate one of 16 pixels vertically in a pixel page column of a pixel page. Vertical pixel bits 1730 also indicate a pixel page row. Vertical pixel page bits 1735 indicate one of 128 pixel pages vertically. As described above, 128 pixel pages can include a column of 2048 pixels, vertically (128*16), so some of the pixel pages will not include valid screen pixels and the corresponding memory pages are not used. When incrementing pixel counter 1705, memory controller 1555 increments and sets pixel counter 1705 to pass over these unused spaces. For example, pixel counter 1705 resets to 0 after the last pixel of the frame, rather than incrementing through $2^{22}-1$. In addition, the lowest order bit of the upper eleven bits (i.e., bit 11) changes with each row and so can be used to control the state of memory controller 1555 for storing data, as described below.

To calculate address 1710 from pixel counter 1705, memory controller 1555 rearranges the bit fields of counter 1705 as shown in FIG. 17, such as in an address register separate from counter 1705. Memory controller 1555 drops device bit 1705. Horizontal pixel pair bits 1720 are shifted from positions 1–4 to positions 0–3. Horizontal pixel page bits 1725 are shifted from positions 5–10 to positions 8–13. Vertical pixel bits 1730 are shifted from positions 11–14 to positions 4–7. Vertical pixel page bits 1735 are shifted from positions 15–21 to positions 14–20. Address 1710 has 21 bits, enough bits to address all $2^{21}$ locations in a 32-bit wide 8 MB SDRAM. Furthermore, bits 0–7 of address 1710 form a column address and bits 8–20 form a page address for the SDRAM.

In alternative implementations, an address can be derived from a pixel counter. In one implementation, the address is mathematically derived from the counter value. In another implementation, the counter value is used as an index for a look-up-table of addresses.

Figure 18:
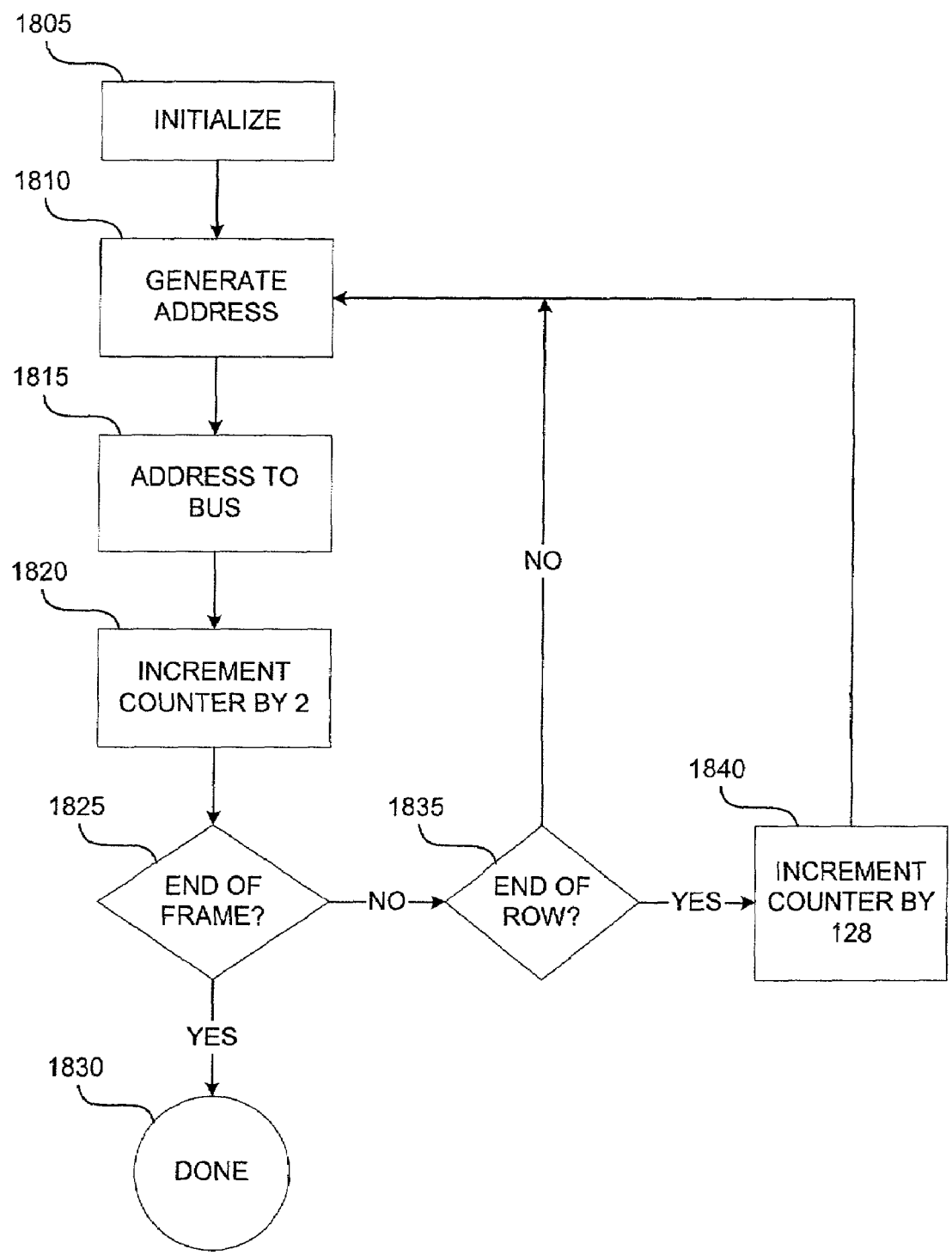
FIG. 18 is a flowchart of generating addresses for storing pixel data for a frame of pixels in an HD resolution implementation according to the present invention.

FIG. 18 is a flowchart of generating addresses for storing pixel data for a frame of pixels in an HD resolution implementation using architecture 1500 in FIG. 15. At the beginning of a frame, memory controller 1555 resets counter 1705 to 0, block 1805. Memory controller 1555 generates address 1710 as described above, block 1810. Memory controller 1555 provides address 1710 to memory address buses 1565 and 1575, block 1815. Memory controller 1555 increments counter 1705 by 2, block 1820. Memory controller 1555 compares the value of counter 1705 to a maximum frame value to check if the last pixel in the frame has been processed, block 1825. The maximum frame value depends on the implementation (e.g., 2211712 for pixel 2073599 in a 1920×1080 HD resolution frame). If the maximum frame value has been reached, address generation for the current frame is complete, block 1830. If the maximum frame value has not been reached, memory controller 1555 compares the value of the low order 11 bits of counter 1705 to a maximum column value (e.g., 1920) to check if the last pixel in a horizontal row has been processed, block 1835. If the maximum column value has been reached, memory controller 1555 increments counter 1705 by 128 (e.g., from 1920 to 2048), block 1840, and returns to block 1810. In an alternative implementation, memory controller 1555 increments the counter by 128 based on video source 1505 receiving a horizontal synchronization signal. If the maximum column value has not been reached, memory controller 1555 proceeds with block 1810. When storing pixel data for a new frame, memory controller 1555 starts generating addresses again beginning with block 1805.

Figure 19:
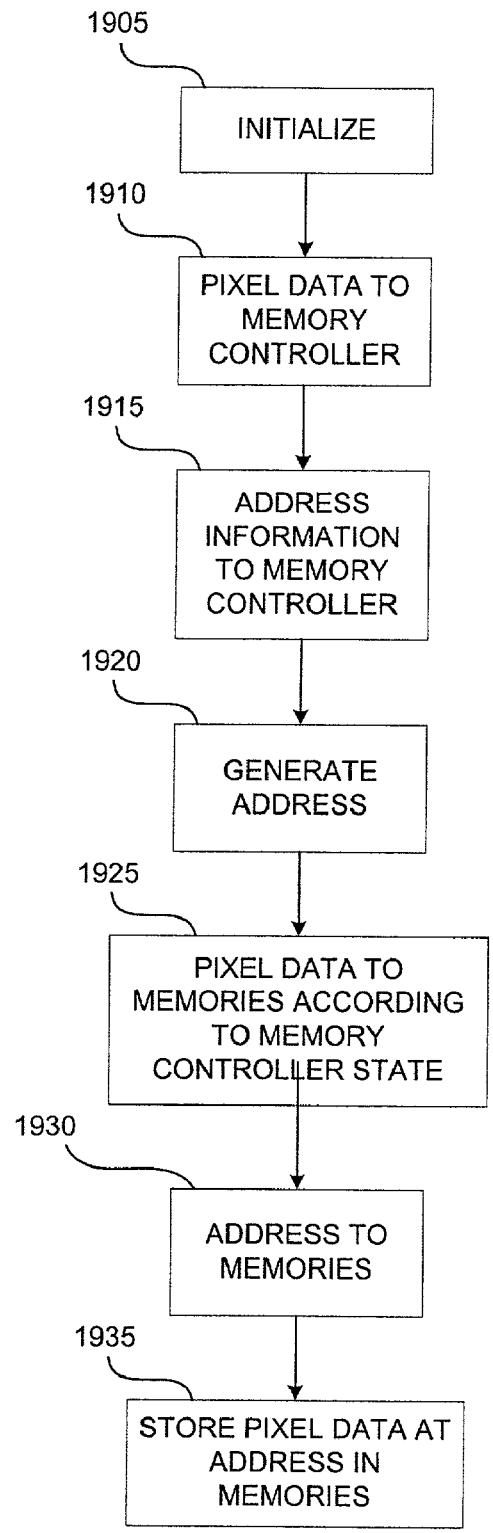
FIG. 19 is a flowchart of storing pixel data according to the present invention.

FIG. 19 is a flowchart of storing pixel data using architecture 1500 in FIG. 15. To store pixel data, memories 1510, 1515 are put in write mode and memory controller 1555 is set to provide pixel data from first source data bus 1507 to first memory 1510 and from second source data bus 1509 to second memory 1515, block 1905. Video source 1505 provides pixel data for a first pixel pair to memory controller 1555 through data buses 1507 and 1509, block 1910. Video source 1505 also provides address information to memory controller 1555 through control line 1530, block 1915. The address information indicates that memory controller 1555 is to store data to memories 1510, 1515. Alternatively, video source 1505 provides the address information to memory controller 1555 once at the beginning of storage, such as at block 1905. Memory controller 1555 generates the source address as described above to store the pixel data, block 1920. In alternative implementations, video source 1505 can generate the addresses for storing pixel data and pass the addresses to memory controller 1555.

Memory controller 1555 passes the data to memories 1510, 1515 according to the current state of memory controller 1555 for storing data, block 1925. As described above, in a first state, memory controller 1555 provides pixel data from first source data bus 1507 to first memory 1510 and from second source data bus 1509 to second memory 1515. In a second state, memory controller 1555 provides pixel data from first source data bus 1507 to second memory 1515 and from second source data bus 1509 to first memory 1510. Memory controller 1555 changes state for storing data when pixel data for a complete frame row of pixels has been stored, such as by using one of the address bits (e.g., bit 11 in counter 1705 in FIG. 17). In another implementation, memory controller uses the counter value or a flip-flop connected to memory controller 1555 toggled by video source 1505 based on the horizontal synchronization signal to change states.

Memory controller 1555 provides the address to memories 1510, 1515 through memory address buses 1565, 1575, respectively, block 1930. Memories 1510, 1515 store the pixel data on memory data buses 1560, 1570, respectively, at the addresses on memory address buses 1565, 1575, respectively, block 1935. To store pixel data for the next pixel, video source 1505 returns to block 1910, or to block 1905 to restore the state of architecture 1500 for storage.

Before describing the overall operation of retrieving pixel data from memories 1510 and 1515, it will be useful to describe examples of implementations of how destination addresses are calculated for retrieving pixel data. Address generation for retrieving pixel data is similar to address generation for storing pixel data, as described above, however pixel data is retrieved corresponding to the vertical order of pixels. Memory controller 1555 retrieves pixel data for two pixels in a vertical pixel pair using two addresses, one address for first memory 1510 and one for second memory 1515. Accordingly, the sequence of pixels and corresponding addresses is different, but the correspondence between a pixel and the location storing the pixel data for that pixel is the same.

In an HD resolution implementation, video destination 1525 retrieves pixel data for pixels in this sequence, two pixels at a time: 0-1920, 3840-5760, ..., 26880-28800, 30720-32640, ..., 2069760-2071680, 1-1921, 3841-5761, and so on. Memory controller 1555 generates a destination address for each pixel and provides the addresses to memories 1510, 1515. Referring to FIG. 15, memory controller 1555 generates addresses in the following sequence: 0-16, 32-48, ..., 224-240, 16384-16400, ..., 0-16, 32-48, ..., 1-17, 33-49, and so on. The same sequence of addresses can be used for two frame columns of pixels, however, which memory receives which address changes with each frame column. In the frame first column, first memory 1510 receives the first address in the pair of addresses, and in the second frame column, first memory 1510 receives the second address. For example, for the first vertical pixel pair in the first frame column, first memory 1510 receives address 0 (pixel 0) and second memory 1515 receives address 16 (pixel 1920). For the first vertical pixel pair in the second frame column, first memory 1510 receives address 16 (pixel 1921) and second memory 1515 receives address 0 (pixel 1).

As described above, in one implementation, memory controller 1555 includes a pixel counter. Memory controller 1555 can use the same 22-bit counter 1705 and generate address 1710 from counter 1705 as described above referring to FIG. 17. Accordingly, address 1710 can be used as a source address (i.e., storing pixel data) or a destination address (i.e., retrieving pixel data) as appropriate. Alternatively, memory controller 1555 includes two counters 1705, using one for generating source addresses and one for generating destination addresses. Memory controller 1555 increments counter 1705 by 2048 for pixel data for each pixel to be retrieved from memory 1510. For example, for pixel 0, the counter is 0. For pixel 3840, the counter is 4096. Memory controller 1555 also increments the counter at the end of each frame column to skip unused pixel pages. Memory controller 1555 can increment the upper 11 bits (i.e., bits 11–21) and the lower 11 bits (i.e., bits 0–10) of counter 1705 separately to provide a row counter and a column counter. Alternatively, counter 1705 can be divided into two separate 11-bit counters. Incrementing the row counter by 1 (the upper 11 bits of counter 1705) is the same as incrementing counter 1705 by 2048. Incrementing the column counter (the lower 11 bits of counter 1705) by 1 is the same as incrementing counter 1705 by 1.

As described above, pixel data for two pixels is retrieved at the same time. Memory controller 1555 generates two addresses based on counter 1705. The first address is address 1710, as described above. The second address is 16 greater than the first address. Memory controller 1555 uses these two addresses to retrieve pixel data for a vertical pixel pair but provides one address to each memory. Memory controller 1555 alternates which memory receives which of the first and second addresses with each column, such as based on the state for retrieving data of memory controller 1555 or the lowest order bit of counter 1705. Memory controller 1555 also alternates the order to supply pixel data to video destination with each column, such as by using the same bit of column 1705.

Figure 20:
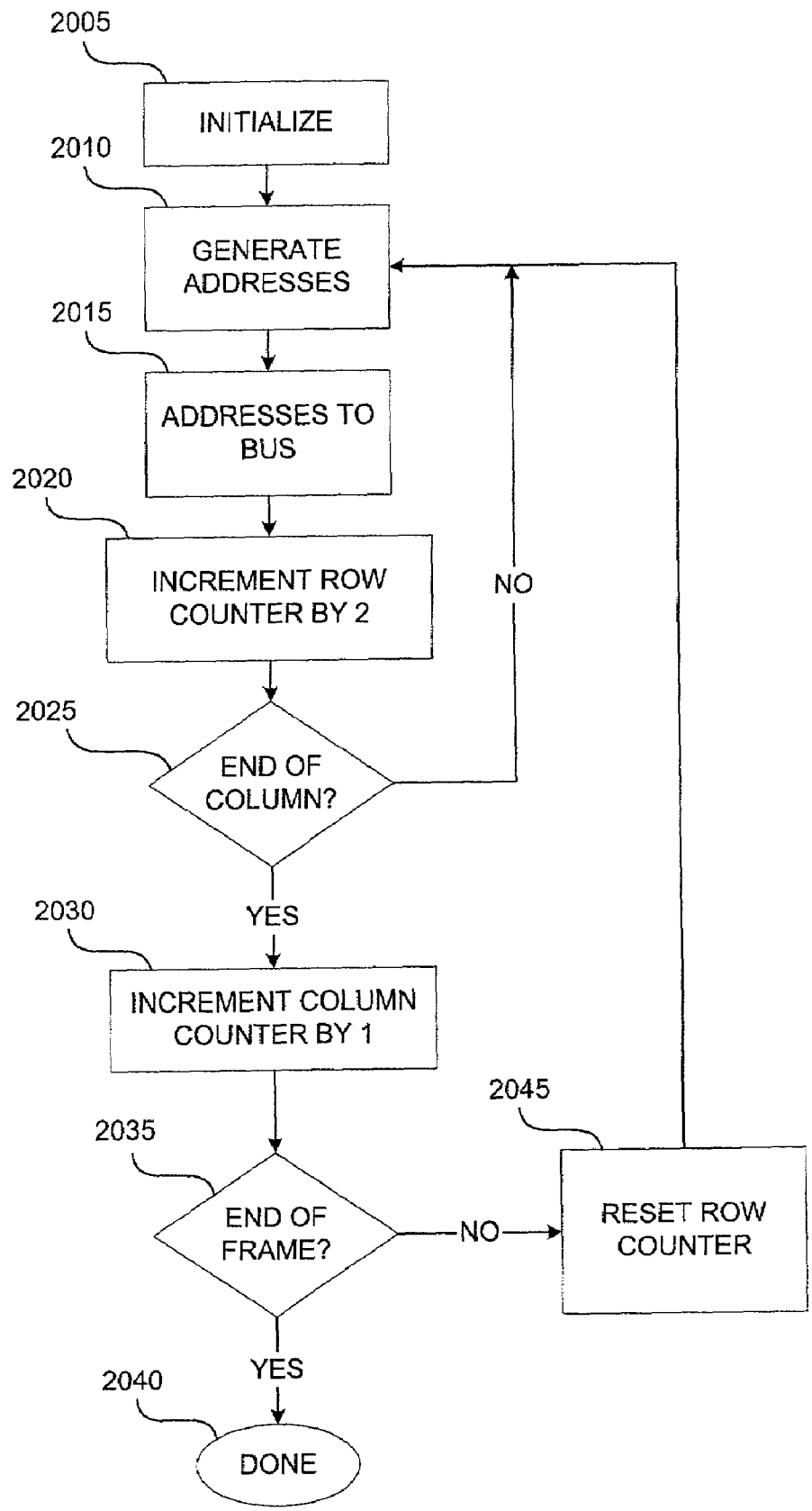
FIG. 20 is a flowchart of generating addresses for retrieving pixel data for a frame of pixels in an HD resolution implementation according to the present invention.

FIG. 20 is a flowchart of generating addresses for retrieving pixel data for a frame of pixels in an HD resolution implementation using architecture 1500 in FIG. 15. At the beginning of a frame, memory controller 1555 resets counter 1705 to 0, block 2005. Memory controller 1555 generates two destination addresses, block 2010. The first destination address is generated in the same way as address 1710, as described above. The second destination address is 16 greater than the first destination address, such as by adding 16 to the first destination address. Memory controller 1555 provides the destination addresses to memories 1510, 1515 through memory address buses 1565, 1575, block 2015. Memory controller 1555 uses the current state for retrieving data to control which address to provide to which memory 1510, 1515. For the first frame column, where memory controller 1555 provides pixel data from first memory 1510 to first destination bus 1527 and pixel data from second memory 1515 to second destination bus 1529, memory controller 1555 provides the first destination address to first memory 1510 and the second destination address to second memory 1515. For the next frame column, where memory controller 1555 provides pixel data from first memory 1510 to second destination bus 1529 and pixel data from second memory 1515 to first destination bus 1527, memory controller 1555 provides the second destination address to first memory 1510 and the first destination address to second memory 1515. Memory controller 1555 continues to alternate in this way with each frame column. In one implementation, memory controller 1555 uses the lowest order bit of counter 1705 (i.e., bit 0) to control this alternation. Bit 0 changes with each frame column and so indicates for which of two frame columns pixel data is being retrieved. For example, when bit 0 is 0, such as in the first frame column, memory controller 1555 provides the first destination address to first memory 1510 and the second destination address to second memory 1515. When bit 0 is 1, such as in the second frame column, memory controller 1555 provides the second destination address to first memory 1510 and the first destination address to second memory 1515.

Memory controller 1555 increments the row counter of counter 1705 by 2, block 2020. Alternatively, memory controller 1555 increments counter 1705 by 4096. Memory controller 1555 compares the value of the row counter to a maximum row value (e.g., 1080) to check if the end of the vertical frame column has been reached, block 2025. If the row counter is less than the maximum row value, memory controller 1555 proceeds to block 2010. If the row counter is greater than or equal to the maximum row value, memory controller 1555 increments the column counter of counter 1705 by 1, block 2030. Memory controller 1555 compares the value of the column counter to a maximum column value (e.g., 1920) to check if the end of the frame has been reached, block 2035. If the maximum column value has been reached, address generation for the current frame is complete, block 2040. If the maximum column value has not been reached, memory controller 1555 resets the row counter to 0, block 2045, and proceeds to block 2010. When retrieving pixel data for a new frame, memory controller 1555 starts generating addresses again beginning with block 2005.

Figure 21:
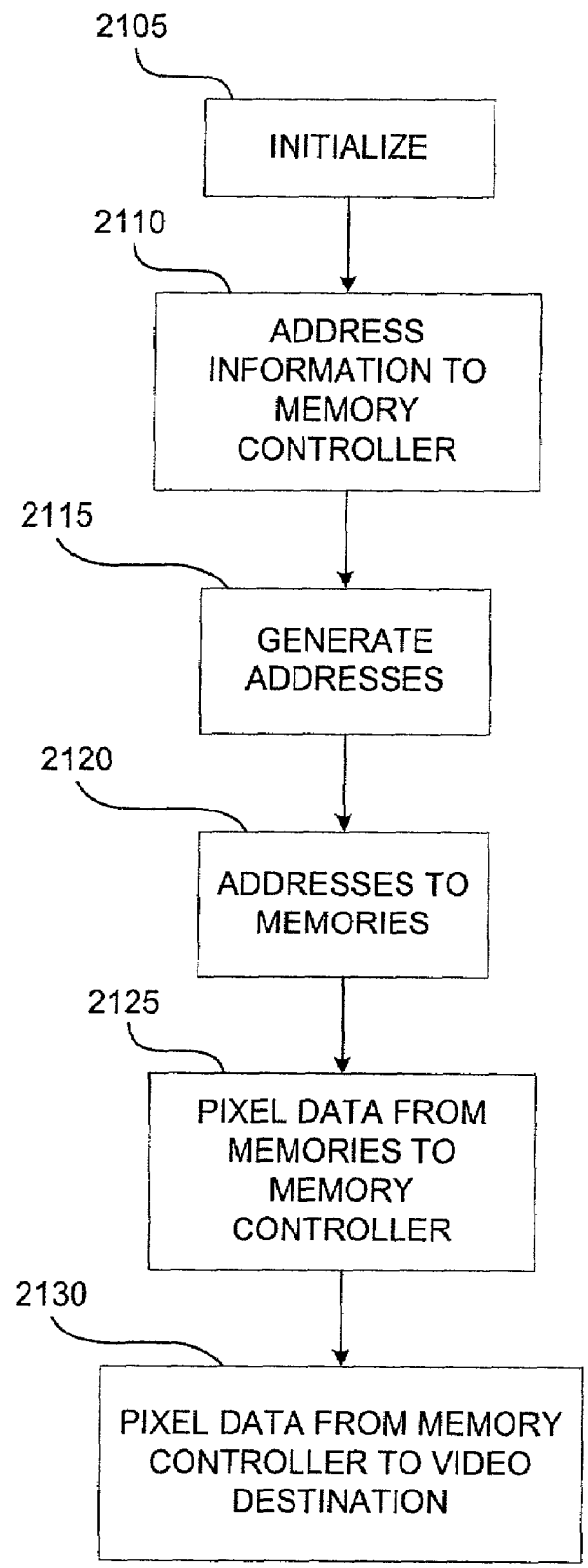
FIG. 21 is a flowchart of retrieving pixel data according to the present invention.

FIG. 21 is a flowchart of retrieving pixel data. To retrieve pixel data, memories 1510, 1515 are put in read mode and memory controller 1555 is set to provide pixel data from first memory 1510 to first destination bus 1527 and from second memory 1515 to second destination bus 1529, block 2105. Video destination 1525 provides address information to memory controller 1555 through control line 1535, block 2110. The address information indicates that memory controller 1555 is to read data from memories 1510, 1515. Alternatively, video destination 1525 provides the address information to memory controller 1555 once at the beginning of retrieval, such as at block 2105. Memory controller 1555 generates the destination addresses as described above to retrieve the pixel data, block 2115. In alternative implementations, video destination 1525 can generate the addresses for retrieving pixel data and pass the addresses to memory controller 1555.

Memory controller 1555 provides the destination addresses to memories 1510, 1515 through memory address buses 1565, 1575, respectively, as described above, block 2120. Memories 1510, 1515 provide the pixel data stored at the addresses on memory address buses 1565, 1575, respectively, to memory controller 1555 through memory data buses 1560, 1570, block 2125.

Memory controller 1555 passes the pixel data to video destination 1525 through first destination bus 1527 and second destination bus 1529 according to the current state of memory controller 1555 for retrieving data, block 2130. As described above, in a first state, memory controller 1555 provides pixel data from first memory 1510 to first destination bus 1527 and from second memory 1515 to second destination bus 1529. In a second state, memory controller 1555 provides pixel data from first memory 1510 to second destination bus 1529 and from second memory 1515 to first destination bus 1527. Memory controller 1555 changes state for retrieving data when pixel data for a complete frame column of pixels has been retrieved, such as by using one of the address bits (e.g., bit 0 in counter 1705 in FIG. 17). In another implementation, memory controller uses the counter value to change states. To retrieve pixel data for the next pixel, video destination returns to block 2110, or to block 2105 to restore the state of architecture 1500 for retrieval.

2. Checkerboard Pixel Pages Using Two Memory Devices, 60 Pixel Pages By 68 Pixel Pages In another HD implementation using two memory devices, one frame has 4080 pixel pages, 60 horizontally by 68 vertically. One pixel page is 32×16 and has 512 pixels. Pixel data is stored and retrieved for two pixels at a time. 4080 pixel pages can include 2,088,960 pixels, which is close to the 2,073,600 pixels in an HD resolution of 1920× 1080. This allocation of pixel pages conserves memory use.

The structure and operation of this implementation is similar to architecture 1400 in FIG. 14 or architecture 1500 in FIG. 15, as described above, however, address generation is different. In implementations for different screen resolutions, a number of pixel pages can be allocated to match the number of pixels in each frame row and column. For example, for resolution 1280×720, 3600 pixel pages can be allocated (40 horizontally, 45 vertically; 32×16 pixel pages).

FIG. 22 is a table 2200, similar to table 1600 in FIG. 16, showing the relationships among a pixel, a frame row, a frame column, a pixel page, a pixel page row, a pixel page column, a memory page, a memory address, and a memory device for an HD resolution implementation (1920×1080) using pixel pages 1105 in FIG. 11. In FIG. 22, the pixel data for a frame is stored in two memory devices, each having 256 memory locations per memory page. In addition, FIG. 22 shows only a representative sample of pixels from a frame for clarity. As described above, an HD resolution frame has 2,073,600 pixels.

In table 2200, pixels, frame rows, frame columns, pixel pages, pixel page rows, pixel page columns, and memory pages are numbered in the same way as in table 1200. Column 2205 indicates the number of a pixel for which related information is shown in table 2200. Column 2210 indicates a frame row including the pixel in column 2205. Column 2215 indicates a frame column including the pixel in column 2205. Column 2220 indicates a pixel page including the pixel in column 2205. Column 2225 indicates a pixel page row including the pixel in column 2205. Column 2230 indicates a pixel page column including the pixel in column 2205. Column 2235 indicates a memory page storing pixel data for the pixel in column 2205. Column 2240 indicates a memory address of a memory location storing pixel data for the pixel in column 2205. Column 2245 indicates which memory device stores pixel data for the pixel in column 2205. XXX indicates an invalid screen pixel, frame row, or frame column. Invalid screen pixels, frame rows, and frame columns are outside the dimensions of the screen resolution (e.g., frame rows beyond 1079 in HD resolution 1920× 1080). Memory locations are allocated for invalid screen pixels, frame rows, and frame columns in allocated pixel pages, but these memory locations are not used.

As shown in table 2200, pixel 30720 (i.e., the first pixel of the 17$^{th}$ frame row) is in pixel page 60, while in table 1600 pixel 30720 is in pixel page 64. Pixel data for pixel 30720 is stored at address 15360, while in table 1600 pixel data for pixel 30720 is stored at address 16384. As described above, when 64 pixel pages are allocated horizontally, addresses 15360 through 16383 are not used. When 60 pixel pages are allocated horizontally, as in this implementation, these addresses are used. A similar pattern applies to each horizontal row of pixel pages. Accordingly, allocating 60 pixel pages horizontally uses less memory than allocating 64 pixel pages. A similar savings occurs by allocating 68 pixel pages vertically rather than 128 pixel pages. However, as described above, eight pixel page rows in each of the pixel pages in the 68$^{th}$ row of pixel pages do not include valid screen pixels.

Because memory addresses are used differently in this implementation, address generation is different from that described above referring to FIGS. 17, 18, and 20. Memory controller 1555 uses a pixel counter and several state variables to generate an address. Storing and retrieving pixel data is similar to that described above referring to FIGS. 19 and 21, respectively. Pixel data is again stored according to horizontal rows of pixels and retrieved according to vertical columns of pixels. Accordingly, pixel data for the same sequences of pixels is stored and retrieved as those described above. The sequences of addresses are different.

Figure 23:
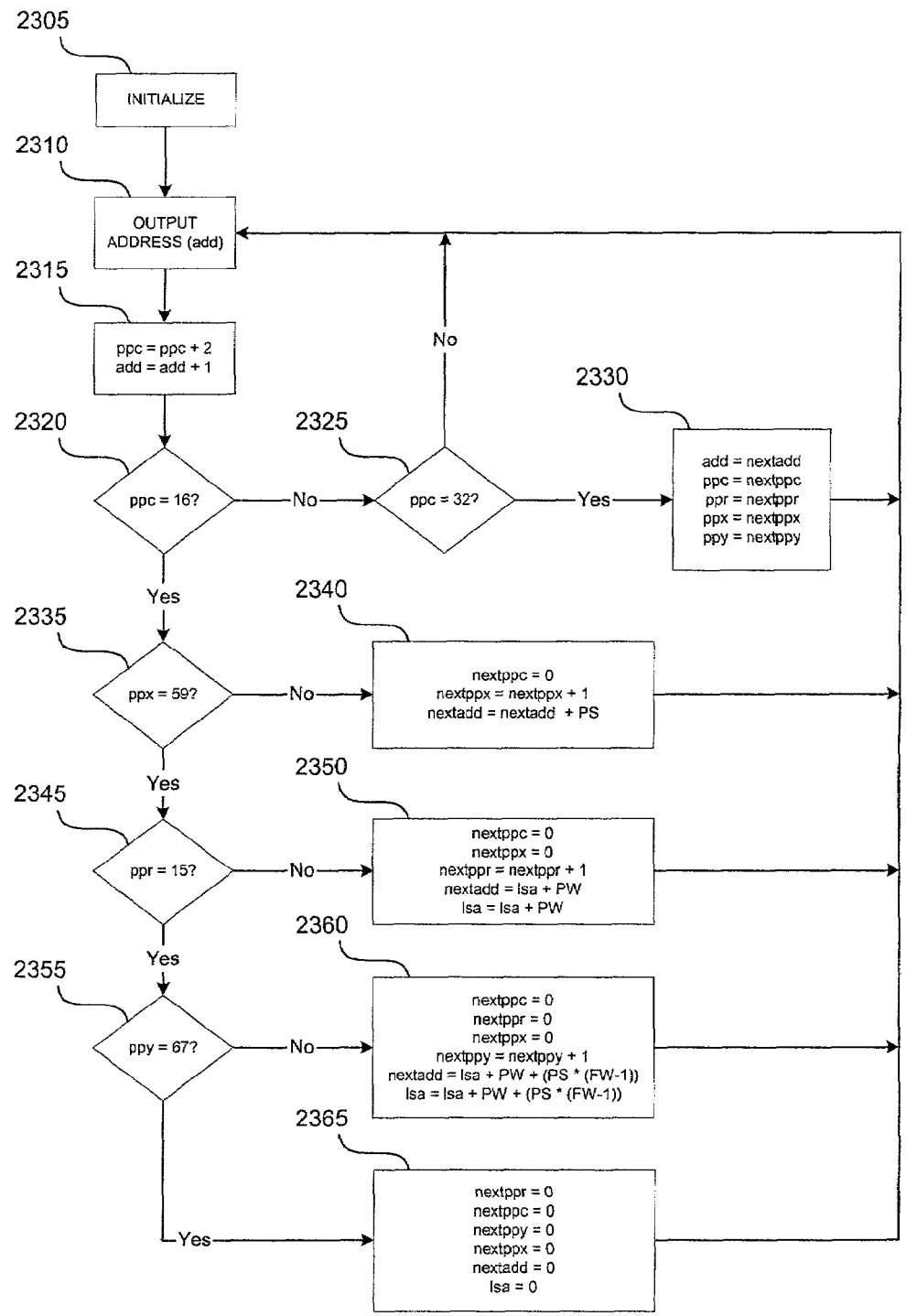
FIG. 23 is a flowchart of generating source addresses for storing pixel data according to the present invention.

FIG. 23 is a flowchart of generating source addresses for storing pixel data. One implementation uses architecture 1500 and allocates 60 pixel pages horizontally and 68 pixel pages vertically. Several counter variables are shown in FIG. 23. These counter variables can be values stored in memory or separate counters. "add" is the address generated and output at block 2310. "ppc" counts pixel page columns.

"ppr" counts pixel page rows. "ppx" counts pixel pages horizontally. "ppy" counts pixel pages vertically. "nextadd," "nextppc," "nextppr," "nextppx," "nextppy" are holding variables for assignment. "lsa" holds the left side address for the beginning of a frame row, i.e., the address to start from when generating addresses at the beginning of a row of pixels. Three constants are also shown in FIG. 23. "FW" is the frame width, indicating the number of pixel pages allocated horizontally. FW is 60 in this implementation. "PW" is the page width, indicating the number of memory locations in each memory device allocated to pixels in one pixel page row. PW is 16 in this implementation. "PS" is the page size, indicating the number of memory locations in each memory device allocated to pixels in a pixel page. PS is 256 in this implementation.

At the beginning of storing pixel data for a frame, memory controller 1555 resets the variables add, ppc, ppr, ppx, ppy, nextadd, nextppc, nextppr, nextppx, nextppy, and lsa to 0, block 2305. FW, PW, and PS do not change from frame to frame. Memory controller 1555 outputs the value of add as the address, block 2310. Memory controller 1555 increments ppc by 2 and increments add by 1, block 2315. Memory controller 1555 increments ppc by 2 because pixel data for two horizontally neighboring pixels is stored in parallel. Memory controller 1555 compares ppc with 16, block 2320. 16 is used because each pixel page is 32 pixels wide and so 16 is the horizontal middle of the pixel page. In some implementations, the amount of time required to perform some of the calculations in FIG. 23 may be more than the a pixel time, and so using 16 as a branching point allows more time for some calculations to complete. Accordingly, processing may move from one block to another in FIG. 23 before the calculation shown in a block has completed. Alternatively, a value other than the horizontal middle of the pixel page can be used.

If ppc does not equal 16, memory controller 1555 checks if the end of a pixel page has been reached by comparing ppc with 32, block 2325. If ppc does not equal 32, the end of the pixel page has not been reached, and memory controller 1555 proceeds to block 231 0. If ppc equals 32, the end of the pixel page has been reached. Memory controller 1555 prepares for the next pixel page by assigning counter variables the values of corresponding holding variables, block 2330, and proceeds to block 2310. In one implementation, in block 2330 memory controller 1555 also checks if the last pixel page in the row of pixel pages has been reached by comparing ppx with 59. If ppx equals 59, the last pixel page in the row of pixel pages has been reached and, because ppc equals 32, the last pixel in the frame row of pixels has been processed so memory controller 1555 changes states for storing data. As described above, in a first state, memory controller 1555 provides pixel data from first source data bus 1507 to first memory 1510 and from second source data bus 1509 to second memory 1515. In a second state, memory controller 1555 provides pixel data from first source data bus 1507 to second memory 1515 and from second source data bus 1509 to first memory 1510. Memory controller 1555 changes state for storing data when pixel data for a complete frame row of pixels has been stored, such as in block 2330 when ppx equals 59 or upon receiving a horizontal synchronization signal from video source 1505. In an alternative implementation, memory controller 1555 changes state as described above referring to FIG. 19.

Returning to block 2320, if ppc equals 16, memory controller 1555 checks if the last pixel page in the row of pixel pages has been reached by comparing ppx with 59, block 2335. If ppx does not equal 59, the last pixel page in the row has not been reached. Memory controller 1555 prepares holding variables for the end of the pixel page row (to be used in block 2330), block 2340, and proceeds to block 2310.

If ppx equals 59, the last pixel page in the row has been reached, and memory controller 1555 checks if the last pixel page row in the pixel page has been reached by comparing ppr with 15, block 2345. If ppr does not equal 15, the last pixel page row has not been reached. Memory controller 1555 prepares holding variables for the end of the pixel page row (to be used in block 2330), block 2350, and proceeds to block 2310.

If ppr equals 15, the last pixel page row has been reached, and memory controller 1555 checks if the last pixel page in the column of pixel pages has been reached by comparing ppy with 67, block 2355. If ppy does not equal 67, the last pixel page in the column has not been reached. Memory controller 1555 prepares holding variables for the end of the pixel page row (to be used in block 2330), block 2360, and proceeds to block 2310. If ppy equals 67, the last pixel page in the column has been reached. Memory controller 1555 prepares holding variables for the end of the pixel page row (to be used in block 2330), block 2365, and proceeds to block 2310. FIG. 23 shows a continuous loop and so memory controller 1555 continues to follow FIG. 23 from frame to frame for storing pixel data. If memory controller 1555 needs to re-start address generation for storing pixel data, such as to re-initialize the state of address generation, memory controller 1555 starts generating addresses again beginning with block 2305.

Figure 24:
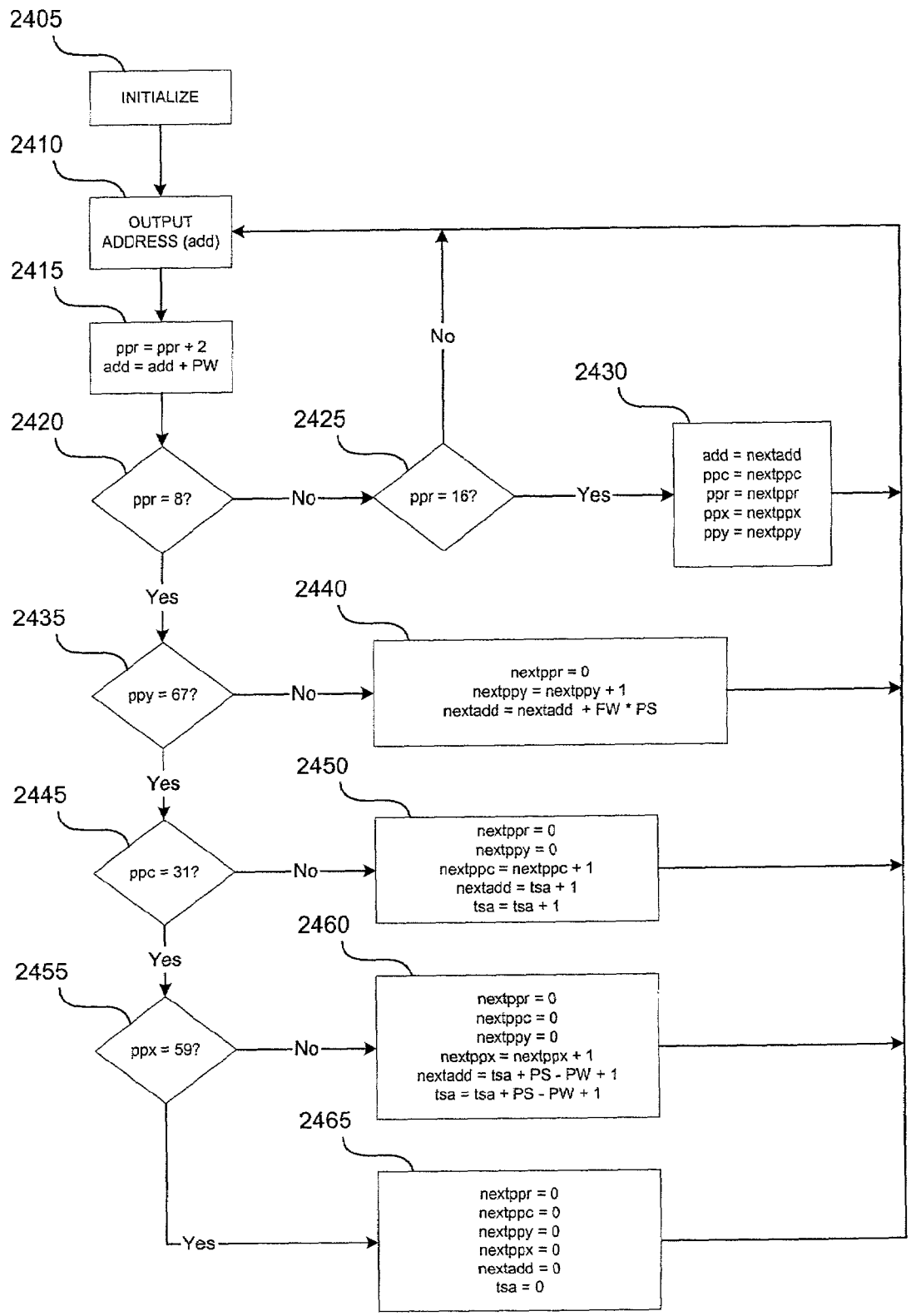
FIG. 24 is a flowchart of generating destination addresses for retrieving pixel data according to the present invention.

FIG. 24 is a flowchart of generating destination addresses for retrieving pixel data. One implementation uses architecture 1500 and allocates 60 pixel pages horizontally and 68 pixel pages vertically. As in FIG. 23, several variables and constants are shown in FIG. 24. "add" is the address generated and output at block 2410. "ppc" counts pixel page columns. "ppr" counts pixel page rows. "ppx" counts pixel pages horizontally. "ppy" counts pixel pages vertically. "nextadd," "nextppc," "nextppr," "nextppx," "nextppy" are holding variables for assignment. "tsa" holds the top side address for the beginning of a frame column, i.e., the address to start from when generating addresses at the beginning of a column of pixels. "FW" is the frame width, indicating the number of pixel pages allocated horizontally. FW is 60 in this implementation. "PW" is the page width, indicating the number of memory locations in each memory device allocated to pixels in one pixel page row. PW is 16 in this implementation. "PS" is the page size, indicating the number of memory locations in each memory device allocated to pixels in a pixel page. PS is 256 in this implementation.

At the beginning of retrieving pixel data for a frame, memory controller 1555 resets the variables add, ppc, ppr, ppx, ppy, nextadd, nextppc, nextppr, nextppx, nextppy, and tsa to 0, block 2405. FW, PW, and PS do not change from frame to frame. Memory controller 1555 outputs the value of add as the address, block 2410. Memory controller 1555 increments ppr by 2 and add by PW, block 2415. Similar to FIG. 23, memory controller 1555 increments ppr by 2 because pixel data for two vertically neighboring pixels is retrieved in parallel. Memory controller 1555 compares ppr with 8, block 2420. 8 is used because each pixel page is 16 pixels tall and so 8 is the vertical middle of the pixel page. As described above referring to FIG. 23, using 8 as a branching point allows more time for some calculations to complete.

If ppr does not equal 8, memory controller 1555 checks if the end of a pixel page has been reached by comparing ppr with 16, block 2425. If ppr does not equal 16, the end of the pixel page has not been reached, and memory controller 1555 proceeds to block 2410. If ppr equals 16, the end of the pixel page has been reached. Memory controller 1555 prepares for the next pixel page by assigning counter variables the values of corresponding holding variables, block 2430, and proceeds to block 2410. In one implementation, in block 2430 memory controller 1555 also checks if the last pixel page in the column of pixel pages has been reached by comparing ppy with 67. If ppy equals 67, the last pixel page in the column of pixel pages has been reached and, because ppr equals 16, the last pixel in the frame column of pixels has been processed so memory controller 1555 changes states for retrieving data. As described above, in a first state, memory controller 1555 provides pixel data from first memory 1510 to first destination bus 1527 and from second memory 1515 to second destination bus 1529. In a second state, memory controller 1555 provides pixel data from first memory 1510 to second destination bus 1529 and from second memory to first destination bus 1527. Memory controller 1555 changes state for retrieving data when pixel data for a complete frame column of pixels has been retrieved, such as in block 2430 when ppy equals 67. In an alternative implementation, memory controller 1555 changes state as described above referring to FIG. 21.

Returning to block 2420, if ppr equals 8, memory controller 1555 checks if the last pixel page in the column of pixel pages has been reached by comparing ppy with 67, block 2435. If ppy does not equal 67, the last pixel page in the column has not been reached. Memory controller 1555 prepares holding variables for the end of the pixel page column (to be used in block 2430), block 2440, and proceeds to block 2410.

If ppy equals 67, the last pixel page in the column has been reached, and memory controller 1555 checks if the last pixel page column in the pixel page has been reached by comparing ppc with 31, block 2445. If ppc does not equal 31, the last pixel page column has not been reached. Memory controller 1555 prepares holding variables for the end of the pixel page column (to be used in block 2430), block 2450, and proceeds to block 2410.

If ppc equals 31, the last pixel page column has been reached, and memory controller 1555 checks if the last pixel page in the row of pixel pages has been reached by comparing ppx with 59, block 2455. If ppx does not equal 59, the last pixel page in the row has not been reached. Memory controller 1555 prepares holding variables for the end of the pixel page column (to be used in block 2430), block 2460, and proceeds to block 2410. If ppx equals 59, the last pixel page in the row has been reached. Memory controller 1555 prepares holding variables for the end of the pixel page column (to be used in block 2430), block 2465, and proceeds to block 2410. Similar to FIG. 23, FIG. 24 shows a continuous loop and so memory controller 1555 continues to follow FIG. 24 from frame to frame for retrieving pixel data. If memory controller 1555 needs to re-start address generation for retrieving pixel data, such as to re-initialize the state of address generation, memory controller 1555 starts generating addresses again beginning with block 2405.

In alternative implementations, addresses generation for storing and retrieving pixel data can be different from that described above. For example, blocks 2320 and 2325 in FIG. 23 could be combined into a multi-branch block with outgoing paths depending on the value of ppc: one for ppc=16, one for ppc=32, and one for other values of ppc. In any case, the address generation used accommodates the storage pattern created by the pixel pages and the sequences for storing and retrieving data described above.

3. Checkerboard Pixel Pages Using Four Memory Devices and Memory Bank Alternation Increasing from one memory device to two memory devices in a frame buffer can provide an improvement in memory bandwidth. Similarly, increasing from the two memory devices of architecture 1500 in FIG. 15 to four memory devices can provide a further increase in bandwidth. Furthermore, by dividing four memory devices into two banks of two memory devices each, pixel data can be stored and retrieved in parallel. Pixel data can be stored in one bank of memory devices and, during the same clock cycle, pixel data can be retrieved from the other bank.

Figure 25:
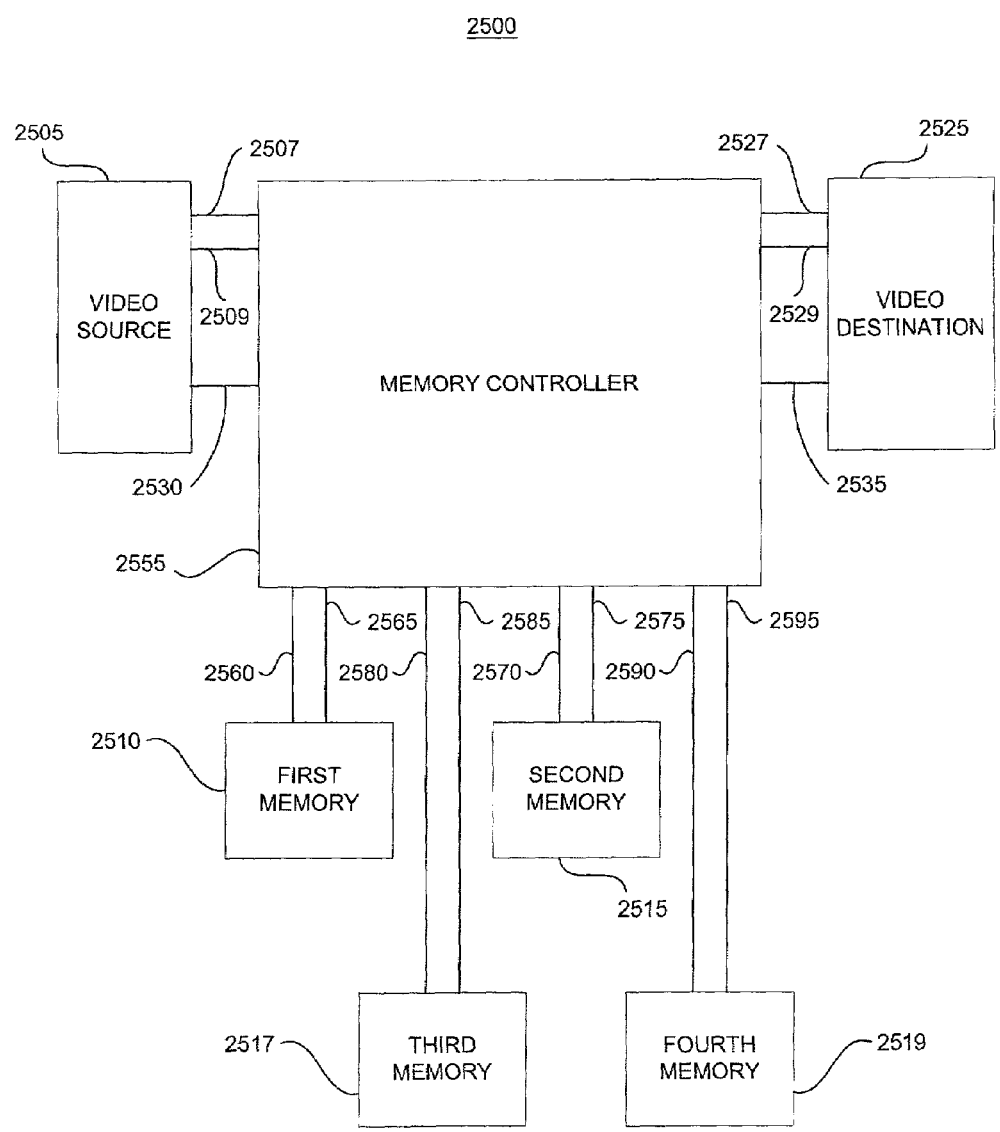
FIG. 25 is a block diagram of a dual pixel frame buffer architecture having four memory devices according to the present invention.

FIG. 25 is a block diagram of a dual pixel frame buffer architecture 2500 having four memory devices: first memory 2510, second memory 2515, third memory 2517, and fourth memory 2519. The memory devices are used in two alternating banks for storing and retrieving pixel data a frame at a time. Pixel data can be stored and retrieved as described above referring to using two memory devices. Pixel pages can be allocated according to a power of 2 or to conserve memory space. Accordingly, the operation of storing and retrieving pixel data is similar to that described above for a two memory device implementation, however, the storing and retrieving occurs in parallel using respective memory banks.

For example, a first frame of pixel data is stored, two pixels at a time, in first memory 2510 and second memory 2515, as described above. A second frame of pixel data is then stored in third memory 2517 and fourth memory 2519. While the second frame is being stored, the first frame of pixel data is retrieved from first memory 2510 and second memory 2515, two pixels at a time, as described above. Accordingly, pixel data for the first frame is retrieved at the same time pixel data for the second frame is stored (i.e., during the same clock cycle). During every clock cycle, pixel data for one frame is stored and pixel data previously stored is retrieved. For the next frames, the memory banks are switched. The third frame of pixel data is stored in first memory 2510 and second memory 2515, while the second frame of pixel data is retrieved from third memory 2517 and fourth memory 2519. This alternation between memory banks continues as long as frames are supplied to video source 2505. Because of the increased memory size and simultaneous storage and retrieval, an HD resolution implementation of architecture 2500 using four 32-bit wide 8 MB SDRAM's can be implemented allocating 64 pixel pages horizontally and 128 pixel pages vertically to each frame in each memory and without internally dividing each of the memory devices into sections, as described below referring to FIG. 28.

Architecture 2500 is similar to architecture 1500 in FIG. 15. In architecture 2500, memory controller 2555 controls address generation and routing pixel data to and from memories 2510, 2515, 2517, and 2519 in parallel. Architecture 2500 also has additional memory data buses 2580, 2590 and memory address buses 2585, 2595. Memory controller 2555 has two states for bank alternation (in addition to states for storing and retrieving data, as described above): (A) connecting data buses 2507 and 2509 to memories 2510 and 2515, respectively, and data buses 2527 and 2529 to memories 2517 and 2519, respectively; and (B) connecting data buses 2507 and 2509 to memories 2517 and 2519, respectively, and data buses 2527 and 2529 to memories 2510 and 2515, respectively. Accordingly, in state A while memory data buses 2560 and 2570 are providing pixel data to be stored to first memory 2510 and second memory 2515, respectively, memory data buses 2580 and 2590 are providing pixel data retrieved from third memory 2517 and fourth memory 2519, respectively. Conversely, in state B while memory data buses 2560 and 2570 are providing pixel data retrieved from first memory 2510 and second memory 2515, respectively, memory data buses 2580 and 2590 are providing pixel data to be stored to third memory 2517 and fourth memory 2519, respectively. Memory controller 2555 receives a control signal to switch between states, such as from video source 2505 on control line 2530. Video source 2505 toggles the control signal after completing storing pixel data for a frame. In one implementation, memory controller 2555 is connected to a flip-flop that is triggered by a vertical synchronization signal supplied by video source 2505. In addition, while clock lines are not shown in FIG. 25, architecture 2500 operates based on clock cycles so that pixel data can be processed for four pixels per clock cycle in support of the desired pixel rate. In an alternative implementation, separate address generators for storing and retrieving data provide addresses to memory controller 2555. In another alternative implementation, a separate memory controller is provided for and connected to each bank of memory devices and generates addresses for the connected memory devices.

Figure 26:
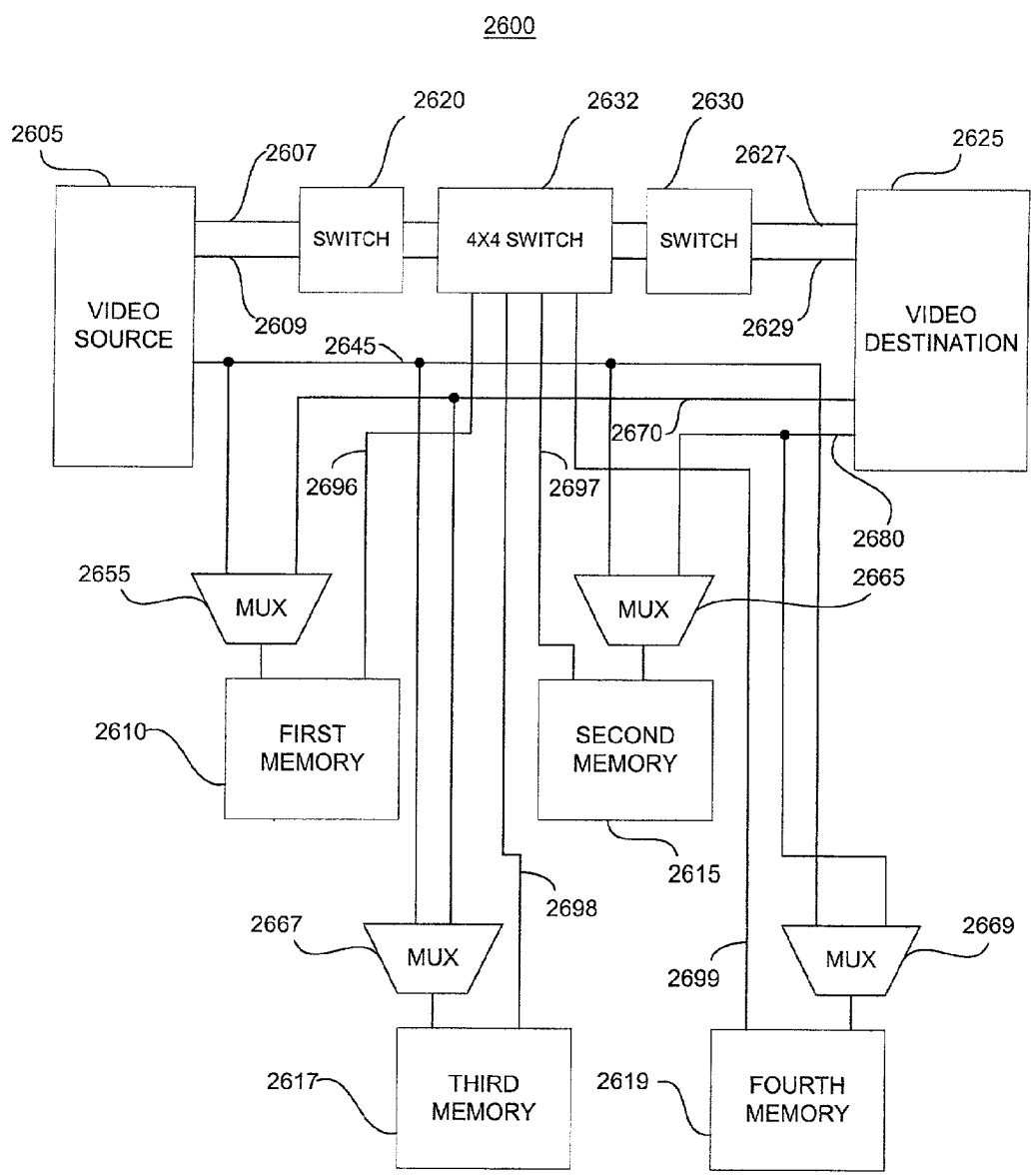
FIG. 26 is a block diagram of a frame buffer architecture including a 4×4 data switch, two data switches, and four address multiplexors according to the present invention.

In an alternative implementation, memory controller 2555 is replaced by address multiplexors and a data switch. FIG. 26 is a block diagram of a frame buffer architecture 2600 including a 4×4 data switch 2632, two data switches 2620, 2630, and four address multiplexors 2655, 2665, 2667, and 2669. Architecture 2600 operates similarly to architecture 2500, however, address generation is controlled by video source 2605 and video destination 2625 for storing and retrieving pixel data, respectively, and data switching is controlled by switches 2620, 2630. Architectures 2500 and 2600 are related similarly to how architectures 1400 and 1500 of FIGS. 14 and 15, respectively, are related. In another implementation, a pair of memory controllers can be used to replace pairs of address multiplexors 2655, 2665 and 2667, 2669.

Addresses are generated by video source 2605 and video destination 2625 and passed to memories 2610, 2615, 2617, 2619 through address multiplexors 2655, 2665, 2667, and 2669, respectively. Address multiplexors 2655, 2665, 2667, and 2669 receive control signals to select an input, such as from video source 2605.

4×4 data switch 2632 controls routing pixel data among video source 2605, memories 2610, 2615, 2617, 2619, and video destination 2625. 4×4 switch 2632 is connected to memories 2610, 2615, 2617, and 2619 by memory buses 2696, 2697, 2698, and 2699, respectively. 4×4 data switch 2632 has states A and B for bank alternation, as described above for memory controller 2555: (A) connecting data buses 2607 and 2609 to memories 2610 and 2615, respectively, and data buses 2627 and 2629 to memories 2617 and 2619, respectively; and (B) connecting data buses 2607 and 2609 to memories 2617 and 2619, respectively, and data buses 2627 and 2629 to memories 2610 and 2615, respectively. 4×4 switch 2632 receives a control signal (not shown) to switch between states, such as from video source 2605. States A and B can also be used to control the input selection of address multiplexors 2655, 2665, 2667, and 2669.

Figure 27:
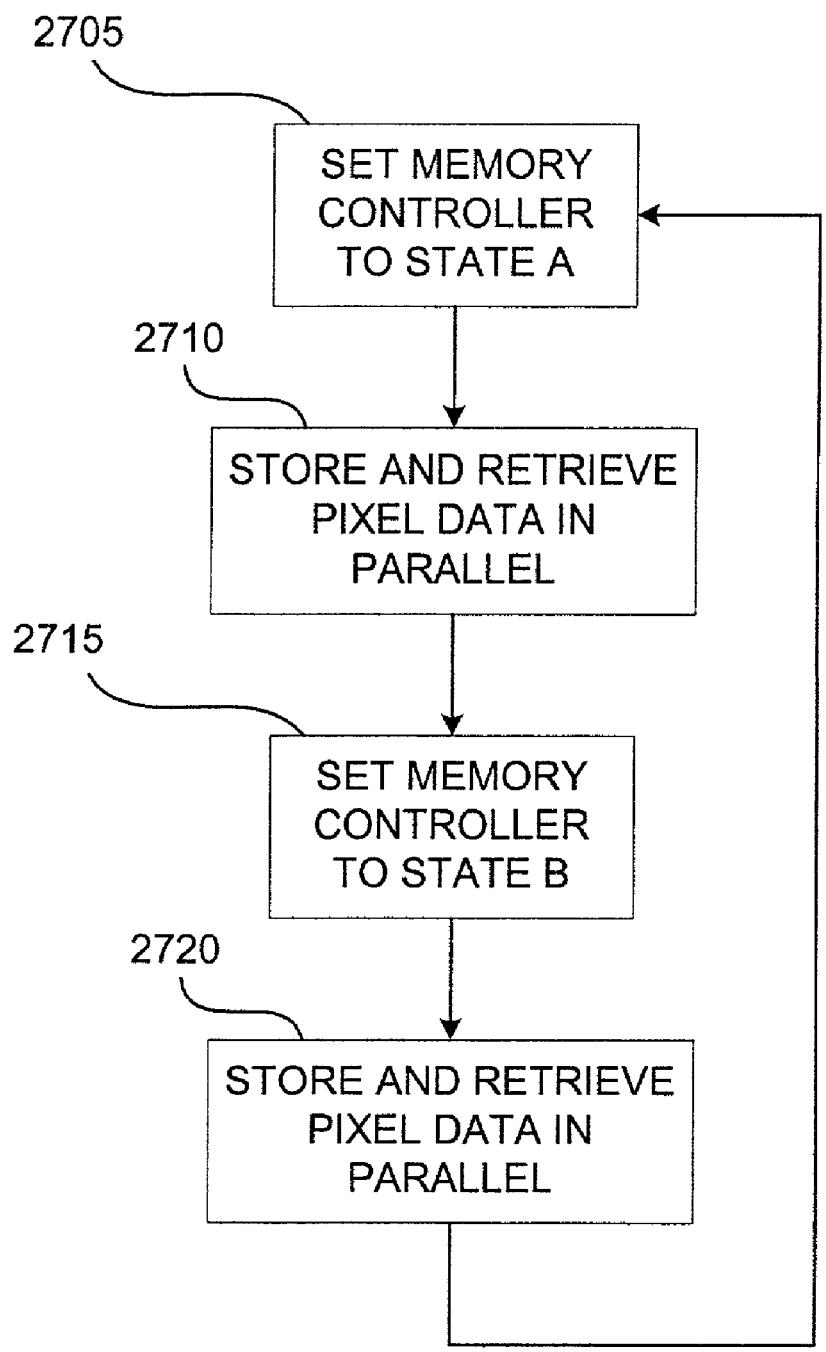
FIG. 27 is a flowchart of storing and retrieving pixel data in parallel using bank alternation according to the present invention.

FIG. 27 is a flowchart of storing and retrieving pixel data in parallel using bank alternation, such as in architecture 2500 of FIG. 25. When a first frame of pixel data becomes available to video source 2505, video source 2505 sets memory controller 2555 to state A (pixel data to be stored to first memory 2510 and second memory 2515, pixel data to be retrieved from third memory 2517 and fourth memory 2519), block 2705. Memory controller 2555 stores the first frame of pixel data, two pixels at a time, in first memory 2510 and second memory 2515, as described above, and memory controller 2555 retrieves pixel data from third memory 2517 and fourth memory 2519, as described above, block 2710. Initially, pixel data has not been stored in memories 2517 and 2519, and so pixel data retrieved during the first loop may not produce a desirable image. After a frame of pixel data has been stored, video source 2505 sets memory controller 2555 to state B (pixel data to be retrieved from first memory 2510 and second memory 2515, pixel data to be stored to third memory 2517 and fourth memory 2519), block 2715. Memory controller 2555 stores a frame of pixel data and retrieves pixel data for another frame according to the state of memory controller 2555, as described above, block 2720. After a frame of pixel data has been stored, video source 2505 returns to block 2705 and sets memory controller 2555 to state A. When a new frame is not available to video source 2505, storing and retrieving pixels from architecture 2500 is complete. When a new frame later becomes available, video source 2505 begins at block 2705 again.

4. Checkerboard Pixel Pages Using Memory Sections

In another implementation, the memory address space is divided into two sections. This division applies to each memory device. As described above referring to double-buffering, one section of each memory is used for storing pixel data and the other section for retrieving pixel data. The sections switch roles with each frame. The operation of architecture 1500 of FIG. 15 modified to use memory sections is described below, through other architectures can also use memory sections as described below, such as architecture 1400 of FIG. 14.

Memories 1510 and 1515 each store pixel data for complementary halves of two frames at a time. Memories 1510 and 1515 are divided in half. For example, where memories 1510 and 1515 are 32-bit wide 8 MB SDRAM's, a first section of addresses (0 through 1,048,575) is for one frame and a second section of addresses (1,048,576 through 2,097,151) is for another frame. As described above, in HD resolution, half of one frame has 1,036,800 pixels and so a 32-bit wide 8 MB SDRAM is sufficiently large for half of each of two frames. However, where 8192 32×16 pixel pages are allocated to each frame (64×128 pixel pages for the frame), half of each of two frames does not fit into a 32-bit 8 MB SDRAM, and so either less pixel pages would be allocated, such as 4080 (60×68), or a larger memory (e.g., 16 MB) would be required.

While one frame is being stored in one section, another frame is being retrieved from the other section, such as in alternating series of read and write operations. After processing these frames has completed, pixel data for a new frame is read into the section storing the frame just read out, and pixel data for the frame just stored is read out. In this way, the sections alternate between reading and writing. To generate addresses for storing pixels, memory controller 1555 alternates between beginning at address 0 and the middle of the available address space (e.g., 1,048,576) with each frame to alternate between the two sections of memory. Similarly, memory controller 1555 alternates between starting at address 0 and the middle of the available address space with each frame to be retrieved.

In addition, pixel data can be stored and retrieved in alternation for blocks of pixels smaller than an entire frame. For example, in one implementation, memory controller 1555 includes two FIFO buffers: a source FIFO buffer for pixel data to be stored, and a destination FIFO buffer for pixel data retrieved. As memory controller 1555 receives pixel data from video source 1505, memory controller 1555 fills its source FIFO buffer. At regular intervals, such as when the FIFO buffer is full or after pixel data for a number of pixels has been placed in the FIFO buffer, memory controller 1555 stores pixel data for a block of pixels from its FIFO buffer, such as the first 32 pixels in the FIFO buffer, generating appropriate addresses for a series of write operations. After this block has been stored, memory controller 1555 retrieves pixel data for a block of pixels, such as 32 pixels, generating appropriate addresses for a series of read operations from memories 1510 and 1515, and stores the pixel data in its destination FIFO buffer. At regular intervals, such as when the FIFO buffer is full or after pixel data for a number of pixels has been placed in the FIFO buffer, memory controller 1555 provides pixel data from the destination FIFO buffer to video destination 1525. After retrieving the block of pixel data, memory controller 1555 stores the next block of pixel data, and so on. Memory controller 1555 preserves the counter values for address generation between blocks to accommodate this block-based processing.

In another implementation, video source 1505 and video destination 1525 control use of memory sections. Video source 1505 and video destination 1525 each include a FIFO buffer. As video source 1505 receives pixel data, video source 1505 fills its FIFO buffer. At regular intervals, such as when the FIFO buffer is full or after pixel data for a number of pixels has been placed in the FIFO buffer, video source 1505 causes pixel data for a block of pixels from its FIFO buffer, such as the first 32 pixels in the FIFO buffer, to be stored and memory controller 1555 generates the appropriate addresses for a series of write operations. After this block has been stored video source 1505 passes control to video destination 1525. Video destination 1525 causes memory controller 1555 to generate addresses, retrieves pixel data for a block of pixels, such as 32 pixels, in a series of read operations from memories 1510 and 1515, and stores the pixel data in its own FIFO buffer. Video destination 1525 then passes control back to video source 1505, and so on. Memory controller 1555 preserves the counter values for address generation between blocks to accommodate this block-based processing.

Figure 28:
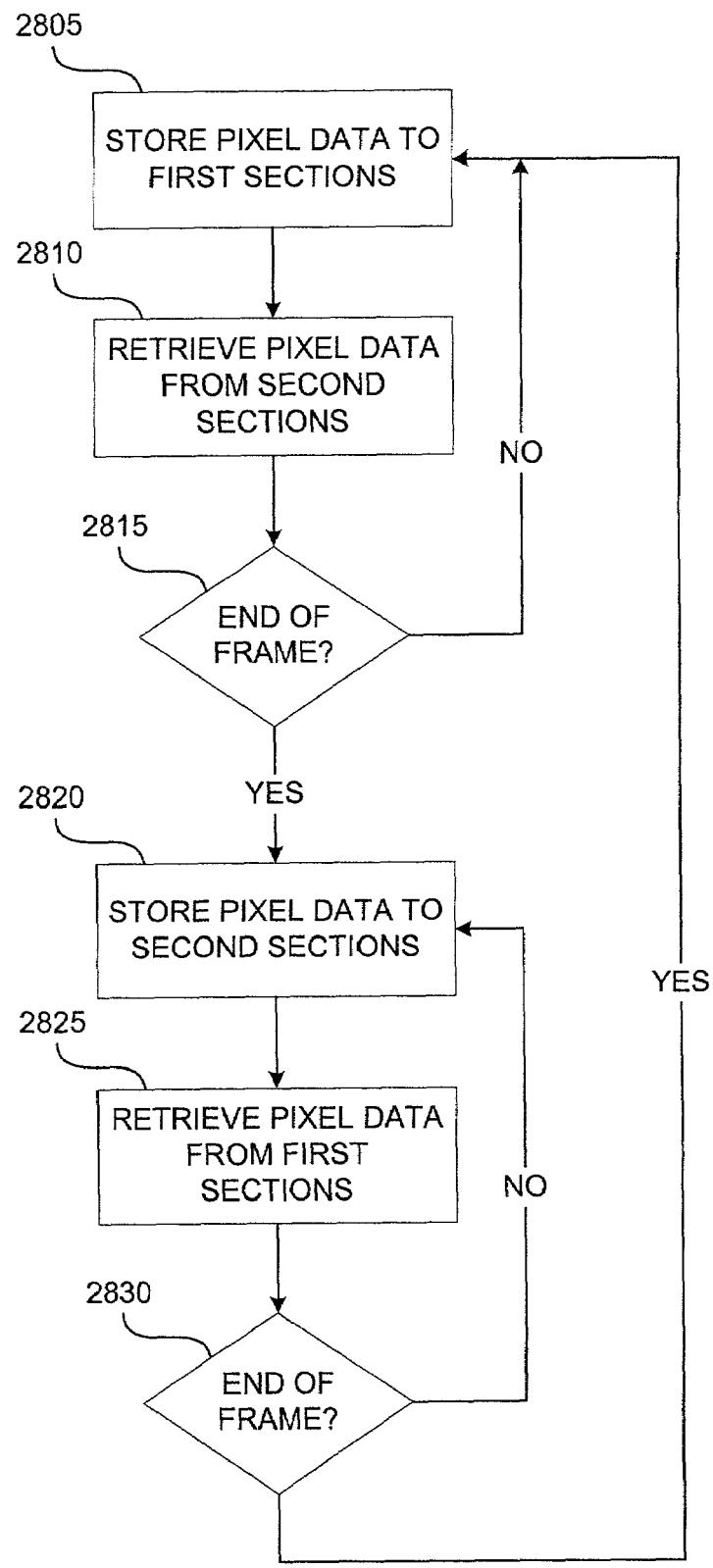
FIG. 28 is a flowchart of reading and writing blocks of pixels using memory sections according to the present invention.

FIG. 28 is a flowchart of reading and writing blocks of pixels using memory sections. When memory controller 1555 has received pixel data for a block of pixels from a first frame, such as 32 pixels, memory controller 1555 stores the pixel data in the first sections (e.g., starting from address 0) of memories 1510 and 1515 in a series of write operations, block 2805. Memory controller 1555 retrieves pixel data for a block of pixels from a previous frame, such as 32 pixels, from the second sections (e.g., starting from the middle of the memory address space, such as 1,048,576) of memories 1510 and 1515, block 2810. Initially, while the very first frame is being stored to the first sections, the second sections will have undefined data and so pixel data retrieved from the second sections during this first iteration will most likely not produce a desirable image, but this situation will only last while the first frame is being stored. Memory controller 1555 checks whether the end of the frame being stored has been reached, such as based on a vertical synchronization signal, block 2815. If the end of the frame has not been reached, memory controller 1555 returns to block 2805 and stores pixel data for the next block of pixels in the first sections of memories 1510 and 1515. If the end of the frame has been reached, memory controller 1555 stores pixel data for the next block of pixels from the next frame in the second sections of memories 1510 and 1515, block 2820. Memory controller 1555 retrieves pixel data for a block of pixels from the first sections of memories 1510 and 1515, block 2825. Memory controller 1555 checks whether the end of the frame being stored has been reached, block 2830. If the end of the frame has not been reached, memory controller 1555 returns to block 2820 and stores pixel data for the next block of pixels in the second sections of memories 1510 and 1515. If the end of the frame has been reached, memory controller 1555 returns to block 2805 and stores pixel data for the first block of pixels from the next frame in the first sections of memories 1510 and 1515. This alternation continues until memory controller 1555 does not receive pixel data from video source 1505.

5. Checkerboard Pixel Pages Using Horizontal Burst Accessing

Many types of SDRAM provide burst accessing or a burst mode. Burst accessing is a well known technique in memory devices for accessing memory locations that are in the same page. One type of conventional burst accessing is sequential burst accessing. In sequential burst accessing, memory locations are accessed that have consecutive addresses (e.g., addresses 0, 1, 2, 3). Another type of burst accessing is interleaved burst accessing. In interleaved burst accessing, a series of tightly grouped memory locations are accessed (e.g., addresses 1, 0, 3, 2).

Using one type of sequential burst accessing, an initial starting address is supplied with information indicating a burst access and a burst length. For example, a request can be made to access the first eight locations of a page of memory (e.g., starting address 0 and burst length 8). The SDRAM accesses a series of locations beginning with the starting address. The SDRAM generates a series of column addresses internally by incrementing from the supplied starting address by one for each location to be accessed. The additional addresses are not externally supplied to the SDRAM and so the address bus is available during the burst accessing. The SDRAM stops the burst accessing after accessing a number of locations equal to the supplied burst length. Typical burst lengths include 2, 4, and 8. Because the address bus for the SDRAM is available during the burst access, the address bus can be used for other instructions to the SDRAM.

A single SDRAM can have multiple banks, such as two or four. For example, 2M×32 SDRAM MT48LC2M32B2 by Micron Technology, Inc., has four banks. The memory locations are divided among the available banks. Each bank is a separate physical unit and one page can be active in each bank. In an SDRAM having four banks, four pages can be active at the same time. As described above, a delay occurs between requesting a new page to become active and when the new page is active. This delay can be avoided or hidden in an SDRAM using multiple banks. While accessing an active page in a first bank, a request is made to activate a page in a second bank. During the time needed to bring the second page active, the first page continues to be accessed. By properly timing the request to activate the second page, when the second page is first accessed, the second page will already be active. In order to activate the second page while accessing the first page, the request can be made while a burst access is being made to the first page. As described above, during burst accessing the address bus is available. The request to activate the second page can be made while the address bus is available. At the end of the burst access to the first page, the second page is active in the second bank and the second page can be accessed without a delay after the last access to the first page. Accordingly, sequential burst accessing can be used to avoid page misses when accessing series of memory locations having consecutive addresses.

In one implementation, pixel data for horizontally adjacent pixel pages is stored in different banks of the SDRAM. For example, in an HD implementation using pixel pages 1105 in FIG. 11, pixel data for the pixel page including pixel 0 is in a first bank (e.g., bank 0). Pixel data for the pixel page including pixel 32 is in a second bank (e.g., bank 1). Pixel data for the pixel page including pixel 64 is in the first bank. This pattern continues throughout the pixel pages 1105 of the frame. Alternatively, different bank allocations can be used, such as using four banks throughout the frame, or two banks in the first half of the frame and two banks in the second half of the frame. Accordingly, while a page in one bank is being accessed using a burst access, a page in a different bank is being activated to be accessed.

As described above, in one implementation, pixel data for a horizontal pixel pair is stored in parallel at the same address in different memory devices. Burst accessing can be used to store pixel data for horizontal pixel pairs using burst sequences for each of the memory devices in parallel.

For example, referring to FIGS. 11 and 16, a pixel page 1105 is 32 pixels wide and so the 32 pixels in a pixel page row have sequential memory addresses. Pixel data for pixels 0–31 are stored at addresses 0–15 in each of the memory devices (recalling that pixel data for pixel 0 is stored at address 0 in memory device 0 and pixel data for pixel 1 is stored at address 0 in memory device 1). Accordingly, using a burst length of 8 locations, pixel data for pixels 16–31 can be stored using a single memory access command requesting a burst access beginning with address 8. Each memory device would store pixel data to the memory locations having addresses 8–15 over 8 clock cycles. During those 8 clock cycles, the data bus of the memory device would be busy, but during the last 7 of the 8 clock cycles the address bus would be free. Another memory access command can be supplied to the memory device using the address bus requesting to store data at address 256, in a new page in a different bank. Because of the burst accessing, the delay in switching between memory pages would be hidden and so a delay for a page miss would not occur at the boundary between the first and second pixel pages. Accordingly, the page misses in storing pixel data can be hidden. However, this burst accessing would not hide page misses in retrieving pixel data using pixel pages because the pixel data is retrieved from addresses that are not consecutive (recalling that, as described above, locations storing pixel data for vertically adjacent pixels do not have consecutive addresses).

6. Checkerboard Pixel Pages Using Alternating Sweeping

Returning to FIG. 13, in an alternative implementation, data destination 1315 is a GLV system that displays one column at a time, sweeping from left to right and right to left alternately with each frame projected. In this case, the address generation for retrieving pixel data from memory used in the memory controller or video destination (such as memory controller 1555 in FIG. 15, or video destination 1425 in FIG. 14) is modified. In one implementation, based on the counter systems described above, when scanning left to right in HD resolution, a column counter increments from 0 to 1919. When scanning from right to left the counter decrements from 1919 to 0. The memory controller uses the row counters in the same way as described above. The counter system for storing pixels is also unchanged.

7. Checkerboard Pixel Pages Using Different Input and Output Data Rates

The rates at which pixels are stored and retrieved are different in some implementations. For example, referring to FIG. 25, in one implementation, memory controller 2555 stores pixel data for 32-pixel blocks and retrieves pixel data for 64-pixel blocks in the same amount of time (e.g., retrieving pixel data for two pixels every clock cycle and storing pixel data for two pixels every other clock cycle). In this case, memory controller 2555 causes a frame to be displayed twice. Memory controller 2555 retrieves pixel data for an entire frame in the same time that video source 2505 has provided half of the pixel data for a new frame. Memory controller 2555 then retrieves pixel data for the same frame again while video source 2505 provides pixel data for the second half of the new frame. In one HD resolution implementation, the input pixel rate would be 150 MP/S and the output pixel rate would be 300 MP/S, for a total of 450 MP/S. Accordingly, a four memory device architecture, such as architecture 2500 in FIG. 25, can be used, such as with four 150 MHz or faster SDRAM's.

Various illustrative implementations of the present invention have been described. The above description focuses on HD resolution video data displayed using a GLV system, but the methods and apparatus can be applied to different resolutions and different devices, as well as data other than video data. Similarly, the pixel data for a pixel is described above as being 32 bits, but different depths are also possible with modification to the size of the addressed memory locations. In addition, while implementations using pixel pages based on two orders of accessing have been described, buffer pages can be formed to accommodate three or more orders of accessing as well. The present invention can be implemented in electronic circuitry, computer hardware, software, or in combinations of them. For example, a frame buffer using pixel pages can be implemented in various ways, such as with an FPGA, a hardwired design, a microprocessor architecture, or a combination. However, one of ordinary skill in the art will see that additional implementations are also possible and within the scope of the present invention. Accordingly, the present invention is not limited to only those implementations described above.

What is claimed is:

1. A checkerboard buffer page system, comprising:
a data source, providing data elements in a first order;
a data destination, receiving data elements in a second order; and
at least four memory devices, each memory device having a plurality of memory pages including a plurality of memory locations, each memory location having an address,
where data elements are stored to at least two memory devices and retrieved from at least two memory devices in parallel,
where each data element corresponds to an entry in one of a plurality of buffer pages, each buffer page having a plurality of entries along a first dimension corresponding to the first order and a plurality of entries along a second dimension corresponding to the second order,
where data elements are stored to the memory devices in the first order and retrieved from the memory devices in the second order, and where at least one memory page stores data elements in multiple locations according to the first order and stores data elements in multiple locations according to the second order, where at least two data elements that are consecutive in the first order are stored in parallel to the memory devices, and where at least two data elements that are consecutive in the second order are retrieved in parallel from the memory devices, where a data element is pixel data corresponding to a pixel in a frame of pixels, the frame having horizontal rows of pixels and vertical columns of pixels, where the buffer pages are pixel pages, each pixel page having a plurality of pixel page rows and a plurality of pixel page columns, where pixel data is retrieved at twice or more than the rate pixel data is stored.

2. The checkerboard buffer page system of claim 1, where each memory page corresponds to a respective buffer page.

3. The checkerboard buffer page system of claim 1, where each row of the frame includes 1920 pixels and each column of the frame includes 1080 pixels.

4. The checkerboard buffer page system of claim 1, where pixel data for two pixels is stored in parallel in one clock cycle, pixel data for one pixel to one memory device and pixel data for the other pixel to another memory device.

5. The checkerboard buffer page system of claim 1, where pixel data for two pixels is retrieved in parallel in one clock cycle, pixel data for one pixel from one memory device and pixel data for the other pixel from another memory device.

6. The checkerboard buffer page system of claim 1, where, in one clock cycle, pixel data for two pixels is retrieved from two memory devices and pixel data for two pixels is stored in two memory devices.

7. The checkerboard buffer page system of claim 6, where four memory devices are divided into a first group of two memory devices and a second group of two memory devices, and the groups alternate between storing and retrieving pixel data after storing pixel data for a frame of pixels.

8. The checkerboard buffer page system of claim 1, where pixel data is stored at a rate supporting 60 frames per second, and pixel data is retrieved at a rate supporting 120 frames per second.

9. The checkerboard buffer page system of claim 1, where pixel data is retrieved for 64 pixels for every 32 pixels of pixel data that is stored.

10. The checkerboard buffer page system of claim 1, further comprising a memory controller for generating addresses for storing and retrieving data elements.

11. The checkerboard buffer page system of claim 10, where:

four memory devices are divided into a first group of two memory devices and a second group of two memory devices, the memory controller has two states for bank alternation: a first state and a second state, when the memory controller is operating in the first state for bank alternation, pixel data is stored to the first group of memory devices and pixel data is retrieved from the second group of memory devices, and when the memory controller is operating in the second state for bank alternation, pixel data is retrieved from the first group of memory devices and pixel data is stored to the second group of memory devices.

12. The checkerboard buffer page system of claim 11, where the memory controller switches states for bank alternation after storing a frame of pixels.

13. The checkerboard buffer page system of claim 11, where the memory controller switches states for bank alternation based on a vertical synchronization signal.

14. The checkerboard buffer page system of claim 1, further comprising a four-by-four switch, where four memory devices are divided into a first group and a second group, each group including two memory devices, and further where the four-by-four switch provides data elements in alternation to the first group and the second group while retrieving data elements in alternation from the second group and the first group.

15. The checkerboard buffer page system of claim 1, where each memory device is an 8MB SDRAM operating at approximately 150 MHz.

16. A checkerboard pixel page system, comprising:
a video source providing pixel data for pixels in a frame, the frame having rows of pixels and columns of pixels;
a video destination;
a first memory having a plurality of memory locations;
a second memory having a plurality of memory locations;
a third memory having a plurality of memory locations;
a fourth memory having a plurality of memory locations;
a memory controller connected to the first memory, the second memory, the third memory, and the fourth memory;
a first data bus connected to the video source and the memory controller;
a second data bus connected to the video source and the memory controller;
a third data bus connected to the video destination and the memory controller;
a fourth data bus connected to the video destination and the memory controller;
a source address line connected to the video source and the memory controller;
a destination address line connected to the video destination and the memory controller; and
where pixel data is stored to two memories and retrieved from two memory devices in parallel,
where each pixel corresponds to an entry in one of a plurality of pixel pages, and a pixel page includes multiple pixels from a row in the frame and multiple pixels from a column in the frame,
where each entry in a pixel page corresponds to a memory location,
where pixel data for at least two pixels that are horizontally adjacent is stored in parallel to the memories, and
where pixel data for at least two pixels that are vertically adjacent is retrieved in parallel from the memories,
where pixel data is retrieved at twice or more than the rate pixel data is stored.

17. The checkerboard pixel page system of claim 15, where the memory controller generates addresses for storing and retrieving pixel data.

18. A checkerboard pixel page system, comprising:
a video source providing pixel data for pixels in a frame, the frame having rows of pixels and columns of pixels;
a video destination;
a first memory having a plurality of memory locations;
a second memory having a plurality of memory locations;
a third memory having a plurality of memory locations;
a fourth memory having a plurality of memory locations;
a first address multiplexor connected to the first memory;
a second address multiplexor connected to the second memory;
a third address multiplexor connected to the third memory;

a fourth address multiplexor connected to the fourth memory;

a four-by-four switch connected to the first memory, the second memory, the third memory, and the fourth memory, having a first data input, a second data input, a first data output and a second data output, where the four-by-four switch switches with each frame between providing pixel data to the first memory and the second memory while receiving pixel data from the third memory and the fourth memory, and receiving pixel data from the first memory and the second memory while providing pixel data to the third memory and the fourth memory;

a source address bus connected to the video source, the first address multiplexor, the second address multiplexor, the third address multiplexor, and the fourth address multiplexor;

a first destination address bus connected to the video destination, the first address multiplexor, and the third address multiplexor;

a second destination address bus connected to the video destination, the second address multiplexor, and the fourth address multiplexor;

a first data bus connected to the video source and the four-by-four switch;

a second data bus connected to the video source and the four-by-four switch;

a third data bus connected to the video destination and the four-by-four switch; and a fourth data bus connected to the video destination and the four-by-four switch, where pixel data is stored to two memories and retrieved from two memories in parallel, where each pixel corresponds to an entry in one of a plurality of pixel pages, and a pixel page includes multiple pixels from a row in the frame and multiple pixels from a column in the frame, where each entry in a pixel page corresponds to a memory location, where pixel data for at least two pixels that are horizontally adjacent is stored in parallel to the memories, and where pixel data for at least two pixels that are vertically adjacent is retrieved in parallel from the memories, where pixel data is retrieved at twice or more than the rate pixel data is stored.

19. The checkerboard pixel page system of claim 18, where the video source generates addresses for storing pixel data and the video destination generates addresses for retrieving pixel data.

20. A method of storing and retrieving pixel data, comprising:

storing pixel data for a first frame of pixels in a first memory device and a second memory device, where each memory device includes a plurality of memory pages, and at least one memory page stores pixel data for at least two pixels from each of at least two horizontal rows of pixels in the first frame of pixels;

storing pixel data for a second frame of pixels in a third memory device and a fourth memory device, where each memory device includes a plurality of memory pages, and at least one memory page stores pixel data for at least two pixels from each of at least two horizontal rows of pixels in the second frame of pixels; and retrieving pixel data for the first frame of pixels from the first memory device and second memory device, where pixel data for at least two pixels that are horizontally adjacent is stored in parallel to the memory devices, and where pixel data for at least two pixels that are vertically adjacent is retrieved in parallel from the memory devices, where pixel data is retrieved at twice or more than the rate pixel data is stored.

21. The method of claim 20, where pixel data for the second frame of pixels is stored and pixel data for the first frame of pixels is retrieved in parallel.

22. The method of claim 20, where pixel data is stored to the first memory device and the second memory device while pixel data is retrieved from the third memory device and the fourth memory device, and pixel data is retrieved from the first memory device and the second memory device while pixel data is stored to the third memory device and the fourth memory device.

23. The method of claim 20, where the memory devices switch between storing and retrieving with each frame of pixels.

24. A system for storing and retrieving pixel data, comprising:

means for storing pixel data for a first frame of pixels in a first memory device and a second memory device, where each memory device includes a plurality of memory pages, and at least one memory page stores pixel data for at least two pixels from each of at least two horizontal rows of pixels in the first frame of pixels;

means for storing pixel data for a second frame of pixels in a third memory device and a fourth memory device, where each memory device includes a plurality of memory pages, and at least one memory page stores pixel data for at least two pixels from each of at least two horizontal rows of pixels in the second frame of pixels; and means for retrieving pixel data for the first frame of pixels from the first memory device and second memory device, where pixel data for at least two pixels that are horizontally adjacent is stored in parallel to the memory devices, and where pixel data for at least two pixels that are vertically adjacent is retrieved in parallel from the memory devices, where pixel data is retrieved at twice or more than the rate pixel data is stored.

* * * * *